(12) United States Patent
Haghdoost et al.

(10) Patent No.: US 12,163,208 B2
(45) Date of Patent: Dec. 10, 2024

(54) HYDRAULIC DEVICES INCLUDING COATED SURFACES

(71) Applicant: MAXTERIAL, INC., Pleasanton, CA (US)

(72) Inventors: Atieh Haghdoost, Pleasanton, CA (US); Mehdi Kargar, Pleasanton, CA (US); Ersan Ilgar, Pleasanton, CA (US); Daniel Church, Pleasanton, CA (US)

(73) Assignee: Maxterial, Inc., Pleasanton, CA (US)

( * ) Notice: Subject to any disclaimer, the term of this patent is extended or adjusted under 35 U.S.C. 154(b) by 0 days.

(21) Appl. No.: 17/844,616

(22) Filed: Jun. 20, 2022

(65) Prior Publication Data

US 2023/0151831 A1 May 18, 2023

Related U.S. Application Data

(60) Provisional application No. 63/226,649, filed on Jul. 28, 2021, provisional application No. 63/223,497, (Continued)

(51) Int. Cl.
*C22C 27/04* (2006.01)
*B21B 27/00* (2006.01)
(Continued)

(52) U.S. Cl.
CPC .......... *C22C 27/04* (2013.01); *B21B 27/005* (2013.01); *B21B 27/03* (2013.01); *B32B 15/01* (2013.01); *B32B 15/013* (2013.01); *C22C 19/03* (2013.01); *C23C 16/4414* (2013.01); *C23C 28/34* (2013.01); *C25D 3/56* (2013.01); *C25D 5/10* (2013.01); *C25D 5/605* (2020.08); *C25D 15/02* (2013.01); *F15B 15/14* (2013.01); (Continued)

(58) Field of Classification Search
CPC .......... B32B 15/013; C22C 27/04; C25D 3/54
See application file for complete search history.

(56) References Cited

U.S. PATENT DOCUMENTS 3,007,231 A 11/1961 Garver
3,580,733 A 5/1971 Ott
(Continued)

FOREIGN PATENT DOCUMENTS

CA 1079221 6/1980
CN 200943579 9/2007
(Continued)

OTHER PUBLICATIONS

ISR/WO for PCT/US23/84474 mailed on May 13, 2024.
(Continued)

*Primary Examiner* — Kenneth Bomberg
*Assistant Examiner* — Matthew Wiblin
(74) *Attorney, Agent, or Firm* — Rhodes IP PLC; Christopher R. Rhodes

(57) ABSTRACT

Hydraulic devices that include a moveable component configured to contact a functional fluid during movement of the hydraulic device are described. The hydraulic device can include a coating on a surface. The coating can include a metal or metal alloy such as, for example, a molybdenum or tungsten in combination with one or more other materials.

30 Claims, 23 Drawing Sheets

Related U.S. Application Data filed on Jul. 19, 2021, provisional application No. 63/212,515, filed on Jun. 18, 2021.

(51) Int. Cl.
| | | |
|---|---|---|
| *B21B 27/03* | (2006.01) | |
| *B32B 15/01* | (2006.01) | |
| *C22C 19/03* | (2006.01) | |
| *C23C 16/44* | (2006.01) | |
| *C23C 28/00* | (2006.01) | |
| *C25D 3/54* | (2006.01) | |
| *C25D 3/56* | (2006.01) | |
| *C25D 5/00* | (2006.01) | |
| *C25D 5/10* | (2006.01) | |
| *C25D 15/02* | (2006.01) | |
| *F15B 15/14* | (2006.01) | |
| *F15B 15/20* | (2006.01) | |
| *F16F 9/06* | (2006.01) | |
| *F16F 9/19* | (2006.01) | |
| *F16F 9/504* | (2006.01) | |
| *F16F 9/516* | (2006.01) | |
| *F16J 1/01* | (2006.01) | |

(52) U.S. Cl.
CPC .............. *F15B 15/20* (2013.01); *F16F 9/061* (2013.01); *F16F 9/062* (2013.01); *F16F 9/19* (2013.01); *F16F 9/504* (2013.01); *F16F 9/516* (2013.01); *F16J 1/01* (2013.01); *B21B 2267/10* (2013.01); *B21B 2267/26* (2013.01); *C25D 3/54* (2013.01); *F16F 2222/12* (2013.01); *F16F 2224/0208* (2013.01); *F16F 2226/02* (2013.01); *F16F 2228/066* (2013.01); *F16F 2232/08* (2013.01); *F16F 2234/02* (2013.01); *Y10T 428/12826* (2015.01)

(56) References Cited

U.S. PATENT DOCUMENTS

| | | | |
|---|---|---|---|
| 3,756,925 A | 9/1973 | Takeuchi | |
| 4,043,878 A | 8/1977 | Ehrsam | |
| 4,222,828 A | 9/1980 | Zueerdeg | |
| 4,366,210 A | 12/1982 | Golemo | |
| 4,371,430 A | 2/1983 | Ballarani | |
| 4,469,564 A | 9/1984 | Okinaka | |
| 4,484,959 A | 11/1984 | Boucher | |
| 4,597,836 A | 7/1986 | Schaer | |
| 4,741,974 A * | 5/1988 | Longo | B23K 35/0266 |
| | | | 219/146.51 |
| 4,863,810 A | 9/1989 | Bhattacharya | |
| 5,094,886 A | 3/1992 | Bogardy | |
| 5,190,796 A | 3/1993 | Iacovangelo | |
| 5,412,870 A | 5/1995 | Lehtonen | |
| 5,476,688 A | 12/1995 | Ostolski | |
| 5,512,219 A | 4/1996 | Rowland | |
| 5,564,196 A | 10/1996 | Nomura | |
| 5,879,816 A | 3/1999 | Mori | |
| 5,935,351 A | 8/1999 | Sherman | |
| 6,491,806 B1 | 12/2002 | Dubin | |
| 6,699,379 B1 | 3/2004 | Ke | |
| 6,773,247 B1 | 8/2004 | Osada | |
| 7,521,128 B2 | 4/2009 | Schuh | |
| 7,951,600 B2 | 5/2011 | Lund | |
| 8,071,387 B1 | 12/2011 | Lund | |
| 8,455,116 B2 | 5/2013 | Dadvand | |
| 8,500,986 B1 | 8/2013 | Schuh | |
| 8,652,649 B2 | 2/2014 | Cahalen | |
| 8,936,857 B2 | 1/2015 | Dadvand | |
| 9,074,294 B2 | 7/2015 | Cahalen | |
| 9,631,293 B2 | 4/2017 | Lund | |
| 9,694,562 B2 | 7/2017 | Dadvand | |
| 9,752,242 B2 | 9/2017 | Abbott | |
| 9,758,888 B2 | 9/2017 | Freydina | |
| 9,765,438 B2 | 9/2017 | Cahalen | |
| 10,180,636 B2 | 1/2019 | Nakane | |
| 10,190,227 B2 | 1/2019 | Ruan | |
| 10,590,514 B2 | 3/2020 | Freydina | |
| 10,590,558 B2 | 3/2020 | Freydina | |
| 11,021,803 B2 | 6/2021 | Freydina | |
| 11,247,434 B2 | 2/2022 | Hilty | |
| 11,542,621 B1 | 1/2023 | Haghdoost | |
| 11,634,831 B2 | 4/2023 | Cahalen | |
| 2003/0031877 A1 | 2/2003 | Veersamy | |
| 2003/0059634 A1 | 3/2003 | Naoi | |
| 2003/0095826 A1 | 5/2003 | Policicchio | |
| 2003/0129420 A1 | 7/2003 | Shultz | |
| 2003/0129537 A1 | 7/2003 | Garabedian | |
| 2004/0027715 A1 | 2/2004 | Hixson-Goldsmith | |
| 2004/0033341 A1 | 2/2004 | Liam | |
| 2004/0052964 A1 | 3/2004 | Kaufmann | |
| 2004/0073053 A1 | 4/2004 | Nguyen | |
| 2004/0092185 A1 | 5/2004 | Grafe | |
| 2004/0105985 A1 | 6/2004 | Henze | |
| 2005/0129898 A1 | 6/2005 | Sosalla | |
| 2005/0268470 A1 | 12/2005 | Skrobis | |
| 2006/0135281 A1 | 6/2006 | Palumbo | |
| 2006/0264650 A1 | 11/2006 | Arora | |
| 2006/0292390 A1 | 12/2006 | Kassner | |
| 2007/0028588 A1 | 2/2007 | Varanasi | |
| 2007/0077516 A1 | 4/2007 | Chang | |
| 2007/0107590 A1 | 5/2007 | Silvers | |
| 2007/0196632 A1 | 8/2007 | Meyer | |
| 2008/0015298 A1 | 1/2008 | Xiong | |
| 2008/0163792 A1* | 7/2008 | Seitz | F23M 5/08 |
| | | | 427/456 |
| 2008/0296023 A1 | 12/2008 | Willauer | |
| 2009/0064894 A1 | 3/2009 | Baumgart | |
| 2009/0185327 A1 | 7/2009 | Seymour | |
| 2009/0237099 A1 | 9/2009 | Garabedian | |
| 2009/0272269 A1 | 11/2009 | Leonard | |
| 2009/0298369 A1 | 12/2009 | Koene | |
| 2010/0034335 A1 | 2/2010 | Varanasi | |
| 2010/0116528 A1 | 5/2010 | Shim | |
| 2010/0127125 A1 | 5/2010 | Li | |
| 2010/0170625 A1 | 7/2010 | Liao | |
| 2010/0304179 A1 | 12/2010 | Facchini | |
| 2011/0114075 A1 | 5/2011 | Mills | |
| 2011/0127074 A1 | 6/2011 | Takahashi | |
| 2011/0192830 A1 | 8/2011 | Wilson | |
| 2011/0203791 A1 | 8/2011 | Jin | |
| 2011/0220348 A1 | 9/2011 | Jin | |
| 2011/0244092 A1 | 10/2011 | Jeong | |
| 2012/0122017 A1 | 5/2012 | Mills | |
| 2012/0135270 A1 | 5/2012 | Wilbeur | |
| 2012/0167401 A1 | 7/2012 | Quigley | |
| 2012/0196225 A1 | 8/2012 | Li | |
| 2013/0065291 A1 | 3/2013 | Jia | |
| 2013/0319868 A1 | 12/2013 | Yoshida | |
| 2013/0327435 A1 | 12/2013 | Kaneta | |
| 2013/0337288 A1 | 12/2013 | Facchini et al. | |
| 2014/0004352 A1 | 1/2014 | McCrea | |
| 2014/0072836 A1 | 3/2014 | Mills | |
| 2014/0147627 A1 | 5/2014 | Aizenberg | |
| 2014/0173889 A1 | 6/2014 | Johnson | |
| 2014/0178641 A1 | 6/2014 | Leblanc | |
| 2014/0187666 A1 | 7/2014 | Aizenberg | |
| 2014/0197038 A1 | 7/2014 | Buckalew | |
| 2014/0360021 A1 | 12/2014 | Sonnenberg | |
| 2015/0030779 A1 | 1/2015 | Bleecher | |
| 2015/0056282 A1 | 2/2015 | Furman | |
| 2015/0132539 A1 | 5/2015 | Bailey | |
| 2015/0206770 A1 | 7/2015 | Dinneen | |
| 2015/0314554 A1 | 11/2015 | Fujiwara | |
| 2015/0368824 A1 | 12/2015 | Haghdoost | |
| 2016/0102414 A1 | 4/2016 | Tani et al. | |
| 2016/0130519 A1* | 5/2016 | Zhao | B32B 37/1207 |
| | | | 508/109 |
| 2017/0058130 A1 | 3/2017 | Addleman | |
| 2017/0190139 A1 | 7/2017 | Haghdoost | |
| 2017/0334170 A1 | 11/2017 | Haghdoost | |
| 2018/0094204 A1 | 4/2018 | Larime | |

(56) References Cited

U.S. PATENT DOCUMENTS

| | | | |
|---|---|---|---|
| 2018/0171261 A1 | 6/2018 | Verleene et al. | |
| 2018/0172197 A1 | 6/2018 | Verleene | |
| 2018/0372151 A1 | 12/2018 | Sridhar et al. | |
| 2019/0186033 A1 | 6/2019 | Ruan et al. | |
| 2019/0186035 A1* | 6/2019 | Haghdoost | C09D 5/08 |
| 2019/0230939 A1 | 8/2019 | Jiraschek et al. | |
| 2019/0292674 A1* | 9/2019 | Ilgar | C23C 30/00 |
| 2020/0232111 A1 | 7/2020 | Xtalic | |
| 2020/0277706 A1 | 9/2020 | Modumetal | |
| 2020/0299130 A1 | 9/2020 | Mills | |
| 2020/0372637 A1 | 11/2020 | Ha | |
| 2020/0385645 A1 | 12/2020 | Nakano | |
| 2023/0138199 A1 | 5/2023 | Haghdoost | |
| 2023/0142535 A1 | 5/2023 | Haghdoost | |
| 2023/0145335 A1 | 5/2023 | Haghdoost | |
| 2023/0147807 A1 | 5/2023 | Haghdoost | |
| 2023/0151505 A1 | 5/2023 | Haghdoost | |
| 2023/0151831 A1 | 5/2023 | Haghdoost | |
| 2023/0151871 A1 | 5/2023 | Haghdoost | |

FOREIGN PATENT DOCUMENTS

| | | | |
|---|---|---|---|
| CN | 102585695 | 9/2014 | |
| EP | 1118694 | 7/2001 | |
| FR | 3035474 | 4/2015 | |
| GB | 2262334 | 6/1990 | |
| JP | S50-45839 | 4/1975 | |
| JP | 58-212840 | 10/1983 | |
| JP | H08184375 | 12/1994 | |
| JP | H07166123 | 6/1995 | |
| JP | 2004346417 | 12/2004 | |
| JP | 2004346417 A * | 12/2004 | B22F 1/00 |
| JP | 2013241656 | 12/2013 | |
| JP | 2022-129526 | 9/2022 | |
| KR | 20170081796 | 6/2017 | |
| WO | 2008035045 | 3/2008 | |
| WO | 2013126134 | 8/2013 | |
| WO | 2014179283 | 4/2014 | |
| WO | 2014127160 | 8/2014 | |
| WO | 2014190017 | 11/2014 | |
| WO | 2015143352 | 9/2015 | |
| WO | 2017029040 | 2/2017 | |
| WO | 2017117198 | 7/2017 | |
| WO | 2017165634 | 9/2017 | |
| WO | 2019006279 | 1/2019 | |
| WO | 2019067950 | 4/2019 | |
| WO | 2019195293 | 10/2019 | |
| WO | 2019195294 | 10/2019 | |
| WO | 2022266528 | 12/2022 | |
| WO | 2022266529 | 12/2022 | |
| WO | 2022266532 | 12/2022 | |
| WO | 2022266533 | 12/2022 | |

OTHER PUBLICATIONS

Wei wt al. RSC Advances, vol. 5, No. 5, Nov. 19, 2015, pp. 10300-103012.
Yu et al. Colloids and Surfaces A: Physicochem Eng. Aspects 427 (2013), pp. 1-6.
Haghdoost et al. Fabricating Superhydrophobic Surfaces via a Two-Step Electrodeposition Technnique. Langmuir. 2013.
Zhang. Preparation of Super-Hydrophobic Cu/Ni Coating with Micro-Nano Heirarchical Structure. Material Letters 67 (2012), 327-330.
Huang. Stable Superhydrophobic Surface via Carbon Nanotubes Coated with a ZnlOthin film. J. Phys. Chem. B 2005, 109, 7746-7748.
Aerosil R812 Product Information document.
NASA Tech Briefs Webinar, Tuesday, Sep. 22, 2015.
Ahmad. Electrodeposition of Nanostructured Nickel-Ceramic Composite Coatings. A review. Int. J. Electrochem. Sci. 9 (2014), 1942-1963.
Khorsand et al. Corrosion resistance and long-term durability of super-hydrophobic nickel film prepared by electrodeposition process. Appl. Surface Science 305 (2014), 498-505.
Zhao et al. RSC Adv, 2016, 6, 59104-59112.
Brooks et al. Scripta mater., 44, (2001), 853-858.
Feng et al. Surface & Coatings Technology, 270, (2015), 47-56.
Grunlan et al. Chem. Mater., 2004, 16, 12, 2433-2441.
Penulis et al. Advanced Materials, 896, 586-590, 2014.
Wang et al., Electrochemistry Communications, 10 (2008), 655-658.
Eni et al. "Nano-Micro Characterization . . . " date unknown.
Examination report for EP18861140.4 mailed on Oct. 9, 2023.
Eliaz et al. Electrochemica Act 50 (2005), 2893-2904.
https://www.condotape.com/blog/category/better-bonding/ dated Mar. 17, 2016.
J. Phys. Chem. Letters. (2014), 5, 686-688.
Wolf. "New Atmospheric Plasma and Photografting Approach . . . " www.aimcal.org, pp. 1-4.
Lu et al. Tribology International 103 (2016), 343-351.
Khameneh-asl et al. RSC Adv. (2016), 6, 78744.
Popczyk et al. "Structure and Corrosion Resistance of Nickel-Molybdenum Alloy Coatings." ACTA Physica Polonica A. vol. 130, No. 4 (2020).
ISR/WO for PCT/US2023/084475 mailed on Mar. 29, 2024.
ISR/WO for PCT/US2023/084476 mailed on Apr. 10, 2024.
ISR/WO for PCT/US2023/084477 mailed on Apr. 10, 2024.
SR/WO for PCT/US2023/084478 mailed on Apr. 8, 2024.

* cited by examiner

FIG. 24B  FIG. 24D
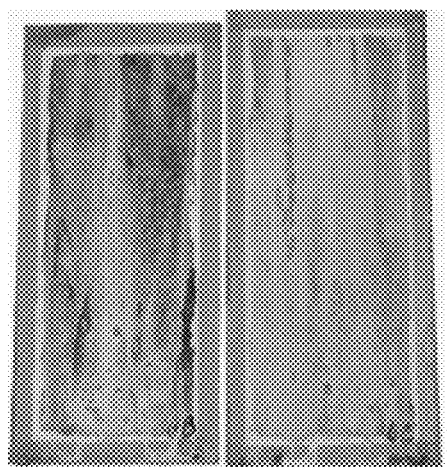 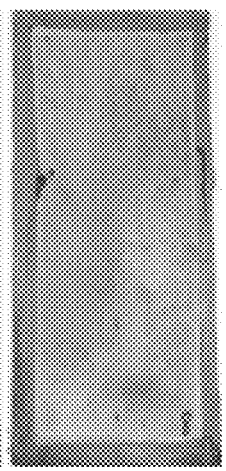 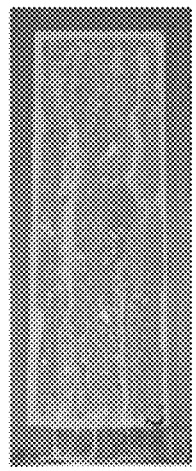 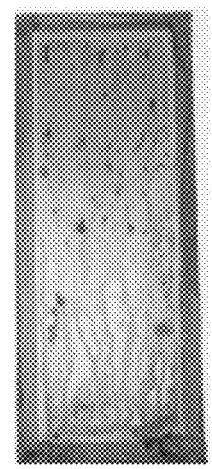
Maxshield-V1    Maxshield-V1    Maxshield-V1    Maxshield-V3    Maxshield-V2
Rating = 9      Rating = 10     Rating = 9      Rating = 9      Rating = 9
FIG. 24A                        FIG. 24C                        FIG. 24E
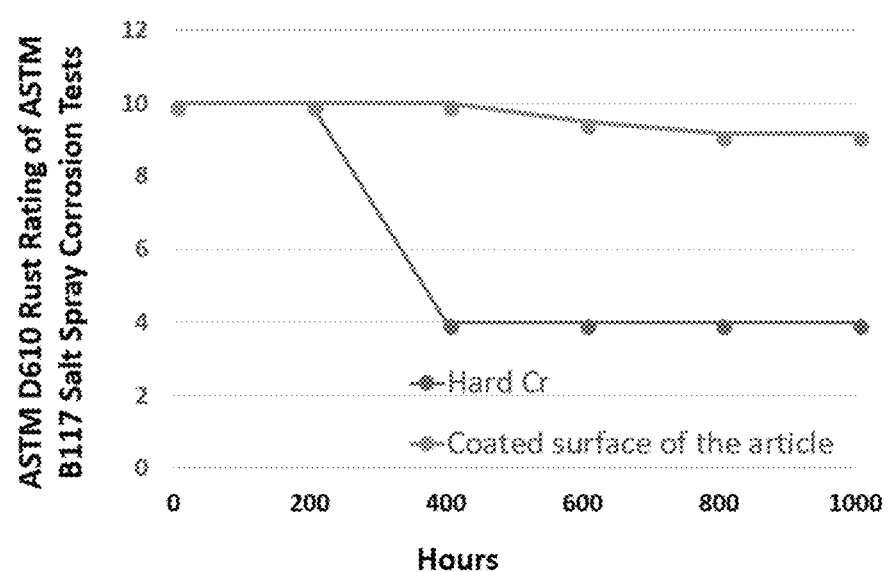
FIG. 25

Bare (uncoated) ASTM F519 Type 1a.1 notched bar (AISI 4340 Steel) HRC=52, TS=264 ksi MaxShield™ coated H-Embrittlement Bar

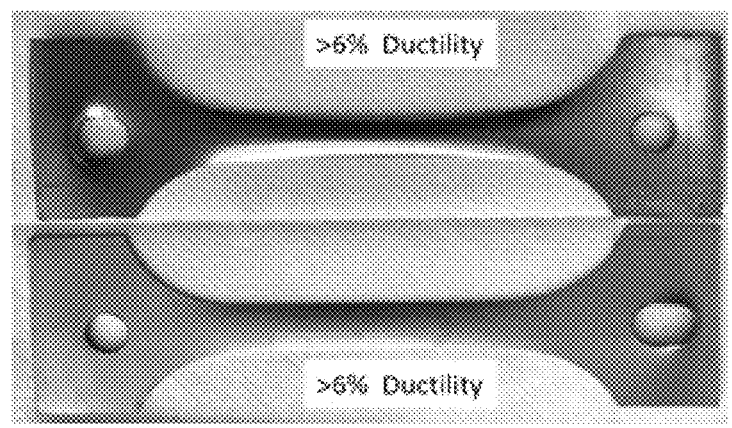
FIG. 28A
FIG. 28B
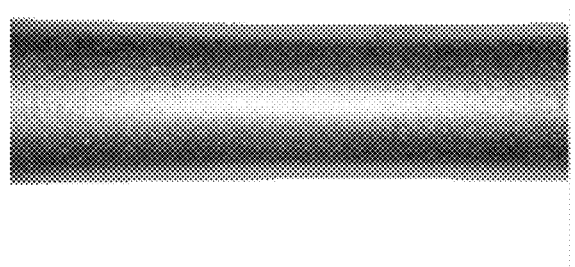
FIG. 29
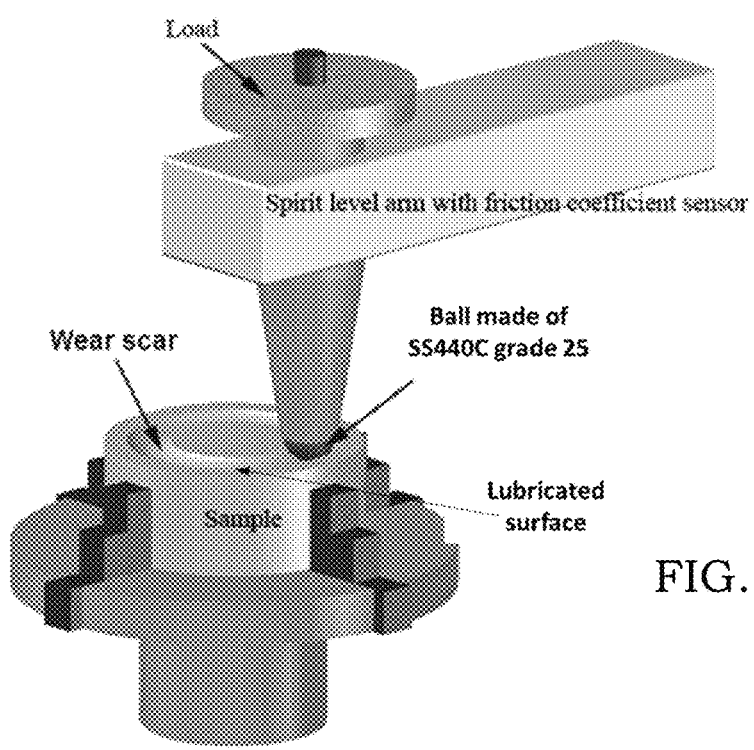
FIG. 30

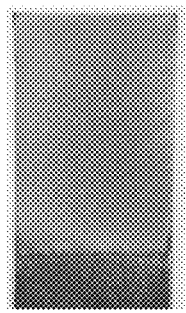
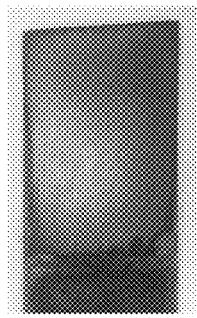
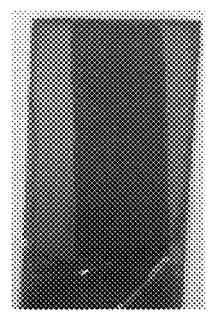
FIG. 39A As-plated MaxShield on CS
FIG. 39B After 1 hour heating at 700 C
FIG. 39C Tape was stuck to the coating surface
FIG. 39D Sample was bent 180 degree and tape was removed

HYDRAULIC DEVICES INCLUDING COATED SURFACES

PRIORITY AND RELATED APPLICATIONS

This application is related to, and claims priority to and the benefit of, each of U.S. 63/212,515 filed on Jun. 18, 2021, U.S. 63/223,497 filed on Jul. 19, 2021 and U.S. 63/226,649 filed on Jul. 28, 2021.

TECHNOLOGICAL FIELD

Certain configurations described herein are directed to coatings that can be used on hydraulic devices. More particularly, certain embodiments are directed to coatings that can reduce wear on hydraulic devices during use.

BACKGROUND

Components of hydraulic devices that move experience wear during use. In addition, exposed areas of the hydraulic devices may rust or otherwise degrade from environmental exposure and continuous use.

SUMMARY

Certain aspects, embodiments and configurations are described below and referred to in the appended claims.

In another aspect, a hydraulic device comprises a piston member positioned within the housing and operative to be driven by pressurized fluid between a first position to a second position, the piston member comprising a coated surface on a surface that contacts the pressurized fluid, wherein the coated surface comprises a surface coating, and wherein the surface coating comprises an alloy layer comprising (i) molybdenum and (ii) at least one element selected from the group consisting of nickel, tungsten, cobalt, chromium, tin, phosphorous, iron and boron or at least one compound comprising one or more of nickel, tungsten, cobalt, chromium, tin, phosphorous, iron or boron. In some examples, the hydraulic device comprises a housing configured to retain the pressurized fluid and to receive the piston member and permit movement of the piston member from the first position to the second position along an axis of the housing.

In an additional aspect, a hydraulic device comprises a piston member positioned within the housing and operative to be driven by pressurized fluid between a first position to a second position, the piston member comprising a coated surface on a surface that contacts the pressurized fluid, wherein the coated surface comprises a surface coating, and wherein the surface coating comprises an alloy layer comprising (i) tungsten and (ii) at least one element selected from the group consisting of nickel, molybdenum, cobalt, chromium, tin, phosphorous, iron and boron or at least one compound comprising one or more of nickel, molybdenum, cobalt, chromium, tin, phosphorous, iron or boron. The hydraulic device can also include a housing configured to retain the pressurized fluid and to receive the piston member and permit movement of the piston member from the first position to the second position along an axis of the housing.

Additional aspects, features and examples are described in more detail below.

BRIEF DESCRIPTION OF THE SEVERAL VIEWS OF THE DRAWINGS

Certain aspects, embodiments and configurations are described with reference to the figures in which:

FIG. 24A, FIG. 24B, FIG. 24C, FIG. 24D and FIG. 24E are photographs showing the results of a salt spray test on tested coatings;

FIG. 25 is a graph comparing the salt spray tests;

FIG. 28A and FIG. 28B are images of MaxShield-V1 (FIG. 28B) and MaxShield-V2 (FIG. 28A) coatings after 6 percent elongation;

FIG. 29 is a microscopic image of MaxShield-V1 coating'

FIG. 30 is an illustration of an apparatus to measure coefficient of friction;

FIG. 39A, FIG. 39B, FIG. 39C and FIG. 39D are images showing surface coating.

Figure 1:
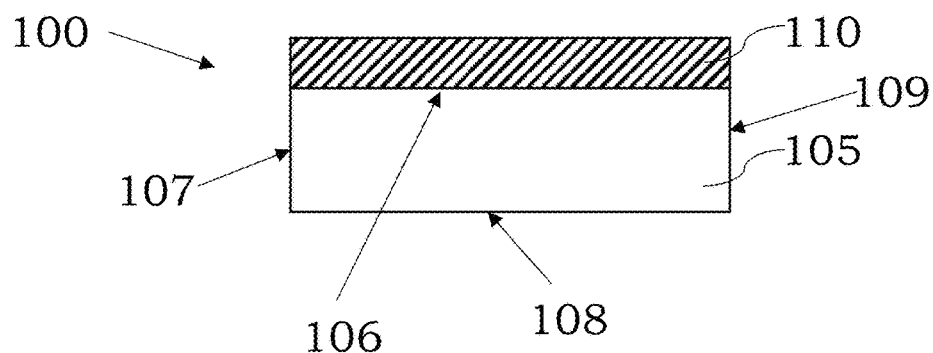
FIG. 1 is an illustration of a device including a surface coating on a substrate.

It will be recognized by the person of ordinary skill in the art, given the benefit of this specification, that the layers and features shown in the figures are not necessarily drawn to scale. The arrangement and dimensions of the various layers and features in the figures are not intended to require that any one arrangement or thickness is required unless specifically discussed in reference to that figure.

DETAILED DESCRIPTION

There is a need for protective coating technologies for components used in hydraulic devices that can increase performance, reduce wear and/or increase lifetime of the components. Similarly, for articles that are lubricated during use, there is a need to increase wear resistance. While various specific illustrations of devices with a coating are described in more detail below, the devices generally include a moveable component that contacts a functional fluid during movement of the moveable component. The term "functional fluid" refers to a fluid that is designed to provide a motive force, to lubricate one or more components during movement of the moveable component, e.g., to provide a film of oil on the surface, or to otherwise be involved in movement of the moveable component. For example, the surface may contact a functional fluid such as, for example, a hydraulic oil, a grease, an oil, a low viscosity oils, a high viscosity oil, semi-solids formed by the dispersion of a thickening agent in a base fluid, solid, or dry film lubricants such as boron nitride, polytetrafluorethylene (PTFE), talc, calcium fluoride, cerium fluoride, tungsten disulfide, or other fluids including a mixture of the above and the mixture with gases. The functional fluid may also provide a resistive force during movement or compression of the moveable component. In some examples, the functional fluid can be used to drive movement of the moveable component from a first position to a second position. One or more surfaces of the moveable component can include a coating, e.g., a metal alloy coating. The coating can provide wear resistance in the presence of the functional fluid during movement of the moveable component. The moveable component typically includes an underlying substrate and a coating on one or more surfaces of the substrate. If desired, one or more other components of the device can also include a coating, e.g., a stationary component or housing that works functionally with the moveable component can also include a coating if desired. The hydraulic devices can be used in a diverse environment including hot, humid, corrosive, high wear environment. As an instance they may be used near bodies of water (sea, ocean, river, etc.), near a dam, offshore, in oil-fields, in vehicles exposed to the environment, in mining operations and in other areas that have a corrosive environment. They may be used in mines where they experience some impacts due to hard particles. Hydraulic devices have been traditionally coated in chrome. Chrome does not provide enough corrosion protection and due to that may not be a proper solution for such an environment. While this coating is desirable for the equipment to function properly, chrome is hazardous to human health and ineffective in various environments. Recognizing this, regulatory bodies have already started to mandate the phasing out of chrome, but viable alternatives are lacking.

In certain embodiments, the materials and methods described herein can be used to provide a coating layer on a surface of a moveable component of a hydraulic device. The exact material or materials in the coating may vary and numerous different materials, coatings and layers are described in more detail below. Specific materials for use in specific devices are also described in more detail below. The exact coating thickness used may vary with different devices. For example, coating thickness can change depending on the application of the hydraulic devices. Typical coating thickness may be less than 10 um up to 1 mm. As an example, for applications that deal with highly corrosive environments, the thickness can be 25-100 um, 25-200 um, 100-200 um, 50-150 um, 25-330 um, 100-300 um, 100-400 um, 100-500 um, 100-600 um, 100, 125, 150, 175, 200, 225, 250, 275, 300, 325, 350, 375, 400, 425, 450, 475, 500, 525, 550, 575, 600, 700, 725, 800, 825, 850, 875, or 900 um. Corrosive environments can be offshore, near salt water, e.g., near a sea or ocean, near dams, an oil field, a gas field, a high temperature environment, combustion, flame or another environment.

In certain embodiments, the hydraulic device can include one or more layers as described below in connection with FIGS. 1-12.

In certain embodiments, the moveable component can include one or more layers as described below in connection with FIGS. 1-12. Specific articles or devices including the substrate and/or other layers are also described. The exact material or materials in the surface coating may vary. In some configurations, the surface coating comprises one or more metals. In some embodiments, the surface coating may include a metal alloy, e.g., an alloy comprising two or more metals. In some embodiments, the surface coating comprises a metal alloy including only two metals or a metal and another material. In certain embodiments, the surface coating comprises a metal alloy including only three metals or a metal and two other materials. In other embodiments, the surface coating may contain only a single layer formed on the substrate. For example, the single layer can be exposed to the environment to protect the underlying substrate from degradation. In some instances, the surface coating may contain only a first layer formed on the substrate and a second layer formed on the first layer.

In some embodiments, the alloy layer may "consist essentially of" two or more materials. The phrase "consists essentially of" or "consisting essentially of" is intended to refer to the specified materials and only minor impurities and those materials that do not materially affect the basic characteristic(s) of the configuration. The term "consists of" refers to only those materials and any impurities that cannot be removed through conventional purification techniques.

In certain embodiments, the alloy layers described herein can include one, two or more Group IV transition metals which include scandium, titanium, vanadium, chromium, manganese, iron, cobalt, nickel, copper and zinc.

In other configurations, the alloy layers described herein can include one, two or more Group V metals, which include yttrium, zirconium, niobium, ruthenium, rhodium, palladium, silver and cadmium.

In some configurations, the alloy layers described herein can include one, two or more Group VI metals, which include the non-radioactive lanthanides (La, Ce, Pr, Nd, Sm, Eu, Gd, Tb, Dy, Ho, Er, Tm, Yb and Lu), hafnium, tantalum, tungsten, rhenium, osmium, iridium, platinum, gold and mercury.

In other embodiments, the alloy layers described herein can include one, two or more Group VII metals, which include the non-radioactive actinides (Th, Pa, U).

In some instances, the alloy layers described herein can include one or more metals from the Group IV metals and one or more metals from the Group V metals or the Group VI metals or the Group VII metals.

In other instances, the alloy layers described herein can include one or more metals from the Group V metals and one or more metals from the Group VI metals or the Group VII metals.

In other examples, the alloy layers described herein can include one or more metals from the Group VI metals and one or more metals from the Group VII metals.

In some embodiments, the alloy layers described herein includes only two metals with one metal from the Group IV metals and the other metal from the Group V metals, the Group VI metals or Group VII metals.

In some embodiments, the alloy layers described herein includes only two metals with one metal from the Group V metals and the other metal from the Group VI metals or Group VII metals.

In other embodiments, the alloy layers described herein includes only two metals with one metal from the Group VI metals and the other metal from the Group VII metals.

In some examples, the alloy layers described herein includes only two metals with both metals being Group IV metals.

In some embodiments, the alloy layers described herein includes only two metals with both metals being Group V metals.

In some embodiments, the alloy layers described herein includes only two metals with both metals being Group VI metals.

In some embodiments, the alloy layers described herein includes only two metals with both metals being Group VII metals.

If desired, the alloy layers described herein can also include Group II materials (Li, Be, B and C) or Group III materials (Na, Mg, Al, Si, P, and S) in addition to, or in place of, the other metals. These materials may be present in combination with one, two, three or more metals.

In some embodiments, the alloy layer described herein comprises molybdenum and one or more additional metals, e.g., one or more additional metals selected from the group consisting of Group IV metals, Group V metals, Group VI metals and Group VII metals. In certain embodiments, the metal alloy comprises molybdenum and only one additional metal, e.g., only one additional metal selected from the group consisting of Group IV metals, Group V metals, Group VI metals and Group VII metals. In certain embodiments, the metal alloy comprises molybdenum and only two additional metals or materials, e.g., only two additional metals or materials selected from the group consisting of Group IV metals, Group V metals, Group VI metals, Group VII metals, Group II materials and Group III materials. In some embodiments, the surface coating has a single layer formed on the substrate, where the single layer comprises molybdenum and one or more additional metals, e.g., one or more additional metals selected from the group consisting of Group IV metals, Group V metals, Group VI metals and Group VII metals. In certain embodiments, the surface coating has a single layer formed on the substrate, where the single layer comprises molybdenum and only one additional metal, e.g., only one additional metal selected from the group consisting of Group IV metals, Group V metals, Group VI metals and Group VII metals. In some examples, the surface coating has a single layer formed on the substrate, where the single layer comprises molybdenum and only two additional metals or materials, e.g., only two additional metal or material selected from the group consisting of Group IV metals, Group V metals, Group VI metals, Group VII metals, Group II materials and Group III materials.

In some embodiments, the alloy layer described herein comprises tungsten and one or more additional metals, e.g., one or more additional metals selected from the group consisting of Group IV metals, Group V metals, Group VI metals and Group VII metals. In certain embodiments, the metal alloy comprises tungsten and only one additional metal, e.g., only one additional metal selected from the group consisting of Group IV metals, Group V metals, Group VI metals and Group VII metals. In certain embodiments, the metal alloy comprises tungsten and only two additional metals or materials, e.g., only two additional metals or materials selected from the group consisting of Group IV metals, Group V metals, Group VI metals, Group VII metals, Group II materials and Group III materials. In some embodiments, the surface coating has a single layer formed on the substrate, where the single layer comprises tungsten and one or more additional metals, e.g., one or more additional metals selected from the group consisting of Group IV metals, Group V metals, Group VI metals and Group VII metals. In certain embodiments, the surface coating has a single layer formed on the substrate, where the single layer comprises tungsten and only one additional metal, e.g., only one additional metal selected from the group consisting of Group IV metals, Group V metals, Group VI metals and Group VII metals. In some examples, the surface coating has a single layer formed on the substrate, where the single layer comprises tungsten and only two additional metals or materials, e.g., only two additional metal or material selected from the group consisting of Group IV metals, Group V metals, Group VI metals, Group VII metals, Group II materials and Group III materials.

In some embodiments, the alloy layer described herein comprises nickel and one or more additional metals, e.g., one or more additional metals selected from the group consisting of Group IV metals, Group V metals, Group VI metals and Group VII metals. In certain embodiments, the metal alloy comprises nickel and only one additional metal, e.g., only one additional metal selected from the group consisting of Group IV metals, Group V metals, Group VI metals and Group VII metals. In certain embodiments, the metal alloy comprises nickel and only two additional metals or materials, e.g., only two additional metals or materials selected from the group consisting of Group IV metals, Group V metals, Group VI metals, Group VII metals, Group II materials and Group III materials. In some embodiments, the surface coating has a single layer formed on the substrate, where the single layer comprises nickel and one or more additional metals, e.g., one or more additional metals selected from the group consisting of Group IV metals, Group V metals, Group VI metals and Group VII metals. In certain embodiments, the surface coating has a single layer formed on the substrate, where the single layer comprises nickel and only one additional metal, e.g., only one additional metal selected from the group consisting of Group IV metals, Group V metals, Group VI metals and Group VII metals. In some examples, the surface coating has a single layer formed on the substrate, where the single layer comprises nickel and only two additional metals or materials, e.g., only two additional metal or material selected from the group consisting of Group IV metals, Group V metals, Group VI metals, Group VII metals, Group II materials and Group III materials.

In certain configurations, the alloy layer comprises (i) molybdenum and (ii) at least one element selected from the group consisting of nickel, tungsten, cobalt, chromium, tin, phosphorous, iron, magnesium and boron or at least one compound comprising one or more of nickel, tungsten, cobalt, chromium, tin, phosphorous, iron, magnesium or boron. In certain embodiments, the alloy excludes precious metals.

In certain configurations, the alloy layer described herein comprises two or more of nickel, molybdenum, copper, phosphorous, boron, boron nitride, silicon carbide, aluminum oxide, molybdenum disulfide, carbon fibers, carbon nanotubes, particles, cobalt, tungsten, gold, platinum, silver, or alloys or combinations thereof.

In other embodiments, the alloy layer described herein includes two or more of nickel, molybdenum, copper, phosphorous, boron, boron nitride, silicon carbide, aluminum oxide, molybdenum disulfide, carbon fibers, carbon nanotubes, particles, cobalt, tungsten, gold, platinum, silver, or alloys or combinations thereof.

In certain embodiments, the alloy layer described herein comprises an alloy of (i) molybdenum, molybdenum oxide or other compounds of molybdenum, and (ii) a transition metal, transition metal oxide or other compounds of a transition metal.

In certain embodiments, the alloy layer described herein includes only two metals from (i) molybdenum, molybdenum oxide or other compounds of molybdenum, and (ii) a transition metal, transition metal oxide or other compounds of a transition metal.

In certain embodiments, the metal alloy of the layers described herein includes only two metals from (i) tungsten, tungsten oxide or other compounds of tungsten, and (ii) a transition metal, transition metal oxide or other compounds of a transition metal.

In certain embodiments, the alloy layer described herein includes only two metals from (i) nickel, nickel oxide or other compounds of nickel, and (ii) a transition metal, transition metal oxide or other compounds of a transition metal. In some embodiments, the transition metal, transition metal oxide or other compounds of the transition metal comprises scandium, manganese, iron, cobalt, nickel, copper, zinc, yttrium, technetium, silver, cadmium, lanthanum, platinum, gold, mercury, actinium, and combinations thereof. For example, the metal alloy coating can include a Ni—Mo alloy, a Ni—W alloy or only have a Ni—Mo alloy or a Ni—W alloy.

In certain embodiments, the alloy layer exhibits at least two times more corrosion resistance compared to a chrome coating according to an ASTM B117 salt spray corrosion test. In some embodiments, the metal alloy layer does not exhibit hydrogen embrittlement as tested by an ASTM F519 standard.

In embodiments where the alloy layer includes molybdenum, molybdenum oxide or other compounds of molybdenum, these materials can be present in the metal alloy coating at 35% by weight or less (or 25% by weight or less) based on a weight of the alloy layer or the weight of the surface coating. In some other cases where the metal alloy layer includes molybdenum, molybdenum oxide or other compounds of molybdenum, these materials can be present in the metal alloy coating at 48% by weight or less based on a weight of the alloy layer or the surface coating.

In some instances, the alloy layer may consist of a single layer. In other configurations, two or more layers may be present in a surface coating. As noted herein, the two layers may comprise the same or different materials. When the materials are the same, the materials may be present in different amounts in the two layers or may be deposited in different layers using different processes.

In some embodiments, the alloy layer can include an alloy of molybdenum, e.g., molybdenum in combination with one or more of nickel, chromium, carbon, cobalt, tin, tungsten, aluminum, vanadium, titanium, niobium, iron, boron, phosphorous, magnesium or copper. For example, molybdenum may be present at 35% by weight or less and the other component can be present at 65% by weight or more. More than two components or metals may be present if desired. In other embodiments, the surface coating can include an alloy of molybdenum and one other metal or material, e.g., molybdenum in combination with only one of nickel, chromium, carbon, cobalt, tin, tungsten, aluminum, vanadium, titanium, niobium, iron, boron, phosphorous, magnesium or copper. In some embodiments, the surface coating can include an alloy of molybdenum and two other metals, e.g., molybdenum in combination with only two of nickel, chromium, carbon, cobalt, tin, tungsten, aluminum, vanadium, titanium, niobium, iron, boron, phosphorous, magnesium or copper.

In some embodiments, the alloy layer can include an alloy of tungsten, e.g., tungsten in combination with one or more of nickel, molybdenum, chromium, carbon, cobalt, tin, aluminum, vanadium, titanium, niobium, iron, boron, phosphorous, magnesium or copper. In other embodiments, the surface coating can include an alloy of tungsten and one other metal or material, e.g., tungsten in combination with only one of nickel, molybdenum, chromium, carbon, cobalt, tin, aluminum, vanadium, titanium, niobium, iron, boron, phosphorous, magnesium or copper. In some embodiments, the surface coating can include an alloy of tungsten and two other metals, e.g., tungsten in combination with only two of nickel, molybdenum, chromium, carbon, cobalt, tin, aluminum, vanadium, titanium, niobium, iron, boron, phosphorous, magnesium or copper. In some embodiments, the surface coating can include an alloy of tungsten, e.g., tungsten in combination with one or more of chromium, molybdenum, carbon, cobalt, tin, aluminum, vanadium, titanium, niobium, iron, boron, phosphorous, magnesium or copper. For example, tungsten may be present at 35% by weight or less and the other component can be present at 65% by weight or more. More than two components or metals may be present if desired. In other embodiments, the surface coating can include an alloy of tungsten and one or two other metals or materials, e.g., tungsten in combination with only one of nickel, molybdenum, chromium, carbon, cobalt, tin, aluminum, vanadium, titanium, niobium, iron, boron, phosphorous, magnesium or copper. In some embodiments, the surface coating can include an alloy of tungsten and two other metals, e.g., tungsten in combination with only two of nickel, molybdenum, chromium, carbon, cobalt, tin, aluminum, vanadium, titanium, niobium, iron, boron, phosphorous, magnesium or copper.

In some embodiments, the surface coatings described herein may provide desirable performance criteria including, but not limited to, a certain surface roughness (Ra) as described in the ISO 4287 and ISO 4288 standards. Roughness can be measured, for example, using a profilometer. Coating thickness may also be measured using a non-destructive technique such as a magnetic measurement tool, XRF, or sampling and destructive technique such as cross-section analysis. The exact surface roughness (Ra) may vary, for example, and may be equal to or less than 1 micron or can be between 0.1 microns and 1 micron. The devices may also have a desired coefficient of friction (CoF). This property generally depends on both the surfaces worn against each other and the fluid located between them. The roughness of each surface, the viscosity of the fluid, and the temperature of the test can impact coefficient of friction measurements. CoF can be measured, for example, according to ASTM G99-17 or a block on ring test as specified in ASTM G77-17. The coating, or one or more layers of the coating, may provide a specific hardness as tested by ASTM E384-17. For example, the coating may have a hardness higher than 600 Vickers as measured per ASTM E384-17. Where the coating includes more than a single layer, any one or more of the layers have a hardness higher than 600 Vickers as measured per ASTM E384-17. In some embodiments, an outer layer of the coating may have a hardness higher than 600 Vickers as measured per ASTM E384-17. In other embodiments where the coating has a hardness of 600 Vickers or higher as measured per ASTM E384-17, one of the layers, when present by itself, may have a hardness less than 600 Vickers as measured per ASTM E384-17.

While various layers and substrates are described below in reference to FIGS. 1-12 as having flat surfaces, a flat surface is not required and may not be desired in some instances. For example, a substrate (or any of the layers or both) may have a rough surface or be roughened purposefully or be smoothed purposefully as desired. As an example, the substrate may have a textured surface including transferring texture which a partial or complete replica of the transferring texture shall be transferred to the other objects that come in contact with such a surface with transferring texture. In an embodiment, such a surface can be a part of an article or device that during use or movement contacts another material. For example, a steel work roll used in cold rolling processes where the surface of the work roll has certain transferring texture that can be transferred to the steel sheet during the rolling process. Another example is the steel work roll described in the previous embodiment where the transferring texture is made using electrical discharge texturing (EDT). Another embodiment is a work roll used in hot rolling processes. In another embodiment, a transferring texture can be a part of a mold which is designed to transfer the texture to another object. In an embodiment, the texture is transferred to a metal. In an embodiment, the texture is transferred to a polymer. In an embodiment, the texture is transferred to a molten metal which solidified afterward. In an embodiment, the texture is transferred to a liquid or fluid which solidified afterward.

In another embodiment the surface may have an adhesive roughness designed to increase the adhesion between such a surface and another surface or a coating applied on top. In an embodiment, the adhesive texture is used to increase the adhesion of the substrate to the thermal spray coatings. In another embodiment, the adhesive texture is used to increase the adhesion of a coating comprising tungsten the surface. In another embodiment, the adhesive layer is used to increase the adhesion of a coating comparing one or combination of nitride, a nitride, a metal carbide, a carbide, a boride, tungsten, tungsten carbide, a tungsten alloy, a tungsten compound, a stainless steel, a ceramic, chromium, chromium carbide, chromium oxide, a chromium compound, aluminum oxide, zirconia, titania, nickel, a nickel carbide, a nickel oxide, a nickel alloy, a cobalt compound, a cobalt alloy, a cobalt phosphorous alloy, molybdenum, a molybdenum compound, a nanocomposite, an oxide composite.

In another embodiment, the roughness is added to impact the light reflection. In an embodiment, the surface roughness is altered to have less roughness. In an embodiment, the surface roughness, Ra, may be altered to be less than 1 um. In another embodiment, the surface roughness is altered to be less than 0.5 um. In an embodiment, the surface with altered roughness is shiny. In another embodiment, the surface with altered roughness is exposed and is required to be touched by human. In another embodiment, the surface reflects less light and becomes less shiny. In an embodiment, the contact angle of water on the surface with altered roughness is less than the original surface.

In certain embodiments, the roughness may have irregular shapes or respective patterns. In certain embodiments, the roughness of the surfaces with coating, Ra, is less than 1 um. In another embodiment, the roughness of the surfaces with coating, Ra, is more than 1 um and less than 10 um. In another embodiments, the roughness of the surfaces with coating, Ra, is more than 10 um and less than 100 um, in another embodiment the Ra of the surfaces is less than 0.7. In some embodiments, the Ra is less than 0.5 um and more than 0.05 um. In another embodiments the Ra is less than 0.5 um. In another embodiment, the Ra is less than 0.4 um. In another embodiment, the Ra is less than 0.3 um. In another embodiment, the Ra is less than 0.2 um. In another embodiment, the Ra is less than 0.1 um. In another embodiment, the patterns are made using grinding, blasting, sand blasting, abrasive blasting, sandblasting, burnishing, grinding, honing, mass finishing, tumble finishing, vibratory finishing, polishing, buffing, lapping, electrochemical etching, chemical etching, laser etching, laser patterning, or other methods. In another method, the surface is textured using shot blasting (SB), laser beam texturing (LBT) and electrical discharge texturing (EDT) or electron beam texturing (EBT) is being evaluated. Electrical discharge texturing (EDT) can be used on steel substrate to create textures. Textures may be formed using an electrodeposition techniques. Textures may be formed using thermal spray techniques. Cross section of the patterns may have specific geometries such as rectangles, triangles, stars, circles or a combinations of thereof. The patterns may be in the shape of ridges, pillars, spirals, a combination of thereof or other shapes. The Ra may be larger than 100 um. The patterns may be created using cutting, milling, molding and or other tools.

Certain embodiments are described in more detail below with reference to coatings or layers. The coatings or layers may include a single material, a combination of materials, an alloy, composites, or other materials and compositions as noted herein. In embodiments where the layer refers to a metal alloy, the metal alloy can include two or more materials, e.g., two or more metals. In some configurations, one metal may be present at 79% by weight or more in the layer and the other material may be present at 21% by weight or less in the layer. For example, one of the layers described herein can include a molybdenum alloy, a tungsten alloy or a nickel alloy. One of the materials may be present at 79% by weight or more in the layer and the other material(s) may be present at 21% by weight or less in the layer. Where the metal alloy includes molybdenum, the molybdenum can be present at 21% by weight or less or 79% by weight or more in the layer and the other material(s) may be present so the sum of the weight percentages add to 100 weight percent. Alternatively, the other material(s) can be present at 79% by weight or more in the layer and the molybdenum may be present at 21% by weight or less in the layer. One or may layers can also include another metal or a metal alloy. There may also be minor impurities present that add negligible weight to the overall alloy layer or surface coating.

The exact amount of each material present may be selected to provide a layer or article with desired performance specifications. The weight percentages can be based on weight of the alloy layer or the entire surface coating. In some embodiments, one metal in a layer is present at 35% by weight or less in the layer, e.g., is present at 34%, 33%, 32%, 31%, 30%, 29%, 28%, 27%, 26%, 25%, 24%, 23%, 22%, 21%, 20%, 19%, 18%, 17%, 16%, 15%, 14%, 13%, 12%, 10%, 9%, 8%, 7%, 6%, 5%, 4%, 3%, 2%, 1% or less by weight in the layer or in the coating. For example, one or more of molybdenum, tungsten or cobalt can be present in the layer or in the coating at 35% by weight or less, e.g., 25%, 24%, 23%, 33%, 31%, 20%, 19%, 18%, 17%, 16%, 15%, 14%, 13%, 12%, 10%, 9%, 8%, 7%, 6%, 5%, 4%, 3%, 2%, 1% or less in the layer or the coating. In other configurations, one or more of the layers can include a metal in a layer that is present at 65% by weight or more, e.g., is present at 65%, 70%, 75%, 80%, 81%, 82%, 83%, 84%, 85%, 85%, 87%, 88%, 89%, 90%, 91%, 92%, 93%, 94%, 95%, 96%, 97%, 98%, 99% or more by weight in the layer or in the coating. For example, nickel can be present in the layer or in the coating at 65%, 70%, 75%, 80%, 81%, 82%, 83%, 84%, 85%, 85%, 87%, 88%, 89%, 90%, 91%, 92%, 93%, 94%, 95%, 96%, 97%, 98%, 99% or more by weight of the alloy layer or the surface coating. Alternatively, molybdenum can be present in the layer or in the coating at 65%, 70%, 75%, 80%, 81%, 82%, 83%, 84%, 85%, 85%, 87%, 88%, 89%, 90%, 91%, 92%, 93%, 94%, 95%, 96%, 97%, 98%, 99% or more by weight of the alloy layer or the surface coating.

In some embodiments, the alloy layers described herein may be present without any precious metals. The term "precious metals" refers to gold, silver, ruthenium, rhodium, palladium, osmium, iridium, and platinum. For example, the alloy layer (and/or the entire surface coating) can be free of (has none of) each of gold, silver, ruthenium, rhodium, palladium, osmium, iridium, and platinum. Omission of the precious metals can reduce overall cost.

In certain embodiments, where nickel is present in a metal alloy layer, the nickel can be present without any tungsten or cobalt in that same layer. For example, where a layer comprises a nickel alloy, the layer has neither of tungsten or cobalt, e.g., 0% by weight of the cobalt or tungsten is present. That layer may also have 0% by weight precious metals.

In certain examples, the alloy layers can include non-metal materials and additives as desired. For example, particles, nanoparticles, nanomaterials or other materials that include one or more of polytetrafluoroethylene (PTFE), SiC, $SiO_2$, diamond, graphite, graphene, boron, boride, functionalized silicon particles, fluorosilicone, siloxanes, $TiO_2$, nanotubes and nanostructures may be present in the metal alloy layer. Additional materials are described in more detail below.

In some examples, one of the metals of the layers described herein is nickel. For example, nickel, nickel alloys, nickel compounds, nickel composites, a nickel-phosphorous alloy, a nickel-molybdenum alloy, a nickel-molybdenum-phosphorous alloy, a nickel-cobalt alloy, a nickel-tungsten alloy, a nickel-cobalt-phosphorus alloy, a nickel-tungsten-phosphorous alloy, a nickel alloy containing only nickel and molybdenum, nickel alloys including at least nickel and a transition metal, nickel alloys including at least two metals other than any precious metals, a nickel alloy including at least nickel and a refractory metal other than any precious metals, a nickel alloy including at least nickel and a refractory metal excluding tungsten, a nickel alloy including at least nickel and a refractory metal excluding tungsten and any precious metals, a nickel alloy including at least nickel and a excluding cobalt and any precious metals, a composite alloy containing nickel and particles, a composite alloy containing nickel and nanoparticles, a composite alloy containing nickel and $SiO_2$, SiC or other silicon compounds, a composite alloy containing nickel and boride, brome nitride or other boron compounds, a composite alloy containing nickel and PTFE or other fluorine compounds, a composite alloy containing nickel, molybdenum and chrome, chromium carbide, chromium oxide or other chrome compounds may be present in one or more of the layers described herein.

In certain embodiments, one of the metals of the alloy layers described herein is molybdenum. For example, molybdenum, a molybdenum alloy, molybdenum composite, a molybdenum-tin alloy, an alloy containing at least molybdenum and nickel, an alloy containing at least molybdenum and tin, an alloy containing at least molybdenum and cobalt, an alloy containing at least molybdenum and phosphorous, an alloy containing only nickel and molybdenum, an alloy containing only tin and molybdenum, an alloy containing only cobalt and molybdenum, an alloy containing only nickel, molybdenum and phosphorous, a molybdenum alloy including at least two metals other than precious metals, a molybdenum alloy including at least molybdenum and a transition metal, a molybdenum alloy including at least molybdenum and a transition metal other than precious metals, a molybdenum alloy including at least two metals excluding substances of very high concern under European law, a composite alloy including molybdenum and particles, a composite alloy including molybdenum and soft particles, a composite alloy including molybdenum and nanoparticles, a composite alloy containing molybdenum and $SiO_2$, SiC or other silicon compounds, a composite alloy containing molybdenum and boride, brome nitride or other boron compounds, a composite alloy containing molybdenum and PTFE or other fluorine compounds, a composite alloy containing molybdenum and chrome, chromium carbide, chromium oxide or other chrome compounds may be present in one or more of the layers described herein.

In another embodiment, one of the metals of the alloy layers described herein is cobalt. For example, cobalt, cobalt alloys, cobalt compounds, cobalt composites, a cobalt-phosphorous alloy, a cobalt-molybdenum alloy, a cobalt-molybdenum-phosphorous alloy, a cobalt-tungsten alloy, a cobalt-tungsten-phosphorous alloy, cobalt alloy containing only cobalt and molybdenum, cobalt alloys including at least cobalt and a transition metal, cobalt alloys including at least two metals excluding precious metals, a cobalt alloy including at least cobalt and a refractory metal excluding precious metals, a cobalt alloy including at least cobalt and a refractory metal excluding tungsten, a cobalt alloy including at least cobalt and a refractory metal excluding tungsten and precious metals, a cobalt alloy including at least cobalt and excluding nickel and precious metals, a composite alloy containing cobalt and particles, a composite alloy containing cobalt and nanoparticles, a composite alloy containing cobalt and $SiO_2$, SiC or other silicon compounds, a composite alloy containing cobalt and boride, brome nitride or other boron compounds, a composite alloy containing cobalt and PTFE or other fluorine compounds, a composite alloy containing cobalt, molybdenum and chrome, chromium carbide, chromium oxide or other chrome compounds.

In some embodiments, one of the metals of the alloy layers described herein is tin. For example, tin, tin alloys, tin compounds, tin composites, a tin-phosphorous alloy, a tin-molybdenum alloy, a tin-molybdenum-phosphorous alloy, a tin-tungsten alloy, a tin-tungsten-phosphorous alloy, a tin alloy containing only tin and molybdenum, tin alloys including at least tin and a transition metal, tin alloys including at least two metals excluding precious metals, a tin alloy including at least tin and a refractory metal excluding precious metals, a tin alloy including at least tin and a refractory metal excluding tungsten, a tin alloy including at least tin and a refractory metal excluding tungsten and precious metals, a tin alloy including at least tin and excluding nickel and precious metals, a composite alloy containing tin and particles, a composite alloy containing tin and nanoparticles, a composite alloy containing tin and $SiO_2$, SiC or other silicon compounds, a composite alloy containing tin and boride, brome nitride or other boron compounds, a composite alloy containing tin and PTFE or other fluorine compounds, a composite alloy containing tin, molybdenum and chrome, chromium carbide, chromium oxide or other chrome compounds.

In another embodiment, one of the metals of the alloy layers described herein is tungsten. For example, tungsten, tungsten alloys, tungsten compounds, tungsten composites, a tungsten-phosphorous alloy, a tungsten-molybdenum alloy, a tungsten-molybdenum-phosphorous alloy, a tungsten alloy containing only tungsten and molybdenum, a tungsten alloy including at least tungsten and a transition metal, a tungsten alloy including at least two metals excluding precious metals, a tungsten alloy including at least tungsten and a refractory metal excluding precious metals, a tungsten alloy including at least tungsten and excluding nickel and precious metals, a composite alloy containing tungsten and particles, a composite alloy containing tungsten and nanoparticles, a composite alloy containing tungsten and $SiO_2$, SiC or other silicon compounds, a composite alloys containing tungsten and boride, brome nitride or other boron compounds, a composite alloy containing tungsten and PTFE or other fluorine compounds, a composite alloy containing tungsten, molybdenum and chrome, chromium carbide, chromium oxide or other chrome compounds.

In certain embodiments, one or more of the alloy layers described herein may be considered a "hard" layer. The hard layer typically has a Vickers hardness higher than the substrate and/or any underlying layers. While not required, the hard layer is typically present as an outer layer. In some embodiments, the hard layer may comprise one or more of a nitride, a metal nitride, a carbide, a metal carbide, a boride, a metal boride, tungsten, tungsten carbide, a tungsten alloy, a tungsten compound, a stainless steel, a ceramic, chromium, chromium carbide, chromium oxide, a chromium compound, aluminum oxide, zirconia, titania, nickel, a nickel carbide, a nickel oxide, a nickel alloy, a cobalt compound, a cobalt alloy, a cobalt phosphorous alloy, molybdenum, a molybdenum compound, a nanocomposite, an oxide composite, or combinations thereof.

In certain embodiments, a simplified illustration of a substrate and an alloy layer of a surface coating is shown in FIG. 1. An article or device 100 includes a substrate 105 (which is shown as a section in FIG. 1) and a first layer 110 on a first surface 106 of the substrate 105. While not shown, a layer or coating may also be present on surfaces 107, 108 and 109 of the substrate 105. The layer 110 is shown in FIG. 1 as a solid layer with uniform thickness present across the surface 106 of the substrate 105. This configuration is not required, and different areas of the layer 110 may include different thicknesses or even different materials. Further, certain areas of the surface 106 may not include any surface coating at all. In some embodiments, the substrate 105 may be, or may include, a metal material including, but not limited to, steel (carbon steel, tool steel, stainless steel, etc.), copper, copper alloys, aluminum, aluminum alloys, chromium, chromium alloys, nickel, nickel alloys, titanium, titanium alloys, nickel-chromium superalloys, nickel-molybdenum alloys, brass, Hastelloy, Inconel, Nichrome, Monel, other substrates that include at least one metal or substrates that are nitrided or carburized. In some embodiments, the substrate may be porous or may be non-porous. The layer 110 typically includes one or more metals or two or more metals or three or more metals or materials. For example, the layer 110 can be a metal alloy formed from two or more metals. In some embodiments, the layer 110 is an alloy layer formed from only two metals or two materials. In some examples, the layer 110 is the only layer present in the surface coating. In certain examples, the layer 110 is an outer or exposed layer such that the layer can contact surrounding fluid or other materials and protect the underlying substrate 105 and any layers between the layer 110 and the substrate 105.

In some embodiments, one of the metals in the layer 110 is nickel. In other embodiments, one of the metals in the layer 110 is molybdenum. In other embodiments, one of the metals in the layer 110 is tungsten. In other embodiments, one of the metals in the layer 110 is cobalt. In an additional embodiment, one of the metals in the layer 110 is molybdenum in the form of a molybdenum alloy. In other embodiments, the layer 110 can include a nickel alloy, a molybdenum alloy, a cobalt alloy, a tungsten alloy, or combinations thereof. In other examples, the layer 110 may be a nickel molybdenum alloy. In certain configurations, the layer 110 may consist of a nickel molybdenum alloy with no other materials being present in the layer 110. In some configurations, the layer 110 may comprise a nickel molybdenum phosphorous alloy. In some configurations, the layer 110 may consist of a nickel molybdenum phosphorous alloy with no other materials being present in the layer 110.

In some configurations, the exact thickness of the layer 110 may vary 1 micron to about 2 mm depending on the device where the layer 110 is present. For example, the layer 110 may have a thickness from about 5 microns to about 1 mm or about 7 microns to about 900 microns. Where multiple layers are present in a surface coating each layer may have a thickness from 1 micron to about 2 mm or the total thickness of all layers may be about 1 micron to about 2 mm.

In certain embodiments, the layer 110 can also include other materials, e.g., particles, fibers, non-metals (for example, phosphorous, boron, boron nitride, silicon compounds such as silicon dioxide, silicon carbide, etc.), aluminum oxide, molybdenum disulfide, carbon fibers, carbon nanotubes, cobalt, tungsten, tin, gold, platinum, silver and combinations thereof. The particles can be soft particles such as polymer particles, PTFE particles, fluoropolymers, and other soft particles. The particles can be hard particles such as diamond, boron, boron nitride, silicon compounds such as silicon dioxide, silicon carbide, etc. The particles can be hydrophobic or hydrophilic. Hydrophobic particles such PTFE particles, Teflon particles, Fluoropolymers, silicon base particles, hard particles functionalized in hydrophobic, hydrophilic or both groups. Such as silicon dioxide or silicon carbide functionalized in fluoro-compounds, molecules containing florin, silicon compounds, molecules containing silicon, and other polymers. Other particles such as titanium dioxide, and other catalyst may be used as well either functionalized or as is.

In other configurations, the layer 110 can include a nickel molybdenum alloy, a nickel molybdenum alloy where a weight percentage of the molybdenum is less than 35% by weight, a nickel molybdenum phosphorous alloy where a weight percentage of the molybdenum is less than 35% by weight, a ductile alloy of a refractory metal with nickel, a ductile alloy of nickel and molybdenum, a brittle alloy of a refractory metal with nickel, a ductile alloy of nickel and molybdenum, a brittle alloy of a transition metal with molybdenum, a ductile alloy of a transition metal with molybdenum, an alloy of nickel and molybdenum with a hardness less than 1100 and higher than 500 Vickers, a nickel molybdenum alloy that provides a surface roughness Ra less than 1 micrometer, a nickel molybdenum alloy with uniform and non-uniform grain sizes, a nickel molybdenum alloy with an average grain size less than 2 microns, a conformal nickel molybdenum alloy, an alloy of nickel, molybdenum and phosphorous, an alloy of cobalt and molybdenum, an alloy of cobalt and molybdenum and phosphorous, an alloy of nickel, molybdenum and tungsten, an alloy of nickel with a material having a less magnetic property than nickel, an alloy of molybdenum with a material having a less hardness than molybdenum, a conformal alloy of a refractory metal and nickel, a ductile alloy of nickel molybdenum, a ductile alloy of nickel tungsten, a brittle alloy of nickel tungsten, a ductile alloy of nickel cobalt, a brittle alloy of nickel cobalt, an alloy of nickel and a material with a higher temperature resistance than nickel, a nickel molybdenum alloy where it contains a third element including but not limited to a refractory metal, a precious metal, hard particles, soft particles, hydrophobic particles, hydrophilic particles, catalysis, a material more conductive than nickel, a material more conductive than molybdenum, a material softer than nickel, a material harder than nickel and less hard than molybdenum, or other compounds such as phosphorous, boron, boron nitride, silicon carbide, silicone oxide, aluminum oxide, molybdenum disulfide, hard particles with a hardness of HV greater than 750 Vickers, and/or hard particles with size less 1 micron, a nickel molybdenum alloy where it contains a third element including but not limited to a refractory metal, a precious metal, hard particles, a material more conductive than nickel, a material more conductive than molybdenum, a material softer than nickel, or other compounds such as phosphorous, boron, boron nitride, silicon carbide, silicone oxide, aluminum oxide, molybdenum disulfide, hard particles with a hardness of HV greater than 750 Vickers, and/or hard particles with size less 1 micron.

In some instances, the layer 110 on the substrate 105 can include a nickel tungsten alloy or a nickel tungsten alloy where it contains a third element including, but not limited to, an element that is a refractory metal, a precious metal, hard particles or other compounds such as phosphorous, boron, boron nitride, silicon carbide, aluminum oxide, molybdenum disulfide, hard particles with hardness of HV>750, hard particles with size less 500 nm, highly conductive particles, carbon nanotubes and/or carbon nanoparticles. Combinations of these materials may also be present in the layer 110 on the substrate 105.

Figure 2:
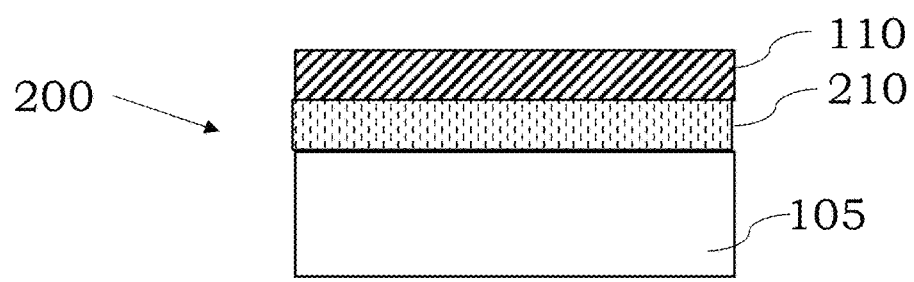
FIG. 2 is an illustration of a device including two layers in a coating on a substrate.

In some embodiments, a simplified illustration of another device is shown in FIG. 2. In this illustration, the article or the device 200 includes an intermediate layer 210 between the layer 110 and the underlying substrate 105. In some examples, the intermediate layer 210 can improve adhesion, can improve corrosion, can brighten the coating or any combination thereof. For example, nickel, nickel alloys, copper alloys, nickel compounds, nickel composites, nickel-phosphorous alloy, nickel-molybdenum alloy, nickel-molybdenum-phosphorous alloy, nickel-cobalt alloy, nickel-tungsten alloy, nickel-cobalt-phosphorus alloy, copper, nickel-tungsten-phosphorous alloy copper alloys, copper composites, tin, tin alloy, tin composite, cobalt, cobalt alloy, cobalt composite, cobalt-molybdenum alloy, cobalt-tungsten alloy, cobalt-molybdenum-phosphorous alloy, cobalt-tungsten-phosphorous alloy, molybdenum, molybdenum alloy, molybdenum composite, nickel alloys including at least two metals excluding precious metals, molybdenum alloy including at least two metals excluding precious metals, molybdenum alloy including at least molybdenum and a transition metal, molybdenum alloy including at least molybdenum and a transition metal excluding precious metals, metals tungsten alloys, nickel alloys including at least nickel and a refractory metal, nickel alloy including at least nickel and a refractory metal (excluding precious metals), molybdenum-tin alloy, tungsten alloys, tungsten composite, or other materials may be present as a layer 210, between the layer 110 and the substrate 105 to improve adhesion between the layer 110 and the layer 210. Such a layer can be less than 10 um, 9 um, 8 um, 7 um, 2 um, 1 um, 0.75 um, 0.5 um, or 0.25 um thick. As noted herein, in some instances, the layer 210 may be a strike layer, e.g., a nickel layer, added to the substrate 105 to improve adhesion between the substrate 105 and the layer 110.

In certain configurations, the layer 210 can function as a brightener to increase the overall shiny appearance of the article or device 200. A bright or semi-bright layer generally reflects a higher percentage of light than the layer 110. For example, nickel, nickel alloys, copper alloys, nickel compounds, nickel composites, nickel-phosphorous alloy, nickel-molybdenum alloy, nickel-molybdenum-phosphorous alloy, nickel-cobalt alloy, nickel-tungsten alloy, nickel-cobalt-phosphorus alloy, copper, nickel-tungsten-phosphorous alloy copper alloys, copper composites, tin, tin alloy, tin composite, cobalt, cobalt alloy, cobalt composite, cobalt-molybdenum alloy, cobalt-tungsten alloy, cobalt-molybdenum-phosphorous alloy, cobalt-tungsten-phosphorous alloy, molybdenum, molybdenum alloy, molybdenum composite, nickel alloys including at least two metals excluding precious metals, molybdenum alloy including at least two metals excluding precious metals, molybdenum alloy including at least molybdenum and a transition metal, molybdenum alloy including at least molybdenum and a transition metal excluding precious metals, metals tungsten alloys, nickel alloys including at least nickel and a transition metal, nickel alloy including at least nickel and a refractory metal excluding precious metals, tungsten alloys, tungsten composite, or other materials may be present as a layer 210, between the layer 110 and the substrate 105 to brighten the overall coating appearance.

In other configurations, the layer 210 can act to increase corrosion resistance of the article or device 200. For example, nickel, nickel alloys, copper alloys, nickel compounds, nickel composites, nickel-phosphorous alloy, nickel-molybdenum alloy, nickel-molybdenum-phosphorous alloy, nickel-cobalt alloy, nickel-tungsten alloy, nickel-cobalt-phosphorus alloy, copper, nickel-tungsten-phosphorous alloy copper alloys, copper composites, tin, tin alloy, tin composite, cobalt, cobalt alloy, cobalt composite, cobalt-molybdenum alloy, cobalt-tungsten alloy, cobalt-molybdenum-phosphorous alloy, cobalt-tungsten-phosphorous alloy, molybdenum, molybdenum alloy, molybdenum composite, molybdenum-tin alloys, alloy containing at least molybdenum and nickel, alloy containing at least molybdenum and tin, alloy containing at least molybdenum and cobalt, composites including molybdenum and particles, composites including molybdenum and soft particles, composites including molybdenum and nanoparticles, composites including molybdenum and hard particles, nickel alloys including at least two metals excluding precious metals, molybdenum alloy including at least two metals excluding precious metals, molybdenum alloy including at least molybdenum and a transition metal, molybdenum alloy including at least molybdenum and a transition metal excluding precious metals, tungsten alloys, nickel alloys including at least nickel and a transition metal, nickel alloy including at least nickel and a refractory metal excluding precious metals, nickel alloy including at least nickel and a refractory metal excluding tungsten, nickel alloy including at least nickel and a refractory metal excluding tungsten and precious metals, tungsten alloys, a tungsten composite, tungsten alloys excluding alloys containing both nickel and tungsten, chrome, chrome compounds, or other materials may be present as a layer 210, between the layer 110 and the substrate 105 to increase corrosion resistance.

In some embodiments, the substrate 105 used with the intermediate layer 210 may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate may be porous or may be non-porous. In certain embodiments, the layer 210 can include one or more materials selected from the group consisting of Group II materials, Group III materials, a Group IV metal, a Group V metal, a Group VI metal and a Group VII metal. In some examples, the layer 210 is free of any precious metals. In other instances, the layer 210 only includes a single metal but may include other non-metal materials.

In certain embodiments, the layer 110 used with the intermediate layer 210 typically includes one or more metals or two or more metals. For example, the layer 110 used with the intermediate layer 210 can include any of those materials and configurations described in reference to FIG. 1. For example, the layer 110 used with the layer 210 be a metal alloy formed from two or more metals. In some embodiments, one of the metals in the layer 110 used with the intermediate layer 210 is nickel. In other embodiments, one of the metals in the layer 110 used with the intermediate layer 210 is molybdenum. In an additional embodiment, one of the metals in the layer 110 used with the intermediate layer 210 is tungsten. In an additional embodiment, one of the metals in the layer 110 used with the intermediate layer 210 is cobalt. In an additional embodiment, one of the metals in the layer 110 used with the intermediate layer 210 is chrome. In some embodiments, the layer 110 used with the layer 210 can include only two metals or two materials or three metals or three materials. For example, the layer 110 used with the layer 210 can include only nickel and molybdenum or only nickel, molybdenum and phosphorous or only nickel and tungsten or only nickel and cobalt or only nickel, phosphorous and iron or only nickel and phosphorous.

In other embodiments, the layer 110 used with the intermediate layer 210 can include a nickel alloy, a molybdenum alloy, a tungsten alloy, a cobalt alloy, a chrome alloy, or combinations thereof. In other examples, the layer 110 used with the intermediate layer 210 may be a nickel, nickel-molybdenum alloy, nickel-cobalt alloy, nickel-tungsten alloy, nickel-phosphorous ally, cobalt, cobalt-molybdenum alloy, cobalt-tungsten alloy, cobalt-phosphorous alloy, nickel-molybdenum-phosphorous alloy, cobalt-molybdenum-phosphorous alloy, cobalt-tungsten-phosphorous alloy, chrome, chrome alloy, molybdenum-tin alloy, chrome compounds. In certain configurations, the layer 110 used with the intermediate layer 210 may consist of a nickel-molybdenum alloy with no other materials being present in the layer 110. In other configurations, the layer 110 used with the intermediate layer 210 may consist of a nickel-molybdenum-phosphorous alloy with no other materials being present in the layer 110. In other configurations, the layer 110 used with the intermediate layer 210 may consist of a cobalt-molybdenum alloy with no other materials being present in the layer 110. In other configurations, the layer 110 used with the intermediate layer 210 may consist of a cobalt-molybdenum-phosphorous alloy with no other materials being present in the layer 110. In other configurations, the layer 110 used with the intermediate layer 210 may consist of a nickel alloy including at least two metals excluding precious metals. In other configurations, the layer 110 used with the intermediate layer 210 may consist of a molybdenum alloy including at least two metals excluding precious metals. In other configurations, the layer 110 used with the intermediate layer 210 may consist of a molybdenum alloy including at least molybdenum and a transition metal. In other configurations, the layer 110 used with the intermediate layer 210 may consist of a molybdenum alloy including at least molybdenum and a transition metal excluding precious metals. The exact thickness of the layer 110 used with the intermediate layer 210 may vary from 1 micron to about 2 mm depending on the article where the layer 110 is present. For example, the layer 110 may be about 10 microns to about 200 microns thick. Similarly, a thickness of the intermediate layer 210 may vary from 0.1 micron to about 2 mm, e.g., about 1 micron to about 20 microns. The thickness of the layer 210 can be less than a thickness of the layer 110 or more than a thickness of the layer 110.

Figure 3:
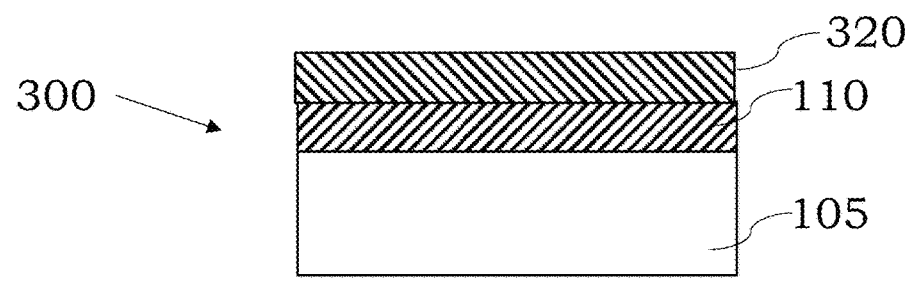
FIG. 3 is another illustration of a device including two layers in a coating on a substrate.

In another configuration, two or more layers may be present on an underlying substrate. Referring to FIG. 3, an article or device 300 is shown that includes a first layer 110 and a second layer 320 on a substrate 105. The ordering of the layers 110, 320 could be reversed, so the layer 320 is closer to the substrate 105 if desired. The layers 110, 320 can include the same or different materials or may include similar materials that have been deposited in a different manner or under different conditions. For example, the layers 110, 320 in FIG. 3 can independently be any of those materials described herein, e.g., any of those materials described in reference to the layers of FIG. 1 or FIG. 2. In some configurations, the layers 110, 320 can each be an alloy layer. For example, each of the layers 110, 320 can include one or more of nickel, copper, molybdenum, cobalt or tungsten. The layers may be formed in similar or different manners. For example, the layer 110 may be electrodeposited under basic conditions, and the layer 220 may be electrodeposited under acidic conditions. As another example, the layers 110, 320 can each independently include nickel, copper, molybdenum, cobalt or tungsten, but the layer 110 may be electrodeposited under basic conditions and the layer 220 may be deposited using a physical vapor deposition technique, a chemical vapor deposition, an atomic layer deposition, thermal spray technique or other methods. The layers 110, 320 can include metals other than copper, e.g., nickel, molybdenum, cobalt, tungsten, tin etc. or non-metals or both. The different conditions can provide a different overall structure in the layers 110, 320 even though similar materials may be present. In certain configurations, the layer 110 can improve adhesion of the layer 320.

In other configurations, the layer 110 can "brighten" the surface of the device 300 so the device 300 has a shinier overall appearance.

In some embodiments, the substrate 105 used with the layers 110, 320 may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 105 may be porous or may be non-porous. The layers 110, 320 typically each includes one or more metals or two or more metals. For example, the layers 110, 320 can be a metal alloy formed from two or more metals. In some embodiments, one of the metals in the layers 110, 320 is nickel. In other embodiments, one of the metals in the layers 110, 320 is molybdenum. In an additional embodiment, one of the metals in the layers 110, 320 is cobalt. In an additional embodiment, one of the metals in the layers 110, 320 is tungsten. The layers 110, 320 need not have the same metal and desirably the metal in the layers 110, 320 is different. In other embodiments, the layers 110, 320 independently can include a nickel alloy, a molybdenum alloy, or combinations thereof. In other examples, the layers 110, 320 independently may be a nickel-molybdenum alloy, a nickel-molybdenum-phosphorous alloy, a tungsten alloy, a nickel-tungsten alloy, etc. In certain configurations, one or both of the layers 110, 320 may consist of a nickel molybdenum alloy with no other materials being present in each layer. In other configurations, one of the layers 110, 320 may consist of a nickel-molybdenum-phosphorous alloy with no other materials being present in each layer. In some configurations, both of the layers 110, 320 may consist of a nickel-molybdenum-phosphorous alloy with no other materials being present in each layer. In other configurations, one or both of the layers 110, 320 may consist of a nickel alloy including at least nickel and a transition metal. In other configurations, one or both of the layers 110, 320 may consist of a nickel alloy including at least nickel and a transition metal excluding precious metals. In other configurations, one or both of the layers 110, 320 may consist of a molybdenum alloy including at least molybdenum and a transition metal. In other configurations, one or both of the layers 110, 320 may consist of a molybdenum alloy including at least molybdenum and a transition metal excluding precious metals. The exact thickness of the layers 110, 320 may vary from 0.1 micron to about 2 mm depending on the device where the coating is present, and the thickness of the layers 110, 320 need not be the same. The layer 110 may be thicker than the layer 320 or may be less thick than the layer 320.

In certain configurations, an intermediate layer may be present between the first layer 110 and the second layer 320. The intermediate layer can include, for example, any of those materials described in reference to layer 210 herein. Alternatively, an intermediate layer may be present between the substrate 105 and the layer 110 when the coating includes the first layer 110 and the second layer 120. In some embodiments, the layer 320 may have a higher hardness than the layer 110. For example, a hardness of the layer 320 may be greater than 750 Vickers. In certain embodiments, the layer 320 may comprise one or more of a nitride, a metal nitride, a carbide, a metal carbide, a boride, a metal boride, tungsten, tungsten carbide, a tungsten alloy, a tungsten compound, a stainless steel, a ceramic, chromium, chromium carbide, chromium oxide, a chromium compound, aluminum oxide, zirconia, titania, nickel, a nickel carbide, a nickel oxide, a nickel alloy, a cobalt compound, a cobalt alloy, a cobalt phosphorous alloy, molybdenum, a molybdenum compound, a nanocomposite, an oxide composite, or combinations thereof.

Figure 4A:
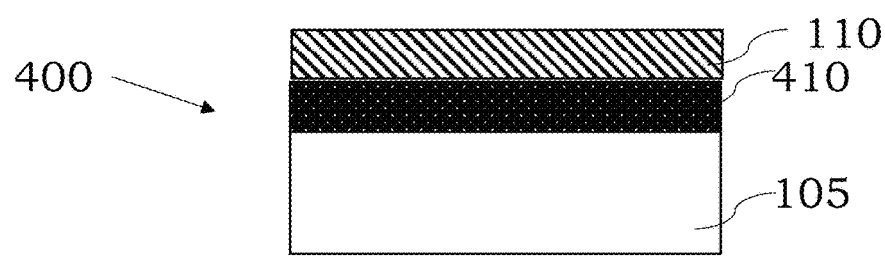
FIG. 4A and FIG. 4B are illustrations of a device including a textured surface.
Figure 4B:
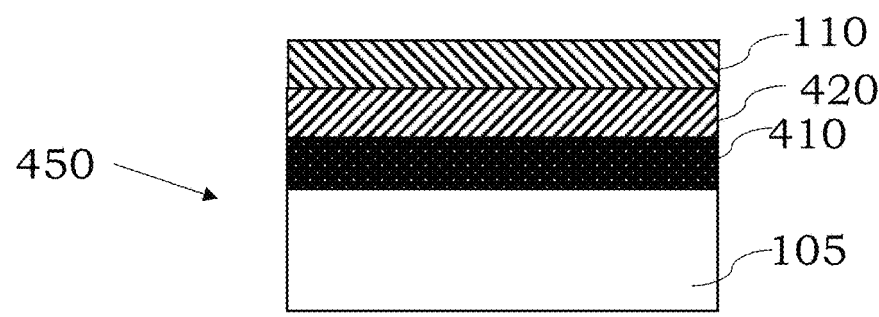

In other embodiments, a surface of the substrate may be treated or include a transferred surface, e.g., a carburized, nitrated, carbonitride, induction hardening, age hardening, precipitation hardening, gas nitriding, normalizing, subzero treatment, annealing, shot pinning, or chemically, thermally, or physically or a combination of thereof, modified surface, that is coated or treated with one or more other layers. Referring to FIG. 4A, an article or device 400 is shown that includes a transferred surface or a treated surface 410 on a substrate 105. The article or device 400 also includes a layer 110 on the treated surface 410. The layer 110 can be any of those materials described herein in reference to the layer 110 in FIGS. 1-3, 5A, 5B and 12. If desired and as shown in FIG. 4B, a layer 420 can be present between the treated surface 410 and the layer 110 of a device 450. The thickness of the layer/treated surface 410 may vary, for example, from about 0.1 microns to about 50 millimeters. The treated surface 410 can be harder than the underlying substrate 105 if desired. For example, the treated surface 410 may have a case hardness of 50-70 HRC. Where the treated surface/layer 410 is a transferred surface, the base material can be, but is not limited to, a steel (low carbon steel, stainless steel, nitride steel, a steel alloy, low alloy steel, etc.) or other metal based materials. The exact result of treatment may vary and typically treatment may be performed to enhance adhesion, alter surface roughness, improve wear resistance, improve the internal stress, reduce the internal stress, alter the hardness, alter lubricity, or for other reasons. The layer 110 may be used to protect device 450 against corrosion, wear, heat and other impacts. In some cases, the treated surface 410 can negatively reduce the resistance of device 450 against corrosion, wear, corrosion and wear combined, heat, heat and wear combined, corrosion and heat combined or other scenario and the layer 110 may be used to improve the performance as needed.

In some embodiments, the substrate 105 in FIGS. 4A and 4B may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 105 may be porous or may be non-porous. The layer 110 in FIGS. 4A and 4B typically includes one or more metals or two or more metals as noted in connection with FIGS. 1-3, 5A, 5B and 12 herein. For example, the layer 110 in FIGS. 4A and 4B can be a metal alloy formed from two or more metals. In some embodiments, one of the metals in the layer 110 in FIGS. 4A and 4B is nickel. In other embodiments, one of the metals in the layer 110 in FIGS. 4A and 4B is molybdenum. In an additional embodiment, one of the metals in the layer 110 in FIGS. 4A and 4B is cobalt. In an additional embodiment, one of the metals in the layer 110 in FIGS. 4A and 4B is tungsten. In an additional embodiment, one of the metals in the layer 110 in FIGS. 4A and 4B is tin. In an additional embodiment, one of the metals in the layer 110 in FIGS. 4A and 4B is chromium. In other embodiments, the layer 110 in FIGS. 4A and 4B can include a nickel alloy, a molybdenum alloy, or combinations thereof. In other embodiments, the layer 110 in FIGS. 4A and 4B can include a molybdenum alloy including at least two metals (optionally excluding precious metals), a molybdenum alloy including at least molybdenum and a transition metal, a molybdenum alloy including at least molybdenum and a transition metal excluding precious metals. In other embodiments, the layer 110 in FIGS. 4A and 4B can include a nickel alloy including at least two metals excluding precious metals, nickel alloy including at least nickel and a refractory metal, nickel alloy including at least nickel and a refractory metal excluding precious metals. In other examples, the layer 110 in FIGS. 4A and 4B may be a nickel-molybdenum alloy or a nickel-molybdenum-phosphorous alloy. In certain configurations, the layer 110 in FIGS. 4A and 4B may consist of a nickel molybdenum alloy or a nickel molybdenum phosphorous alloy with no other materials being present in the layer 110. In other configurations, the layer 110 can include any of those materials, and material combinations, described in reference to FIG. 1, FIG. 2, or FIG. 3.

In certain embodiments, the exact thickness of the layer 110 in FIGS. 4A and 4B may vary from 1 micron to about 2 mm depending on the article or device where the layer 110 is present, e.g., the thickness may vary from about 5 microns to about 200 microns.

In certain embodiments, the intermediate layer 420, when present as shown in FIG. 4B, can improve adhesion between the layer 110 and the layer/surface 410. For example, copper, nickel, or other materials may be present as a thin layer, e.g., 1 micron thick or less, between the layer 110 and the layer/surface 410. While not shown, two or more layers may be present between the layer/surface 410 and the layer 110.

Figure 5A:
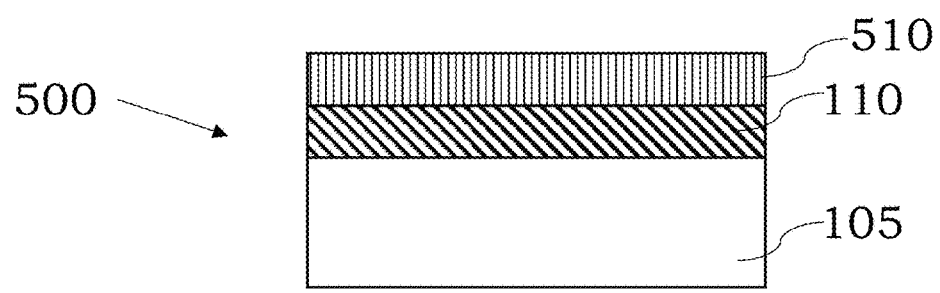
FIG. 5A and FIG. 5B are illustrations of a device including two or more layers.
Figure 5B:
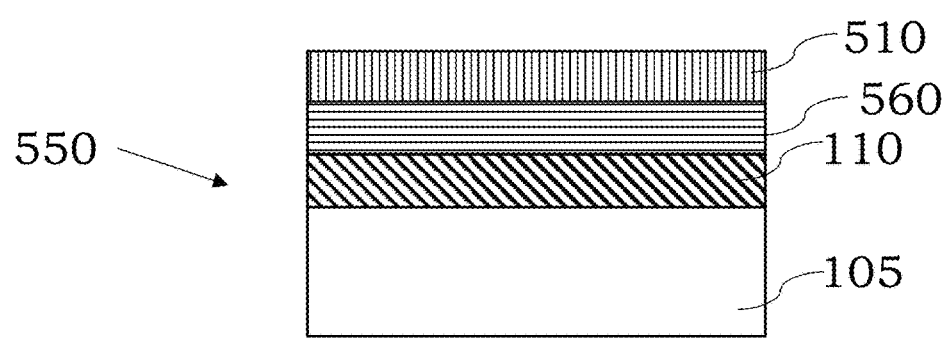

In certain embodiments, one or more layers may be present on top of the alloy layer 110. For example, a metal layer, a metal alloy layer, a layer with particles or composite materials or a layer with other materials may be present on top of the layer 110. Referring to FIG. 5A, an article or device 500 is shown where a layer 510 is present on top of the layer 110. If desired, an additional layer 560 can be present between the layer 510 and the layer 110 as shown in FIG. 5B. The exact materials present in the layers 510, 560 may vary depending on the end use application of the device 500.

In certain embodiments, the substrate 105 in FIGS. 5A and 5B may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 105 may be porous or may be non-porous. The layer 110 in FIGS. 5A and 5B typically includes one or more metals or two or more metals as noted in connection with FIGS. 1-4B and 12. For example, the layer 110 in FIGS. 5A and 5B can be a metal alloy formed from two or more metals. In some embodiments, one of the metals in the layer 110 in FIGS. 5A and 5B is nickel. In other embodiments, one of the metals in the layer 110 in FIGS. 5A and 5B is molybdenum. In an additional embodiment, one of the metals in the layer 110 in FIGS. 5A and 5B is tungsten. In an additional embodiment, one of the metals in the layer 110 in FIGS. 5A and 5B is cobalt. In an additional embodiment, one of the metals in the layer 110 in FIGS. 5A and 5B is chrome. In other embodiments, the layer 110 in FIGS. 5A and 5B can include a nickel alloy, a molybdenum alloy, a cobalt alloy, a tungsten alloy, or combinations thereof. In other examples, the layer 110 in FIGS. 5A and 5B may be a nickel-molybdenum alloy or a nickel-molybdenum-phosphorous alloy. In certain configurations, the layer 110 in FIGS. 5A and 5B may consist of a nickel-molybdenum alloy a nickel-molybdenum-phosphorous alloy with no other materials being present in the layer 110. In other examples, the layer 110 in FIGS. 5A and 5B may include a nickel-molybdenum-phosphorous alloy. In other configurations, the layer 110 in FIGS. 5A and 5B may consist of a nickel-cobalt alloy, nickel-tungsten alloy, nickel-phosphorous ally, cobalt, cobalt-molybdenum alloy, cobalt-tungsten alloy, cobalt-phosphorous alloy, nickel-molybdenum-phosphorous alloy, cobalt-molybdenum-phosphorous alloy, cobalt-tungsten-phosphorous alloy, chrome, chrome alloy, molybdenum-tin alloy, chrome compounds in the layer 110. In other configurations, the layer 110 in FIGS. 5A and 5B may consist of a molybdenum alloy including at least two metals (optionally excluding precious metals), a molybdenum alloy including at least molybdenum and a transition metal, a molybdenum alloy including at least molybdenum and a transition metal excluding precious metals, molybdenum alloy including at least molybdenum and a transition metal and phosphorous, molybdenum alloy including at least molybdenum and a transition metal and tin, molybdenum alloy composite including some particles and nanoparticles. In other configurations, the layer 110 in FIGS. 5A and 5B may consist of nickel alloy including at least two metals excluding precious metals, nickel alloy including at least nickel and a refractory metal, nickel alloy including at least nickel and a refractory metal excluding precious metals. The exact thickness of the layer 110 in FIGS. 5A and 5B may vary from 0.1 micron to about 2 mm depending on the device the layer 110 is present. In certain embodiments, the layers 510, 560 may each independently be a nickel layer, a nickel molybdenum layer, a metal alloy, tin, chrome, or combinations of these materials. In certain embodiments, the layers 510 may include a nitride, a metal carbide, a carbide, a boride, tungsten, tungsten carbide, a tungsten alloy, a tungsten compound, a stainless steel, a ceramic, chromium, chromium carbide, chromium oxide, a chromium compound, aluminum oxide, zirconia, titania, nickel, a nickel carbide, a nickel oxide, a nickel alloy, a cobalt compound, a cobalt alloy, a cobalt phosphorous alloy, molybdenum, a molybdenum compound, a nanocomposite, an oxide composite, or combinations thereof. In certain embodiments, the layers 510 may protect layer 110 against wear. In another embodiment, the layers 110 may protect the substrate 105 against corrosion. In another embodiments, the layer 110 may protect layer 510 against delamination, chipping off, or wearing away, In another embodiment, layer 110 may increase the adhesion of layer 510 to the substrate 105. In another embodiment, the layer 110 may improve the brightness for example by reflecting more light.

Figure 6:
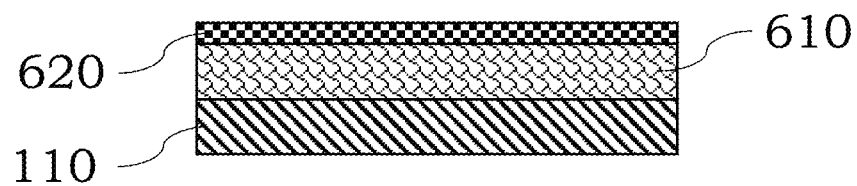
FIG. 6, FIG. 7, and FIG. 8 are illustration of coating layers.

In other configurations, an article or device can include an outer metal layer and at least one underlying alloy layer. Referring to FIG. 6, several layers are shown including layer 110, 610 and 620. The substrate is intentionally omitted from FIGS. 6-8 to simplify the figures. A substrate is typically adjacent to the layer 110 though it may adjacent to another layer if desired. The layer 110 in FIG. 6 typically includes one or more metals or two or more metals as described in reference to FIGS. 1-5B and 12 or other materials as described herein. For example, the layer 110 in FIG. 6 can be a metal alloy formed from two or more metals. In some embodiments, one of the metals in the layer 110 in FIG. 6 is nickel. In other embodiments, one of the metals in the layer 110 in FIG. 6 is molybdenum. In other embodiments, the layer 110 in FIG. 6 can include a nickel alloy, a molybdenum alloy, or combinations thereof. In other examples, the layer 110 in FIG. 6 may be a nickel-molybdenum alloy or a nickel-molybdenum phosphorous alloy. In certain configurations, the layer 110 in FIG. 6 may consist of a nickel-molybdenum alloy or a nickel-molybdenum phosphorous alloy with no other materials being present in the layer 110. The exact thickness of the layer 110 in FIG. 6 may vary from 1 micron to about 2 mm, e.g., about 5 microns to about 200 microns, depending on the device where the layer 110 is present.

In certain embodiments, the layer 610 in FIG. 6 typically includes one or more metals or metal alloys, e.g., nickel, copper, molybdenum, nickel-molybdenum, nickel-molybdenum-phosphorous or combinations thereof. The thickness of the layer 610 is typically can be more or less than that of the layer 110. For example, the thickness of the layer 610 may vary from about 0.1 micron to about 1 micron. In some embodiments, the metal in the layer 610 may be present in the form of an alloy with another metal. The layer 620 typically also includes one or more metals, e.g., nickel, copper, molybdenum, nickel-molybdenum, nickel-molybdenum-phosphorous or combinations thereof. The metal of the layer 620 may be present in alloy or non-alloy form and can be present at a higher or lower thickness than a thickness of the layer 610. For example, the layer 620 may be present at a thickness of about 0.1 micron to about 0.5 microns. In some embodiments, the layer 620 can increase wear resistance, can increase conductivity, can provide a shinier surface, etc. In some configurations, the layers 610, 620 can include the same materials, but the materials may be present in different amounts. For example, each of the layers 610, 620 can be a nickel-molybdenum alloy, but an amount of molybdenum in the layer 610 is different than an amount of the molybdenum in the layer 620.

In certain embodiments, the layer 110 described herein in reference to FIGS. 1-6 can be present between two non-compatible materials to permit the non-compatible materials to be present in a coating or device. The term "non-compatible" generally refers to materials which do not readily bond or adhere to each other or have incompatible physical properties making them unsuitable to be used together. By including a metal alloy in the layer 110, it can be possible to include certain coatings in a device with a copper substrate. For example, an alloy layer of Ni—Mo or Ni—Mo—P may be present between a copper substrate and another metal layer. In certain embodiments, by including a layer 110 between a metal layer (or metal alloy layer) and a substrate, the overall wear resistance of the outer metal layer can increase as well.

Figure 7:
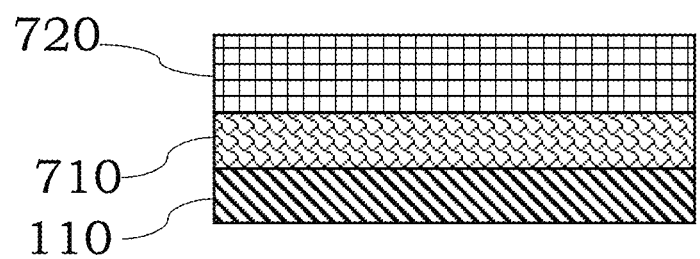

In certain embodiments, one or more of the layers shown in FIGS. 1-6 may include tin (Sn). For example, tin can provide some corrosion resistance. Referring to FIG. 7, several layers are shown including layers 110, 710 and 720. A substrate (not shown) is typically adjacent to the layer 110 though it maybe adjacent to the layer 72 if desired. The layer 110 in FIG. 7 typically includes one or more metals or two or more metals as described in reference to FIGS. 1-6 and 12 or other materials as described herein. For example, the layer 110 in FIG. 7 can be a metal alloy formed from two or more metals. In some embodiments, one of the metals in the layer 110 in FIG. 7 is nickel. In other embodiments, one of the metals in the layer 110 in FIG. 7 is molybdenum. In other embodiments, the layer 110 in FIG. 7 can include a nickel alloy, a molybdenum alloy, or combinations thereof. In other examples, the layer 110 in FIG. 7 may be a nickel-molybdenum alloy or nickel-molybdenum-phosphorous alloy. In certain configurations, the layer 110 in FIG. 7 may consist of a nickel-molybdenum alloy or a nickel-molybdenum-phosphorous alloy with no other materials being present in the layer 110. The exact thickness of the layer 110 in FIG. 7 may vary from 1 micron to about 2 mm, e.g. about 5 microns to about 200 microns, depending on the article or device where the layer 110 is present.

In certain embodiments, the layer 710 in FIG. 7 typically includes one or more metals or metal alloys or combinations thereof. The thickness of the layer 710 can be more thick or less thick than a thickness of the layer 110. For example, the thickness of the layer 710 may vary from about 0.1 micron to about 1 micron. In some embodiments, the metal in the layer 710 may be present in the form of an alloy with another material, e.g., another metal. The layer 720 can include, for example, tin or a tin alloy, etc. The exact thickness of the layer 720 may vary and can be thicker or thinner than a thickness of the layer 710. For example, the layer 720 may be present at a thickness of more than 5 microns, e.g. 10-300 microns or 10-100 microns. In some embodiments, the layer 720 can be present to assist in keeping the surface clean, can increase wear resistance, can increase conductivity, can provide a shinier surface, can resist hydraulic fluids, etc. In some configurations, the layers 710, 720 can include the same materials, but the materials may be present in different amounts. For example, each of the layers 710, 720 can be a tin alloy, but an amount of tin in the layer 710 is different than an amount of tin in the layer 720.

Figure 8:
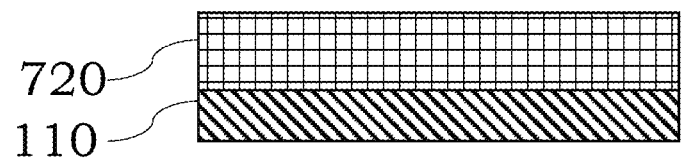

In certain embodiments, a tin or tin alloy layer may be present directly on a metal or metal alloy layer as shown in FIG. 8. Several layers are shown including layer 110 and 720. No layer is present between the layer 110 and the layer 720. A substrate (not shown) is typically attached to the layer 110. The layer 110 in FIG. 8 typically includes one or more metals or two or more metals as described in reference to FIG. 1, FIG. 2 or FIG. 3 or other materials as described herein. For example, the layer 110 in FIG. 8 can be a metal alloy formed from two or more metals. In some embodiments, one of the metals in the layer 110 in FIG. 8 is nickel. In other embodiments, one of the metals in the layer 110 in FIG. 8 is molybdenum. In other embodiments, the layer 110 in FIG. 8 can include a nickel alloy, a molybdenum alloy, or combinations thereof. In other examples, the layer 110 in FIG. 8 may be a nickel-molybdenum alloy or a nickel-molybdenum-phosphorous alloy. In certain configurations, the layer 110 in FIG. 8 may consist of a nickel-molybdenum alloy or a nickel-molybdenum-phosphorous alloy with no other materials being present in the layer 110. The exact thickness of the layer 110 in FIG. 8 may vary from 1 micron to about 2 mm, e.g., from 5 microns to 200 microns, depending on the article or device where the layer 110 is present with typical thicknesses in the range of 10 microns or less or 5 microns or less. The layer 720 can include, for example, tin or a tin alloy, etc. The exact thickness of the layer 720 may vary and is typically thicker than the layer 710. For example, the layer 720 may be present at a thickness of more than 5 microns, e.g. 10-500 microns or 10-200 microns. In some embodiments, the layer 720 can be present to assist in keeping the surface clean, can increase wear resistance, can increase conductivity, can provide a shinier surface, etc.

In certain embodiments, the tin layers described in reference to FIGS. 7 and 8 could be replaced with a chromium layer. For example, chromium can be used to increase hardness and can also be used in decorative layers to enhance the outward appearance of the articles or devices.

One or both of the layers 710, 720 could be a chromium layer or a layer comprising chromium.

Figure 9:
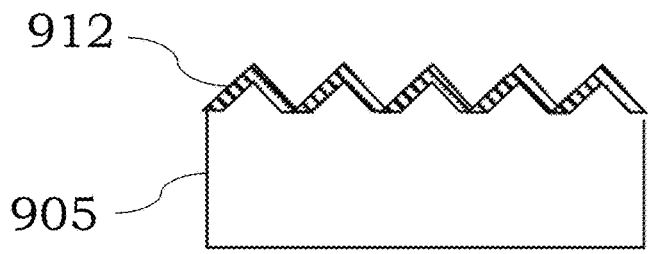
FIG. 9, FIG. 10 and FIG. 11 are illustrations of non-flat surfaces.

Referring to FIG. 9, an illustration is shown including a substrate 905 and a first layer 912. The surface of the substrate is shown as being rough for illustration purposes, and the layer 912 generally conforms to the various peaks and valleys on the surface. The thickness of the layer 912 may be the same or may be different at different areas. In some embodiments, the substrate 905 may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 905 may be porous or may be non-porous. For example, the coating 912 can be a metal alloy formed from two or more metals as described in reference to layer 110 in FIGS. 1-8 and 12 or other materials as described herein. In some embodiments, one of the metals in the coating 912 is nickel. In other embodiments, one of the metals in the coating 912 is molybdenum. In other examples, the coating 912 may be a nickel-molybdenum alloy or a nickel-molybdenum phosphorous alloy. In certain configurations, the coating 912 may consist of a nickel-molybdenum alloy or a nickel-molybdenum phosphorous alloy with no other materials being present in the coating 912. The exact thickness of the coating 912 may vary from 1 micron to about 2 mm, e.g. about 5 microns to about 200 microns, depending on the article or device where the coating 912 is present. While the exact function of the layer 912 may vary, as discussed further below, the layer 912 and roughened surface of the substrate 905 can provide a texture that renders the surface less prone to scattering light or showing fingerprints.

In certain embodiments, one or more layers may be present between the substrate 905 and the layer 912. For example, one or more intermediate layers may be present between the substrate 905 and the layer 912. In some instances, the intermediate layer(s) can improve adhesion between the layer 912 and the substrate 905. For example, copper, nickel, or other materials may be present as a thin layer, e.g., 1 micron thick or less, between the coating 912 and the substrate 905. In certain configurations, the intermediate layer(s) can function as a brightener to increase the overall shiny appearance of the article surface or device surface. In other configurations, the intermediate layer(s) can act to increase corrosion resistance of the coating. In some embodiments, the substrate 905 used with the intermediate layer may be, or may include, a metal material including, but not limited to, steel (carbon steel, tool steel, stainless steel, etc.), copper, copper alloys, aluminum, aluminum alloys, chromium, chromium alloys, nickel, nickel alloys, titanium, titanium alloys, nickel-chromium superalloys, nickel-molybdenum alloys, brass, a plastic, a polymer or combinations thereof. The coating 912 used with the intermediate layer(s) typically includes one or more metals or two or more metals. For example, the coating 912 used with the intermediate layer(s) can be a metal alloy formed from two or more metals as described in reference to the layer 110 in FIGS. 1-8 and 12 or other materials as described herein. In some embodiments, one of the metals in the coating 912 used with the intermediate layer(s) is nickel. In other embodiments, one of the metals in the coating 912 used with the intermediate layer(s) is molybdenum. In other embodiments, the coating 912 used with the intermediate layer(s) can include a nickel alloy, a molybdenum alloy or combinations thereof. In other examples, the coating 912 used with the intermediate layer(s) may be a nickel-molybdenum alloy or a nickel-molybdenum phosphorous alloy. In certain configurations, the coating 912 used with the intermediate layer(s) may consist of a nickel-molybdenum alloy or a nickel-molybdenum phosphorous alloy with no other materials being present in the coating 912. The exact thickness of the coating 912 used with the intermediate layer(s) may vary from 1 micron to about 2 mm, e.g. about 5 microns to about 200 microns, depending on the article or device where the coating 912 is present.

Figure 10:
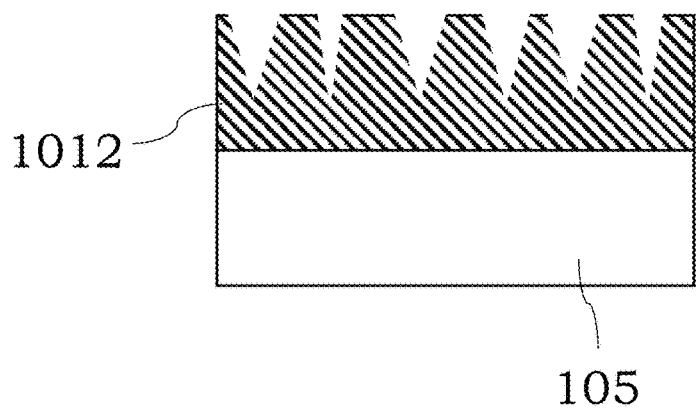

In certain embodiments, it may be desirable to have a surface layer that is roughened. Referring to FIG. 10, an article or device is shown that includes a substrate 105 and a roughened surface layer 1012. The roughened surface layer 1012 can include any of those materials described in connection with the layer 110. In this illustration, the substrate 105 is generally smooth and the layer 1012 may be subjected to post deposition steps to roughen the surface layer 1012. The thickness of the layer 1012 is different at different areas. In some embodiments, the substrate 105 shown in FIG. 10 may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 105 may be porous or may be non-porous. The coating 1012 typically includes one or more metals or two or more metals as described in reference to the layer 110 in FIGS. 1-8 and 12 or other materials as described herein. For example, the coating 1012 can be a metal alloy formed from two or more metals. In some embodiments, one of the metals in the coating 1012 is nickel. In other embodiments, one of the metals in the coating 1012 is molybdenum. In other embodiments, the coating 1012 can include a nickel alloy, a molybdenum alloy, or combinations thereof. In other examples, the coating 1012 may be a nickel-molybdenum alloy or a nickel-molybdenum phosphorous alloy. In certain configurations, the coating 1012 may consist of a nickel-molybdenum alloy or a nickel-molybdenum phosphorous alloy with no other materials being present in the coating 1012. The exact thickness of the coating 1012 may vary from 0.1 micron to about 2 mm, e.g. about 5 microns to about 200 microns, depending on the article or device where the coating 1012 is present. While the exact function of the layer 1012 may vary, as discussed further below, the layer 1012 can provide a texture that renders the surface less prone to scattering light or showing fingerprints.

In certain embodiments, one or more layers may be present between the substrate 105 and the layer 1012. For example, one or more intermediate layers may be present between the substrate 105 and the layer 1012. In some instances, the intermediate layer(s) can improve adhesion between the layer 1012 and the substrate 105. For example, copper, nickel or other materials may be present as a thin layer, e.g., 1 micron thick or less, between the coating 1012 and the substrate 105. In certain configurations, the intermediate layer(s) can function as a brightener to increase the overall shiny appearance of the article or device. In other configurations, the intermediate layer(s) can act to increase corrosion resistance of the article or device. In some embodiments, the substrate 105 used with the intermediate layer may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 105 may be porous or may be non-porous. The coating 1012 used with the intermediate layer(s) typically includes one or more metals or two or more metals as described in reference to the layer 110 in FIGS. 1-8 and 12 or other materials as described herein. For example, the coating 1012 used with the intermediate layer(s) can be a metal alloy formed from two or more metals. In some embodiments, one of the metals in the coating 1012 used with the intermediate layer(s) is nickel. In other embodiments, one of the metals in the coating 1012 used with the intermediate layer(s) is molybdenum. In other embodiments, the coating 1012 used with the intermediate layer(s) can include a nickel alloy, a molybdenum alloy or combinations thereof. In other examples, the coating 1012 used with the intermediate layer(s) may be a nickel-molybdenum alloy or a nickel-molybdenum phosphorous alloy. In certain configurations, the coating 1012 used with the intermediate layer(s) may consist of a nickel-molybdenum alloy or a nickel-molybdenum-phosphorous alloy with no other materials being present in the coating 1012. The exact thickness of the coating 1012 used with the intermediate layer(s) may vary from 1 micron to about 2 mm, e.g. about 10 microns to about 200 microns, depending on the article or device where the coating 1012 is present.

Figure 11:
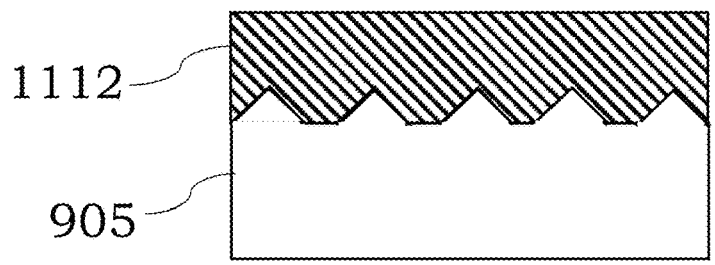

In certain embodiments, a surface coating can be applied to a roughened surface to provide an overall smooth surface. An illustration is shown in FIG. 11 where a roughened substrate 905 includes a layer 1110 that fills in the peaks and valleys and provides a generally smoother outer surface. The surface layer 1110 can include any of those materials described in connection with the layer 110 in FIGS. 1-8 and 12 or other materials as described herein. In this illustration, the substrate 905 may have been subjected to a roughening process and the layer 1110 may be subjected to post deposition steps, e.g., shot peening or other steps, to smooth the surface layer 1110 in the event that it is not smooth after deposition. The thickness of the layer 1110 is different at different areas to fill in the peaks and valleys. In some embodiments, the substrate 905 may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 905 may be porous or may be non-porous. The coating 1110 typically includes one or more metals or two or more metals as described herein in connection with the layer 110. For example, the coating 1110 can be a metal alloy formed from two or more metals. In some embodiments, one of the metals in the coating 1110 is nickel. In other embodiments, one of the metals in the coating 1110 is molybdenum. In other embodiments, the coating 1110 can include a nickel alloy, a molybdenum alloy, or combinations thereof. In other examples, the coating 1110 may be a nickel-molybdenum alloy or a nickel-molybdenum phosphorous alloy. In certain configurations, the coating 1110 may consist of a nickel-molybdenum alloy or a nickel-molybdenum-phosphorous alloy with no other materials being present in the coating 1110. The exact thickness of the coating 1110 may vary from 1 micron to about 2 mm, e.g., about 5 microns to about 200 microns, depending on the article or device where the coating 1110 is present. While the exact function of the layer 1110 may vary, as discussed further below, the layer 1110 can provide a smoother or shinier surface that is more aesthetically pleasing.

In certain embodiments, one or more layers may be present between the substrate 905 and the layer 1110. For example, one or more intermediate layers may be present between the substrate 905 and the layer 1110. In some instances, the intermediate layer(s) can improve adhesion between the layer 1110 and the substrate 905. For example, copper, nickel or other materials may be present as a thin layer, e.g., 1 micron thick or less, between the coating 1110 and the substrate 905. In certain configurations, the intermediate layer(s) can function as a brightener to increase the overall shiny appearance of the article or device. In other configurations, the intermediate layer(s) can act to increase corrosion resistance of the coating. In some embodiments, the substrate 105 used with the intermediate layer may be, or may include, a metal material including, but not limited to, steel (carbon steel, tool steel, stainless steel, alloy steel, low alloy steel, etc.), copper, copper alloys, aluminum, aluminum alloys, chromium, chromium alloys, nickel, nickel alloys, molybdenum, molybdenum alloys, titanium, titanium alloys, nickel-chromium superalloys, nickel-molybdenum alloys, brass, bronze, a superalloy, Hastelloy, Inconel, Nichrome, Monel, or combinations thereof. In some embodiments, the substrate 105 may be porous or may be non-porous. The coating 1110 used with the intermediate layer(s) typically includes one or more metals or two or more metals. For example, the coating 1110 used with the intermediate layer(s) can be a metal alloy formed from two or more metals as described in reference to the layer 110 in FIGS. 1-8 and 12 or other materials as described herein. In some embodiments, one of the metals in the coating 1110 used with the intermediate layer(s) is nickel. In other embodiments, one of the metals in the coating 1110 used with the intermediate layer(s) is molybdenum. In other embodiments, the coating 1110 used with the intermediate layer(s) can include a nickel alloy, a molybdenum alloy, or combinations thereof. In other examples, the coating 1110 used with the intermediate layer(s) may be a nickel-molybdenum alloy or a nickel-molybdenum-phosphorous alloy. In certain configurations, the coating 1110 used with the intermediate layer(s) may consist of a nickel-molybdenum alloy or a nickel-molybdenum-phosphorous alloy with no other materials being present in the coating 1012. The exact thickness of the coating 1110 used with the intermediate layer(s) may vary from 0.1 micron to about 2 mm, e.g. about 5 microns to about 200 microns, depending on the article or device where the coating 1110 is present.

Figure 12:
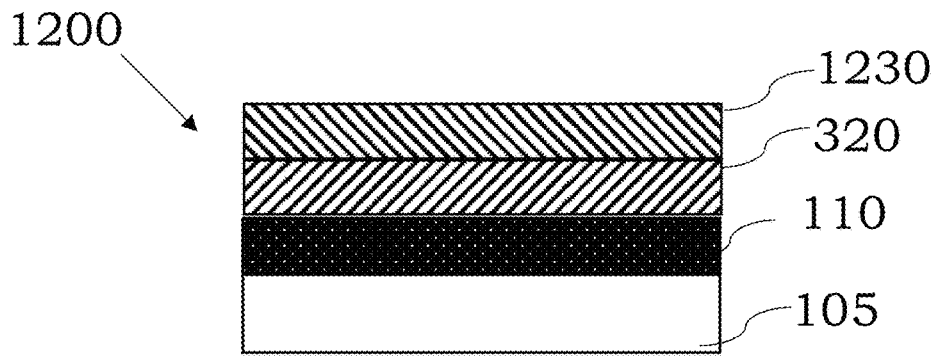
FIG. 12 is an illustration of a device with multiple coating layers.

In certain embodiments, a device or article described herein may include coating with a first layer, a second layer and a third layer on a surface of a substrate. Referring to FIG. 12, an article or device 1200 includes a substrate 105, a first layer 110, a second layer 320 and a third layer 1230. Each of the layers 110, 320 and 1230 may include any of those materials described in connection with the layers 110, 320 described above. In some embodiments, the layer 1230 may be a polymeric coating or a metal or non-metal based coating. The layer 110 is typically a metal alloy layer including two or more metals as noted in connection with the layer 110 of FIGS. 1-8 or other materials as described herein.

In certain configurations, the articles and devices described herein can include a substrate with a coated surface where the coated surface comprises a surface coating. The surface coating may comprise two or more layers. For example, an alloy layer as noted in connection with layer 110 can be on a surface of a substrate 105 and a second layer can be on the alloy layer 110. In some examples, the alloy layer can include molybdenum as noted herein, e.g., molybdenum in combination with one or more of nickel, tungsten, cobalt, chromium, tin, phosphorous, iron, magnesium or boron. The second layer is on the alloy layer can may comprise a ceramic or an alloy or some material which may be harder than the underlying layer with molybdenum. In other instances, the alloy layer with molybdenum may be harder than the second layer depending on the intended use of the article or device. In some embodiments, the second layer may comprise one or more of tungsten, chromium, aluminum, zirconium, titanium, nickel, cobalt, molybdenum, silicon, boron or combinations thereof. (The ceramic comprises metal nitride, a nitride, a metal carbide, a carbide, a boride, tungsten, tungsten carbide, a tungsten alloy, a tungsten compound, a stainless steel, a ceramic, chromium, chromium carbide, chromium oxide, a chromium compound, aluminum oxide, zirconia, zirconium oxide titania, nickel, a nickel carbide, a nickel oxide, a nickel alloy, a cobalt compound, a cobalt alloy, a cobalt phosphorous alloy, molybdenum, a molybdenum compound, a nanocomposite, an oxide composite, or combinations thereof. In some instances, the second layer may have a Vickers hardness of 600 Vickers or more.

In other configurations, the articles or devices described herein may comprise materials which provide a lubricious alloy layer. For example, a substrate can include a coated surface with a smooth alloy layer. In some embodiments, the alloy layer can be formed on the substrate and may comprise molybdenum or other materials as noted in connection with the layer 110 in the figures. A weight percentage of the molybdenum or other metal may be 35% by weight or less. A surface roughness Ra of the lubricious alloy layer may be less than 1 micron. In some instances, the alloy layer can also include one or more of nickel, tungsten, cobalt, chromium, tin, phosphorous, iron, magnesium or boron. In some embodiments, the surface coating can include two or more layers. For example, a base layer may be present with an alloy layer formed or added to the base layer. The base layer can be an intermediate layer between a substrate and the alloy layer or may be a standalone layer that is self-supporting and not present on any substrate. In some examples, the base layer may comprise one or more of a nickel layer, a copper layer, a nickel-phosphorous layer, a nickel-molybdenum layer or other materials. The coating on the base layer may comprise one or more of molybdenum, nickel, tungsten, cobalt, chromium, tin, phosphorous, iron, magnesium or boron. In some instances, the alloy layer may be an exposed outer later or may be free of precious metals. If desired, particles may also be present in one or more of the layers. Illustrative particles are described herein.

In certain embodiments, a surface coating that includes two or more layers including the same materials may be present on the articles described herein. Alternatively, one of the layers may be a standalone layer that is self-supporting and not present on any substrate. For example, a first alloy layer comprising nickel and molybdenum may be present in combination with a second alloy layer comprising nickel and molybdenum. The amounts of the materials in different layers may be different or different layers may have different additives, e.g., different particles or other materials. In some instances, one of the layers may be rougher than the other layer by altering the amounts of the materials in one of the layers. For example, a weight percent of molybdenum in the second alloy layer can be less than 30% by weight and the roughness of the overall surface coating can be less than 1 um Ra. Each of the two layers may independently include one or more of molybdenum, nickel, tungsten, cobalt, chromium, tin, phosphorous, iron, magnesium or boron. In some instances, one of the alloy layers may be free of precious metals. In other instances, each of the alloy layer is free of precious metals. If desired, particles may also be present in one or more of the alloy layers. Illustrative particles are described herein.

In certain embodiments, an article can include a surface coating that has an alloy layer described herein along with a chromium layer on top of the alloy layer. The alloy layer can include molybdenum and one or more of nickel, tungsten, cobalt, chromium, tin, phosphorous, iron, magnesium or boron. The chromium layer may be an alloy including another metal or material. In some examples, the chromium layer is free of precious metals. In other instances, each of the alloy layer and the chromium layer is free of precious metals.

In other configurations, a surface coating can include a nickel molybdenum phosphorous (Ni—Mo—P) alloy layer. In some instances, one or more other materials may be present in the nickel molybdenum phosphorous alloy layer. For example, one or more of tungsten, cobalt, chromium, tin, iron, magnesium or boron may be present. If desired, particles may also be present. The Ni—Mo—P alloy layer may include molybdenum at 35% by weight or less in the alloy layer or in the surface coating.

In certain examples, the coating layers described herein can be applied to the substrate using suitable methodologies including, but not limited to, vacuum deposition, physical vapor deposition (PVD), chemical vapor deposition (CVD), plasma deposition, brushing, spin-coating, spray coating, electrodeposition/electroplating, electroless deposition/plating, high velocity oxygen fuel (HVOF) coating, thermal spraying or other suitable methods.

In certain examples, one or more of the coating layers may be deposited using vacuum deposition. In certain embodiments, vacuum deposition generally deposits a layer of material atom-by-atom or molecule-by-molecule on a surface of a substrate. Vacuum deposition processes can be used to deposit one or more materials with a thickness from one or more atoms up to a few millimeters.

In certain embodiments, physical vapor deposition (PVD), a type of vacuum deposition, can be used to deposit one or more of the coating layers described herein. PVD generally uses a vapor of the materials to produce a thin coating on the substrate. The coatings described herein may be, for example, sputtered onto a surface of the substrate or applied onto a surface of the substrate using evaporation PVD. In other embodiments, one or more coating layers can be produced on a substrate using chemical vapor deposition (CVD). CVD generally involves exposing the substrate to one or more materials that react and/or decompose on the surface of the substrate to provide a desired coating layer on the substrate. In other configurations, plasma deposition (PD), e.g., plasma enhanced chemical vapor deposition or plasma assisted chemical vapor deposition, can be used to provide a coating layer on a substrate. PD generally involves creating a plasma discharge from reacting gases including the material to be deposited and/or subjecting an already deposited material to ions in a plasma gas to modify the coating layer. In other examples, atomic layer deposition (ALD) can be used to provide a coating layer on a surface. In ALD, a substrate surface is exposed to repeated amounts of precursors that can react with a surface of a material to build up the coating layer.

In other examples, one or more of the coating layers described herein can be deposited into a surface of a substrate using brushing, spin-coating, spray coating, dip coating, electrodeposition (e.g., electroplating, cathodic electrodeposition, anodic electrodeposition, etc.), electroless plating, electrocoating, electrophoretic deposition, or other techniques. Where an electric current is used to deposit a coating layer on a substrate, the current may be continuous, pulsed or combinations of continuous current and pulsed current can be used. Certain electrodeposition techniques are described in more detail below.

In some configurations, one or more layers of the coating may be applied using electrodeposition. In general, electrodeposition uses a voltage applied to the substrate placed in a bath to form the coating on the charged substrate. For example, ionic species present in the bath can be reduced using the applied voltage to deposit the ionic species in a solid form onto a surface (or all surfaces) of the substrate. As noted in more detail below, the ionic species can be deposited to provide a metal coating, a metal alloy coating or combinations thereof. Depending on the exact ionic species used and the electrodeposition conditions and techniques, the resulting properties of the formed, electrodeposited coating may be selected or tuned to provide a desired result.

In certain embodiments where electrodeposition is used, the ionic species may be dissolved or solvated in an aqueous solution or water. The aqueous solution may include suitable dissolved salts, inorganic species or organic species to facilitate electrodeposition of the coating layer(s) on the substrate. In other embodiments where electrodeposition is used, the liquid used in the electrodeposition bath may generally be non-aqueous, e.g., include more than 50% by volume of non-aqueous species, and may include hydrocarbons, alcohols, liquified gases, amines, aromatics and other non-aqueous materials.

In general, the electrodeposition bath includes the species to be deposited as a coating on the substrate. For example, where nickel is deposited onto a substrate, the bath can include ionic nickel or solvated nickel. Where molybdenum is deposited into a substrate, the bath can include ionic molybdenum or solvated molybdenum. Where an alloy is to be deposited on a substrate, the bath can include more than a single species, e.g., the bath may include ionic nickel and ionic molybdenum that are co-electrodeposited to form a nickel-molybdenum alloy as a coating layer on a substrate. The exact form of the materials added to the bath to provide ionic or solvated species can vary. For example, the species may be added to the bath as metal halides, metal fluorides, metal chlorides, metal carbonates, metal hydroxides, metal acetates, metal sulfates, metal nitrates, metal nitrites, metal chromates, metal dichromates, metal permanganates, metal platinates, metal cobalt-nitrites, metal hexachloroplatinates, metal citrates, ammonium salt of the metal, metal cyanides, metal oxides, metal phosphates, metal monobasic sodium phosphates, metal dibasic sodium phosphates, metal tribasic sodium phosphates, sodium salt of the metal, potassium salt of the metal, metal sulfamate, metal nitrite, and combinations thereof. In some examples, a single material that includes both of the metal species to be deposited can be dissolved in the electrodeposition bath, e.g., a metal alloy salt can be dissolved in a suitable solution prior to electrodeposition. The specific materials used in the electrodeposition bath depends on the particular alloy layer to be deposited. Illustrative materials include, but are not limited to, nickel sulfate, nickel sulfamate, nickel chloride, sodium tungstate, tungsten chloride, sodium molybdate, ammonium molybdate, cobalt sulfate, cobalt chloride, chromium sulfate, chromium chloride, chromic acid, stannous sulfate, sodium stannate, hypophosphite, sulfuric acid, nickel carbonate, nickel hydroxide, potassium carbonate, ammonium hydroxide, hydrochloric acid or other materials.

In certain embodiments, the exact amount or concentration of the species to be electrodeposited onto a substrate may vary. For example, the concentration of the species may vary from about 1 gram/Liter to about 400 grams/Liter. If desired, as the ionic species are depleted as a result of formation of the coating on the substrate, additional material can be added to the bath to increase an amount of the species available for electrodeposition. In some instances, the concentration of the species to be deposited may be maintained at a substantially constant level during electrodeposition by continuously adding material to the bath.

In certain embodiments, the pH of the electrodeposition bath may vary depending on the particular ionic species present in the bath. For example, the pH may vary from 1 to about 13, but in certain instances, the pH may be less than 1, or even less than 0, or greater than 13 or even greater than 14. Where metal species are deposited as metal alloys onto a substrate, the pH may range, in certain instances, from 4 to about 12. It will be recognized, however, that the pH may be varied depending on the particular voltage and electrodeposition conditions that are selected for use. Some pH regulators and buffers may be added to the bath. Examples of pH regulators include but not limited to boric acid, hydrochloric acid, sodium hydroxide, potassium hydroxide, ammonium hydroxide, glycine, Sodium acetate, buffered saline, Cacodylate buffer, Citrate buffer, Phosphate buffer, Phosphate-citrate buffer, Barbital buffer, TRIS buffers, Glycine-NaOH buffer, and any combination thereof.

In certain embodiments, alloy plating can use a complexing agent. For example, the main role of complexing agents in an alloy deposition process is making complexations of different metallic ions. Therefore, without a proper complexing agent, simultaneous deposition of nickel and molybdenum and alloy formation will not occur. Examples of complexing agents include but are not limited to phosphates, phosphonates, polycarboxylates, zeolites, citrates, ammonium hydroxide, ammonium salts, citric acid, ethylenediaminetetraacetic acid, diethylene-triaminepentaacetic acid, aminopolycarboxylates, nitrilotriacetic acid, IDS (N-(1,2-dicarboxyethyl)-D,L-aspartic acid (iminodisuccinic acid), DS (polyaspartic acid), EDDS (N,N'-ethylenediaminedisuccinic acid), GLDA (N,N-bis(carboxylmethyl)-L-glutamic acid) and MGDA (methylglycinediacetic acid), hexamine cobalt (III) chloride, ethylene glycol-bis(O-aminoethyl ether)-N,N,N',N'-tetraacetic acid (EGTA), ferrocene, cyclodextrins, choleic acid, polymers, and any combination thereof.

In some examples, a suitable voltage can be applied to cathodes and anodes of the electrodeposition bath to promote formation of the layer(s) described herein on a substrate. In some embodiments, a direct current (DC) voltage can be used. In other examples, an alternating current (AC) optionally in combination with current pulses can be used to electrodeposit the layers. For example, AC electrodeposition can be carried out with an AC voltage waveform, in general sinusoidal, squared, triangular, and so on. High voltages and current densities can be used to favor the tunneling of electrons through an oxide base layer that can form on the substrate. Furthermore, the base layer can conduct in the direction of the cathode, which favors the deposition of the material and avoids its reoxidation during the oxidant half-cycle.

In certain embodiments, illustrative current density ranges that can be used in electrodeposition include, but are not limited to 1 mA/cm² DC to about 600 mA/cm² DC, more particularly about 1 mA/cm² DC to about 300 mA/cm² DC. In some examples, the current density can vary from 5 mA/cm² DC to about 300 mA/cm² DC, from 20 mA/cm² DC to about 100 mA/cm² DC, from 100 mA/cm² DC to about 400 mA/cm² DC or any value falling within these illustrative ranges. The exact time that the current is applied may vary from about 10 seconds to a few days, more particularly about 40 seconds to about 2 hours. A pulse current can also be applied instead of a DC current if desired.

In some examples, the electrodeposition may use pulse current or pulse reverse current is during the electrodeposition of the alloy layer. In pulse electrodeposition (PED), the potential or current is alternated swiftly between two different values. This results in a series of pulses of equal amplitude, duration and polarity, separated by zero current. Each pulse consists of an ON-time (TON) during which potential and/current is applied, and an OFF-time (TOFF) during which zero current is applied. It is possible to control the deposited film composition and thickness in an atomic order by regulating the pulse amplitude and width. They favor the initiation of grain nuclei and greatly increase the number of grains per unit area resulting in finer grained deposit with better properties than conventionally plated coatings.

In examples where the coating includes two or more layers, the first layer and the second layer of the coating may be applied using the same or different electrodeposition baths. For example, a first layer can be applied using a first aqueous solution in an electrodeposition bath. After application of a voltage for a sufficient period to deposit the first layer, the voltage may be reduced to zero, the first solution can be removed from the bath and a second aqueous solution comprising a different material can be added to the bath. A voltage can then be reapplied to electrodeposit a second layer. In other instances, two separate baths can be used, e.g., a reel-to-reel process can be used, where the first bath is used to electrodeposit the first layer and a second, different bath is used to deposit the second layer.

In some cases, individual articles may be connected such that they can be sequentially exposed to separate electrodeposition baths, for example in a reel-to-reel process. For instance, articles may be connected to a common conductive substrate (e.g., a strip). In some embodiments, each of the electrodeposition baths may be associated with separate anodes and the interconnected individual articles may be commonly connected to a cathode.

While the exact material used in electroplating methods may vary, illustrative materials include cations of one or more of the following metals: nickel, molybdenum, copper, aluminum, cobalt, tungsten, gold, platinum, palladium, silver, or combinations thereof. The exact anion form of these metals may vary from chlorides, acetates, sulfates, nitrates, nitrites, chromates, dichromates, permanganates, platinates, cobalt nitrites, hexachloroplatinates, citrates, cyanides, oxides, phosphates, monobasic sodium phosphates, dibasic sodium phosphates, tribasic sodium phosphates and combinations thereof.

In other instances, the electrodeposition process can be designed to apply an alloy layer including molybdenum and one or more of nickel, tungsten, cobalt, chromium, tin, phosphorous, iron, magnesium and boron or at least one compound comprising one or more of nickel, tungsten, cobalt, chromium, tin, phosphorous, iron, magnesium or boron. In some embodiments, the resulting alloy layer may be free of precious metals.

In some embodiments, there may be no intervening or intermediate layers between the coating layer 110 and the substrate 105. For example, the coating layer 110 can be deposited directly onto the substrate surface 105 without any intervening layer between them. In other instances, an intermediate layer may be present between the coating layer 110 and the surface 106 of the substrate 105. The intermediate layer can be formed using the same methods used to form the coating layer 110 or different methods used to form the coating layer 110. In some embodiments, an intermediate layer can include one or more of copper, a copper alloy, nickel, a nickel alloy, a nickel-phosphorous alloy, a nickel-phosphorous alloy including hard particles or other compounds such as phosphorous, boron, boron nitride, silicon carbide, aluminum oxide, molybdenum disulfide, hard particles with a hardness of HV>1000, hard particles with size less 500 nm, highly conductive particles, carbon nanotubes and or carbon nano-particles. In other instances, the intermediate layer can include an alloy of nickel that is less magnetic than nickel alone. In some instances, the intermediate layer may be substantially less than the coating layer 110 and can be used to enhance adhesion of the coating layer 110 to the substrate 105. For example, the intermediate layer can be 90%, 80%, 70%, 60%, 50%, 40%, 30%, 20% or 10% less thick than a thickness of the coating layer 110. In certain embodiments, the layer between the substrate and the alloy layer may be a "nickel strike" layer as is commonly known in the electroplating arts.

In some embodiments, one or more of the materials of a coating layer can be provided using a soluble anode. The soluble anode can dissolve in the electrodeposition bath to provide the species to be deposited. In some embodiments, the soluble anode may take the form of a disk, a rod, a sphere, strips of materials or other forms. The soluble anode can be present in a carrier or basket coupled to a power source.

In some embodiments, one or more of the coating layers described herein may be deposited using an anodization process. Anodization generally uses the substrate as the anode of an electrolytic cell. Anodizing can change the microscopic texture of the surface and the resulting metal coating near the surface. For example, thick coatings are often porous and can be sealed to enhance corrosion resistance. Anodization can result in harder and more corrosion resistant surfaces. In some examples, one of the coating layers of the articles described herein can be produced using an anodization process and another coating layer may be produced using a non-anodization process. In other instances, each coating layer in the article can be produced using an anodization process. The exact materials and process conditions using anodization may vary. Generally, the anodized layer is grown on a surface of the substrate by applying a direct current through an electrolyte solution including the material to be deposited. The material to be deposited can include magnesium, niobium, tantalum, zinc, nickel, molybdenum, copper, aluminum, cobalt, tungsten, gold, platinum, palladium, silver, or alloys or combinations thereof. Anodization is typically performed under acidic conditions and may include chromic acid, sulfuric acid, phosphoric acid, organic acids or other acids.

In certain embodiments, the coatings described herein may be applied in the presence of other additive or agents. For example, wetting agents, leveling agents, brighteners, defoaming agents and/or emulsifiers can be present in aqueous solutions that include the materials to be deposited onto the substrate surface. Illustrative additive and agents include, but are not limited to, thiourea, domiphen bromide, acetone, ethanol, cadmium ion, chloride ion, stearic acid, ethylenediamine dihydrochloride (EDA), saccharin, cetyltrimethylammonium bromide (CTAB), sodium dodecyl sulfate, sodium lauryl sulfate (SLS), saccharine, naphthalene sulfonic acid, benzene sulfonic acid, coumarin, ethyl vanillin, ammonia, ethylene diamine, polyethylene glycol (PEG), bis(3-sulfopropyl)disulfide (SPS), Janus green B (JGB), azobenzene-based surfactant (AZTAB), the polyoxyethylene family of surface active agents, sodium citrate, perfluorinated alkylsulfate, additive K, calcium chloride, ammonium chloride, potassium chloride, boric acid, myristic acid, choline chloride, citric acid, any redox active surfactant, any conductive ionic liquids, polyglycol ethers, polyglycol alcohols, sulfonated oleic acid derivatives, sulfate form of primary alcohols, alkylsulfonates, alkylsulfates, aralkylsulfonates, sulfates, Perfluoro-alkylsulfonates, acid alkyl and aralkyl-phosphoric acid esters, alkylpolyglycol ether, alkylpolyglycol phosphoric acid esters or their salts, N-containing and optionally substituted and/or quaternized polymers, such as polyethylene imine and its derivatives, polyglycine, poly(allylamine), polyaniline (sulfonated), polyvinylpyrrolidone, gelatin, polyvinylpyridine, polyvinylimidazole, polyurea, polyacrylamide, poly(melamine-co-formaldehyde), polyalkanolamines, polyaminoamide and derivatives thereof, polyalkanolamine and derivatives thereof, polyethylene imine and derivatives thereof, quaternized polyethylene imine, poly(allylamine), polyaniline, polyurea, polyacrylamide, poly(melamine-co-formaldehyde), hydroxy-ethyl-ethylene-diamine triacetic acid, 2 Butyne 1 4 diol, 2 2 azobis(2-methyl propionitrite), perfluoroammonoic acid, dextrose, cetyl methyl ammonium bromide, 1 hexadecyl pyridinium-chloride, d-mannitol, glycine, Rochelle salt, N N'-diphenylbenzidine, glycolic acid, tetra-methyl-ammonium hydroxide, reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline, one or more of fats, oils, long chained alcohols, or glycols, polyethylene glycols, polyethylene oxides such as Tritons, alkylphosphates, metal soaps, special silicone defoamers, commercial perfluoroalkyl-modified hydrocarbon defoamers and perfluoroalkyl-substituted silicones, fully fluorinated alkylphosphonates, perfluoroalkyl-substituted phosphoric acid esters, cationic-based agents, amphoteric-based agents, and nonionic-based agent; chelating agents such as citrates, acetates, gluconates, and ethylenediamine tetra-acetic acid (EDTA), or any combination thereof.

In embodiments where electroless plating is used, metal coatings can be produced on a substrate by autocatalytic chemical reduction of metal cations in a bath. In contrast to electrodeposition/electroplating, no external electric current is applied to the substrate in electroless plating. While not wishing to be bound by any particular configuration or example, electroless plating can provide more even layers of the material on the substrate compared to electroplating. Further, electroless plating may be used to add coatings onto non-conductive substrates.

In certain embodiments where electroless plating is used, the substrate itself may act as a catalyst to reduce an ionic metal and form a coating of the metal on the surface of the substrate. Where it is desirable to produce a metal alloy coating, the substrate may act to reduce two or more different ionic metals with the use of a complexing agent to form a metal alloy including the two different metals. In some examples, the substrate itself may not function as a catalyst but a catalytic material can be added to the substrate to promote formation of the metal coating on the substrate. Illustrative catalytic materials that can be added to a substrate include, but are not limited to, palladium, gold, silver, titanium, copper, tin, niobium, and any combination thereof.

While the exact material used in electroless plating methods may vary, illustrative materials include one or more of the following cations: magnesium, niobium, tantalum, zinc, nickel, molybdenum, copper, aluminum, cobalt, tungsten, gold, platinum, palladium, silver, or alloys or combinations thereof. For example, any one or more of these cations can be added as a suitable salt to an aqueous solution. Illustrative suitable salts include, but are not limited to, metal halides, metal fluorides, metal chlorides, metal carbonates, metal hydroxides, metal acetates, metal sulfates, metal nitrates, metal nitrites, metal chromates, metal dichromates, metal permanganates, metal platinates, metal cobalt nitrites, metal hexachloroplatinates, metal citrates, metal cyanides, metal oxides, metal phosphates, metal monobasic sodium phosphates, metal dibasic sodium phosphates, metal tribasic sodium phosphates and combinations thereof.

In certain embodiments, the substrates described herein may be subjected to pre-coating processing steps to prepare the substrate to receive a coating. These processing steps can include, for example, cleaning, electro-cleaning (anodic or cathodic), polishing, electro-polishing, pre-plating, thermal treatments, abrasive treatments and chemical treatments. For example, the substrates can be cleaned with an acid, a base, water, a salt solution, an organic solution, an organic solvent or other liquids or gases. The substrates can be polished using water, an acid or a base, e.g., sulfuric acid, phosphoric acid, etc. or other materials optionally in the presence of an electric current. The substrates may be exposed to one or more gases prior to application of the coating layers to facilitate removal of oxygen or other gases from a surface of the substrate. The substrate may be washed or exposed to an oil or hydrocarbon fluid prior to application of the coating to remove any aqueous solutions or materials from the surface. The substrate may be heated or dried in an oven to remove any liquids from the surface prior to application of the coating. Other steps for treating the substrate prior to application of a coating may also be used. For example, the substrate can be heated to a high temperature, for example, more than 100 deg. C, more than 200 deg C., more than 500 deg C., more than 700 deg C. or more than 1000 deg C. Similarly, the final article including the coating may operate in such high temperatures.

In some embodiments, the coatings layers described herein can be subjected to sealing. While the exact conditions and materials uses to seal the coatings can vary, sealing can reduce the porosity of the coatings and increase their hardness. In some embodiments, sealing may be performed by subjecting the coating to steam, organic additives, metals, metal salts, metal alloys, metal alloy salts, or other materials. The sealing may be performed at temperatures above room temperature, e.g., 30 degrees Celsius, 50 degrees Celsius, 90 degrees Celsius or higher, at room temperature or below room temperature, e.g., 20 degrees Celsius or less. In some examples, the substrate and coating layer may be heated to remove any hydrogen or other gases in the coating layer. For example, the substrate and coating can be baked to remove hydrogen from the article within 1-2 hours post-coating.

It will be recognized by the person of ordinary skill in the art that combinations of post-deposition processing methods can be used. For example, the coating layer may be sealed and then polished to reduce surface roughness.

In certain configurations, a substrate to receive a coating can be cleaned. The substrate can then be rinsed. The substrate can then be subjected to acid treatment. The acid treated substrate is then rinsed. The rinsed substrate is then added to a plating tank. The plated substrate can optionally be rinsed. The substrate with the coated surface can then be subjected to post-plating processes. Each of these steps are discussed in more detail below. An optional strike step to provide a nickel layer (or a layer of another material) on the surface of the substrate can be performed between steps the acid treatment step and the plating step if desired.

In certain embodiments, the cleaning step can be performed in the presence or absence of an electric current. Cleaning is typically performed in the presence of one or more salts and/or a detergent or surfactant and may be performed at an acidic pH or a basic pH. Cleaning is generally performed to remove any oils, hydrocarbons or other materials from the surface of the substrate.

After the substrate is cleaned, the substrate is rinsed to remove any cleaning agents. The rinsing is typically performed in distilled water but may be performed using one or more buffers or at an acidic pH or a basic pH. Rinsing may be performed once or numerous times. The substrate is typically kept wet between the various steps to minimize oxide formation on the surface. A water break test can be performed to verify the surface is clean and/or free of any oils.

After rinsing, the substrate can be immersed in an acid bath to activate the surface for electrodeposition, e.g., to pickle the surface. The exact acid used is not critical. The pH of the acidic treatment may be 0-7 or even less than 0 if desired. The time the substrate remains in the acid bath may vary, for example, from 10 seconds to about 10 minutes. The acidic solution can be agitated or pumped over the substrate surface if desired, or the substrate may be moved within the acidic tank during the pickling process.

After the pickling process, the surface can be rinsed to remove any acid. The rinsing may be performed by immersing the pickled substrate into a rinse bath, by flowing rinse agent over the surface or both. Rinsing can be performed multiple times or a single time as desired.

After pickling, the substrate can optionally be subjected to a strike. Without wishing to be bound by any one configuration, a strike applies a thin layer of material to a substrate that is typically inert or less reactive with the material to be deposited. Examples of inert substrates include, but are not limited to, stainless steels, titanium, certain metal alloys and other materials. In the strike process, a thin layer of material, e.g., up to a few microns thick, is applied using electrodeposition.

The rinsed, pickled substrate, or a rinsed substrate with the strike layer, can then be subjected to an electrodeposition process as noted above to apply a layer of material to the substrate surface. As noted herein, electrodeposition can be performed using AC voltages or DC voltages and various waveforms. The exact current density used can vary to favor or disfavor a particular amount of the elements that end up in the resulting coating. For example, where an alloy layer includes two metals, the current density can be selected so one metal is present in a higher amount than the other metal in the resulting alloy layer. The pH of the electrodeposition bath may also vary depending on the particular species that are intended to be present in the surface coating. For example, an acidic bath (pH=3-5.5), a neutral pH bath, or a basic pH bath (pH 9-12) may be used depending on the materials present in the electrodeposition bath and in the anode. The exact temperature used during the electrodeposition process may vary from room temperature (about 25 deg. Celsius) up to about 85 degrees Celsius. The temperature is desirably less than 100 deg. Celsius so water in the electrodeposition bath does not evaporate to a substantial degree. The electrodeposition bath can include the materials to be deposited along with optional agents including brighteners, levelers, particles, etc. as noted herein.

In some embodiments, the electrodeposition bath can include a brightener. A variety of organic compounds are used as brighteners in to provide a bright, level, and ductile nickel deposit. Brighteners can generally be divided into two classes. Class I, or primary, brighteners include compounds such as aromatic or unsaturated aliphatic sulfonic acids, sulfonamides, sulfonimides, and sulfimides. Class I brighteners can be used in relatively high concentrations and produce a hazy or cloudy deposit on the metal substrate. Decomposition of Class I brighteners during the electroplating process can cause sulfur to be incorporated into the deposit, which reduces the tensile stress of the deposit. Class II, or secondary, brighteners are used in combination with Class I brighteners to produce a fully bright and leveled deposit. Class II brighteners are generally unsaturated organic compounds. A variety of organic compounds containing unsaturated functional groups such as alcohol, diol, triol, aldehydic, olefinic, acetylinic, nitrile, and pyridine groups can be used as Class II brighteners. Typically, Class II brighteners are derived from acetylinic or ethylenic alcohols, ethoxylated acetylenic alcohols, coumarins and pyridine based compounds. Mixtures of such unsaturated compounds with mixtures of Class I brighteners can be combined to obtain maximum brightness or ductility for a given rate of leveling. A variety of amine compounds can also be used as brightening or leveling agents. Acyclic amines can be used as Class II brighteners. Acetylenic amines can be used in combination with acetylenic compounds to improve leveling and low current density coverage.

In certain embodiments, the resulting amount of metals present in the alloy layer can vary. For example, in one electrodeposition process where two metals are present in the surface coating, one of the metals, e.g., molybdenum, may be present up to about 35 weight percent based on a weight of the surface coating. In other embodiments, one of the metals, e.g., molybdenum, may be present up to about 20 weight percent based on a weight of the surface coating. In some examples, one of the metals, e.g., molybdenum, may be present up to about 16 weight percent based on a weight of the surface coating. In some examples, one of the metals, e.g., molybdenum, may be present up to about 10 weight percent based on a weight of the surface coating. In some examples, one of the metals, e.g., molybdenum, may be present up to about 6 weight percent based on a weight of the surface coating.

In certain configurations, the substrate with the surface coating can then be rinsed or can be subjected to another deposition process to apply a second layer onto the formed first layer. The second deposition process can be, for example, vacuum deposition, physical vapor deposition (PVD), chemical vapor deposition (CVD), plasma deposition, brushing, spin-coating, spray coating, electrodeposition/electroplating, electroless deposition/plating, high velocity oxygen fuel (HVOF) coating, thermal spraying or other suitable methods. In some instances, a second electrodeposition step can be used to apply a second layer on top of the formed first layer. For example, the second layer can be an electrodeposited layer including one, two, three or more metal or other materials. If desired, additional layer can be formed on the second layer using electrodeposition or any of the other processes mentioned herein.

In other configurations, a layer of material can be deposited on a cleaned or pickled substrate prior to forming a layer using an electrodeposition process. For example, one or more layers can first be formed on a substrate using vacuum deposition, physical vapor deposition (PVD), chemical vapor deposition (CVD), plasma deposition, brushing, spin-coating, spray coating, electrodeposition/electroplating, electroless deposition/plating, high velocity oxygen fuel (HVOF) coating, thermal spraying or other suitable methods. A second layer can be formed on the first layer using an electrodeposition process as noted herein. If desired, the first formed layer can be activated by a pickling process prior to electrodeposition of the second layer on the first layer.

In instances where a single layer is formed on a substrate by electrodeposition, the substrate with the coated surface can then be subjected to one or more post-processing steps including, for example, rinsing, polishing, sanding, heating, annealing, consolidating, etching or other steps to either clean the coated surface or alter the physical or chemical properties of the coated surface. If desired, some portion of the coating can be removed using an acidic solution or a basic solution depending on the materials present in the coating.

In certain embodiments, a method of producing an alloy layer on a substrate comprises forming a coated surface on the substrate by electrodepositing an alloy layer on the surface of the substrate. The electrodeposited alloy layer comprises (i) molybdenum and (ii) at least one element selected from the group consisting of nickel, tungsten, cobalt, chromium, tin, phosphorous, iron, magnesium and boron or at least one compound comprising one or more of nickel, tungsten, cobalt, chromium, tin, phosphorous, iron, magnesium or boron. In some examples, the method comprises, prior to electrodepositing the alloy layer, cleaning the substrate, rinsing the cleaned substrate, activating a surface of the cleaned substrate to provide an activated substrate, rinsing the activated substrate, and electrodepositing the alloy layer on the activated substrate. In some embodiments, the method comprises subjecting the electrodeposited alloy layer to a post deposition treatment process. In additional embodiments, the post deposition treatment process is selected from the group consisting of rinsing, polishing, sanding, heating, annealing, and consolidating. In some examples, the method comprises providing an additional layer on the electrodeposited alloy layer. In other examples, the additional layer is provided using one of vacuum deposition, physical vapor deposition, chemical vapor deposition, plasma deposition, brushing, spin-coating, spray coating, electrodeposition/electroplating, electroless deposition/plating, high velocity oxygen fuel coating, or thermal spraying.

In some configurations, prior to electrodepositing the alloy layer, an intermediate layer of material can be provided between the substrate and the electrodeposited alloy layer. In some examples, the intermediate layer is provided using one of vacuum deposition, physical vapor deposition, chemical vapor deposition, plasma deposition, brushing, spin-coating, spray coating, electrodeposition/electroplating, electroless deposition/plating, high velocity oxygen fuel coating, or thermal spraying. In certain embodiments, the electrodepos-iting uses a soluble anode or uses an insoluble anode. In some instances, the soluble anode comprises nickel or another metal.

In certain examples, the coating layers described herein can be applied to the substrate using suitable methodologies including, but not limited to, vacuum deposition, physical vapor deposition (PVD), chemical vapor deposition (CVD), plasma deposition, brushing, spin-coating, spray coating, electrodeposition/electroplating, electroless deposition/plating, high velocity oxygen fuel (HVOF) coating, thermal spraying or other suitable methods.

In certain examples, one or more of the coating layers may be deposited using vacuum deposition. In certain embodiments, vacuum deposition generally deposits a layer of material atom-by-atom or molecule-by-molecule on a surface of a substrate. Vacuum deposition processes can be used to deposit one or more materials with a thickness from one or more atoms up to a few millimeters.

In certain embodiments, physical vapor deposition (PVD), a type of vacuum deposition, can be used to deposit one or more of the coating layers described herein. PVD generally uses a vapor of the materials to produce a thin coating on the substrate. The coatings described herein may be, for example, sputtered onto a surface of the substrate or applied onto a surface of the substrate using evaporation PVD. In other embodiments, one or more coating layers can be produced on a substrate using chemical vapor deposition (CVD). CVD generally involves exposing the substrate to one or more materials that react and/or decompose on the surface of the substrate to provide a desired coating layer on the substrate. In other configurations, plasma deposition (PD), e.g., plasma enhanced chemical vapor deposition or plasma assisted chemical vapor deposition, can be used to provide a coating layer on a substrate. PD generally involves creating a plasma discharge from reacting gases including the material to be deposited and/or subjecting an already deposited material to ions in a plasma gas to modify the coating layer. In other examples, atomic layer deposition (ALD) can be used to provide a coating layer on a surface. In ALD, a substrate surface is exposed to repeated amounts of precursors that can react with a surface of a material to build up the coating layer.

In other examples, one or more of the coating layers described herein can be deposited into a surface of a substrate using brushing, spin-coating, spray coating, dip coating, electrodeposition (e.g., electroplating, cathodic electrodeposition, anodic electrodeposition, etc.), electroless plating, electrocoating, electrophoretic deposition, or other techniques. Where an electric current is used to deposit a coating layer on a substrate, the current may be continuous, pulsed or combinations of continuous current and pulsed current can be used. Certain electrodeposition techniques are described in more detail below.

In some configurations, one or more layers of the coating may be applied using electrodeposition. In general, electrodeposition uses a voltage applied to the substrate placed in a bath to form the coating on the charged substrate. For example, ionic species present in the bath can be reduced using the applied voltage to deposit the ionic species in a solid form onto a surface (or all surfaces) of the substrate. As noted in more detail below, the ionic species can be deposited to provide a metal coating, a metal alloy coating or combinations thereof. Depending on the exact ionic species used and the electrodeposition conditions and techniques, the resulting properties of the formed, electrodeposited coating may be selected or tuned to provide a desired result.

In certain embodiments where electrodeposition is used, the ionic species may be dissolved or solvated in an aqueous solution or water. The aqueous solution may include suitable dissolved salts, inorganic species or organic species to facilitate electrodeposition of the coating layer(s) on the substrate. In other embodiments where electrodeposition is used, the liquid used in the electrodeposition bath may generally be non-aqueous, e.g., include more than 50% by volume of non-aqueous species, and may include hydrocarbons, alcohols, liquified gases, amines, aromatics and other non-aqueous materials.

In general, the electrodeposition bath includes the species to be deposited as a coating on the substrate. For example, where nickel is deposited onto a substrate, the bath can include ionic nickel or solvated nickel. Where molybdenum is deposited into a substrate, the bath can include ionic molybdenum or solvated molybdenum. Where an alloy is to be deposited on a substrate, the bath can include more than a single species, e.g., the bath may include ionic nickel and ionic molybdenum that are co-electrodeposited to form a nickel-molybdenum alloy as a coating layer on a substrate. The exact form of the materials added to the bath to provide ionic or solvated species can vary. For example, the species may be added to the bath as metal halides, metal fluorides, metal chlorides, metal carbonates, metal hydroxides, metal acetates, metal sulfates, metal nitrates, metal nitrites, metal chromates, metal dichromates, metal permanganates, metal platinates, metal cobalt-nitrites, metal hexachloroplatinates, metal citrates, ammonium salt of the metal, metal cyanides, metal oxides, metal phosphates, metal monobasic sodium phosphates, metal dibasic sodium phosphates, metal tribasic sodium phosphates, sodium salt of the metal, potassium salt of the metal, metal sulfamate, metal nitrite, and combinations thereof. In some examples, a single material that includes both of the metal species to be deposited can be dissolved in the electrodeposition bath, e.g., a metal alloy salt can be dissolved in a suitable solution prior to electrodeposition. The specific materials used in the electrodeposition bath depends on the particular alloy layer to be deposited. Illustrative materials include, but are not limited to, nickel sulfate, nickel sulfamate, nickel chloride, sodium tungstate, tungsten chloride, sodium molybdate, ammonium molybdate, cobalt sulfate, cobalt chloride, chromium sulfate, chromium chloride, chromic acid, stannous sulfate, sodium stannate, hypophosphite, sulfuric acid, nickel carbonate, nickel hydroxide, potassium carbonate, ammonium hydroxide, hydrochloric acid or other materials.

In certain embodiments, the exact amount or concentration of the species to be electrodeposited onto a substrate may vary. For example, the concentration of the species may vary from about 1 gram/Liter to about 400 grams/Liter. If desired, as the ionic species are depleted as a result of formation of the coating on the substrate, additional material can be added to the bath to increase an amount of the species available for electrodeposition. In some instances, the concentration of the species to be deposited may be maintained at a substantially constant level during electrodeposition by continuously adding material to the bath.

In certain embodiments, the pH of the electrodeposition bath may vary depending on the particular ionic species present in the bath. For example, the pH may vary from 1 to about 13, but in certain instances, the pH may be less than 1, or even less than 0, or greater than 13 or even greater than 14. Where metal species are deposited as metal alloys onto a substrate, the pH may range, in certain instances, from 4 to about 12. It will be recognized, however, that the pH may be varied depending on the particular voltage and electrodeposition conditions that are selected for use. Some pH regulators and buffers may be added to the bath. Examples of pH regulators include but not limited to boric acid, hydrochloric acid, sodium hydroxide, potassium hydroxide, ammonium hydroxide, glycine, Sodium acetate, buffered saline, Cacodylate buffer, Citrate buffer, Phosphate buffer, Phosphate-citrate buffer, Barbital buffer, TRIS buffers, Glycine-NaOH buffer, and any combination thereof.

In certain embodiments, alloy plating can use a complexing agent. For example, the main role of complexing agents in an alloy deposition process is making complexations of different metallic ions. Therefore, without a proper complexing agent, simultaneous deposition of nickel and molybdenum and alloy formation will not occur. Examples of complexing agents include but are not limited to phosphates, phosphonates, polycarboxylates, zeolites, citrates, ammonium hydroxide, ammonium salts, citric acid, ethylenediaminetetraacetic acid, diethylene-triaminepentaacetic acid, aminopolycarboxylates, nitrilotriacetic acid, IDS (N-(1,2-dicarboxyethyl)-D,L-aspartic acid (iminodisuccinic acid), DS (polyaspartic acid), EDDS (N,N'-ethylenediaminedisuccinic acid), GLDA (N,N-bis(carboxylmethyl)-L-glutamic acid) and MGDA (methylglycinediacetic acid), hexamine cobalt (III) chloride, ethylene glycol-bis(O-aminoethyl ether)-N,N,N',N'-tetraacetic acid (EGTA), ferrocene, cyclodextrins, choleic acid, polymers, and any combination thereof.

In some examples, a suitable voltage can be applied to cathodes and anodes of the electrodeposition bath to promote formation of the layer(s) described herein on a substrate. In some embodiments, a direct current (DC) voltage can be used. In other examples, an alternating current (AC) optionally in combination with current pulses can be used to electrodeposit the layers. For example, AC electrodeposition can be carried out with an AC voltage waveform, in general sinusoidal, squared, triangular, and so on. High voltages and current densities can be used to favor the tunneling of electrons through an oxide base layer that can form on the substrate. Furthermore, the base layer can conduct in the direction of the cathode, which favors the deposition of the material and avoids its reoxidation during the oxidant half-cycle.

In certain embodiments, illustrative current density ranges that can be used in electrodeposition include, but are not limited to 1 mA/cm$^2$ DC to about 600 mA/cm$^2$ DC, more particularly about 1 mA/cm$^2$ DC to about 300 mA/cm$^2$ DC. In some examples, the current density can vary from 5 mA/cm$^2$ DC to about 300 mA/cm$^2$ DC, from 20 mA/cm$^2$ DC to about 100 mA/cm$^2$ DC, from 100 mA/cm$^2$ DC to about 400 mA/cm$^2$ DC or any value falling within these illustrative ranges. The exact time that the current is applied may vary from about 10 seconds to a few days, more particularly about 40 seconds to about 2 hours. A pulse current can also be applied instead of a DC current if desired.

In some examples, the electrodeposition may use pulse current or pulse reverse current is during the electrodeposition of the alloy layer. In pulse electrodeposition (PED), the potential or current is alternated swiftly between two different values. This results in a series of pulses of equal amplitude, duration and polarity, separated by zero current. Each pulse consists of an ON-time (TON) during which potential and/or current is applied, and an OFF-time (TOFF) during which zero current is applied. It is possible to control the deposited film composition and thickness in an atomic order by regulating the pulse amplitude and width. They favor the initiation of grain nuclei and greatly increase the number of grains per unit area resulting in finer grained deposit with better properties than conventionally plated coatings.

In examples where the coating includes two or more layers, the first layer and the second layer of the coating may be applied using the same or different electrodeposition baths. For example, a first layer can be applied using a first aqueous solution in an electrodeposition bath. After application of a voltage for a sufficient period to deposit the first layer, the voltage may be reduced to zero, the first solution can be removed from the bath and a second aqueous solution comprising a different material can be added to the bath. A voltage can then be reapplied to electrodeposit a second layer. In other instances, two separate baths can be used, e.g., a reel-to-reel process can be used, where the first bath is used to electrodeposit the first layer and a second, different bath is used to deposit the second layer.

In some cases, individual articles may be connected such that they can be sequentially exposed to separate electrodeposition baths, for example in a reel-to-reel process. For instance, articles may be connected to a common conductive substrate (e.g., a strip). In some embodiments, each of the electrodeposition baths may be associated with separate anodes and the interconnected individual articles may be commonly connected to a cathode.

While the exact material used in electroplating methods may vary, illustrative materials include cations of one or more of the following metals: nickel, molybdenum, copper, aluminum, cobalt, tungsten, gold, platinum, palladium, silver, or combinations thereof. The exact anion form of these metals may vary from chlorides, acetates, sulfates, nitrates, nitrites, chromates, dichromates, permanganates, platinates, cobalt nitrites, hexachloroplatinates, citrates, cyanides, oxides, phosphates, monobasic sodium phosphates, dibasic sodium phosphates, tribasic sodium phosphates and combinations thereof.

In other instances, the electrodeposition process can be designed to apply an alloy layer including molybdenum and one or more of nickel, tungsten, cobalt, chromium, tin, phosphorous, iron, magnesium and boron or at least one compound comprising one or more of nickel, tungsten, cobalt, chromium, tin, phosphorous, iron, magnesium or boron. In some embodiments, the resulting alloy layer may be free of precious metals.

In some embodiments, there may be no intervening or intermediate layers between the coating layer 110 and the substrate 105. For example, the coating layer 110 can be deposited directly onto the substrate surface 105 without any intervening layer between them. In other instances, an intermediate layer may be present between the coating layer 110 and the surface 106 of the substrate 105. The intermediate layer can be formed using the same methods used to form the coating layer 110 or different methods used to form the coating layer 110. In some embodiments, an intermediate layer can include one or more of copper, a copper alloy, nickel, a nickel alloy, a nickel-phosphorous alloy, a nickel-phosphorous alloy including hard particles or other compounds such as phosphorous, boron, boron nitride, silicon carbide, aluminum oxide, molybdenum disulfide, hard particles with a hardness of HV>1000, hard particles with size less 500 nm, highly conductive particles, carbon nanotubes and or carbon nano-particles. In other instances, the intermediate layer can include an alloy of nickel that is less magnetic than nickel alone. In some instances, the intermediate layer may be substantially less than the coating layer 110 and can be used to enhance adhesion of the coating layer 110 to the substrate 105. For example, the intermediate layer can be 90%, 80%, 70%, 60%, 50%, 40%, 30%, 20% or 10% less thick than a thickness of the coating layer 110. In certain embodiments, the layer between the substrate and the alloy layer may be a "nickel strike" layer as is commonly known in the electroplating arts.

In some embodiments, one or more of the materials of a coating layer can be provided using a soluble anode. The soluble anode can dissolve in the electrodeposition bath to provide the species to be deposited. In some embodiments, the soluble anode may take the form of a disk, a rod, a sphere, strips of materials or other forms. The soluble anode can be present in a carrier or basket coupled to a power source.

In some embodiments, one or more of the coating layers described herein may be deposited using an anodization process. Anodization generally uses the substrate as the anode of an electrolytic cell. Anodizing can change the microscopic texture of the surface and the resulting metal coating near the surface. For example, thick coatings are often porous and can be sealed to enhance corrosion resistance. Anodization can result in harder and more corrosion resistant surfaces. In some examples, one of the coating layers of the articles described herein can be produced using an anodization process and another coating layer may be produced using a non-anodization process. In other instances, each coating layer in the article can be produced using an anodization process. The exact materials and process conditions using anodization may vary. Generally, the anodized layer is grown on a surface of the substrate by applying a direct current through an electrolyte solution including the material to be deposited. The material to be deposited can include magnesium, niobium, tantalum, zinc, nickel, molybdenum, copper, aluminum, cobalt, tungsten, gold, platinum, palladium, silver, or alloys or combinations thereof. Anodization is typically performed under acidic conditions and may include chromic acid, sulfuric acid, phosphoric acid, organic acids or other acids.

In certain embodiments, the coatings described herein may be applied in the presence of other additive or agents. For example, wetting agents, leveling agents, brighteners, defoaming agents and/or emulsifiers can be present in aqueous solutions that include the materials to be deposited onto the substrate surface. Illustrative additive and agents include, but are not limited to, thiourea, domiphen bromide, acetone, ethanol, cadmium ion, chloride ion, stearic acid, ethylenediamine dihydrochloride (EDA), saccharin, cetyltrimethylammonium bromide (CTAB), sodium dodecyl sulfate, sodium lauryl sulfate (SLS), saccharine, naphthalene sulfonic acid, benzene sulfonic acid, coumarin, ethyl vanillin, ammonia, ethylene diamine, polyethylene glycol (PEG), bis(3-sulfopropyl)disulfide (SPS), Janus green B (JGB), azobenzene-based surfactant (AZTAB), the polyoxyethylene family of surface active agents, sodium citrate, perfluorinated alkylsulfate, additive K, calcium chloride, ammonium chloride, potassium chloride, boric acid, myristic acid, choline chloride, citric acid, any redox active surfactant, any conductive ionic liquids, polyglycol ethers, polyglycol alcohols, sulfonated oleic acid derivatives, sulfate form of primary alcohols, alkylsulfonates, alkylsulfates, aralkylsulfonates, sulfates, Perfluoro-alkylsulfonates, acid alkyl and aralkyl-phosphoric acid esters, alkylpolyglycol ether, alkylpolyglycol phosphoric acid esters or their salts, N-containing and optionally substituted and/or quaternized polymers, such as polyethylene imine and its derivatives, polyglycine, poly(allylamine), polyaniline (sulfonated), polyvinylpyrrolidone, gelatin, polyvinylpyridine, polyvinylimidazole, polyurea, polyacrylamide, poly(melamine-coformaldehyde), polyalkanolamines, polyaminoamide and derivatives thereof, polyalkanolamine and derivatives thereof, polyethylene imine and derivatives thereof, quaternized polyethylene imine, poly(allylamine), polyaniline, polyurea, polyacrylamide, poly(melamine-co-formaldehyde), hydroxy-ethyl-ethylene-diamine triacetic acid, 2 Butyne 1 4 diol, 2 2 azobis(2-methyl propionitrite), perfluoroammonoic acid, dextrose, cetyl methyl ammonium bromide, 1 hexadecyl pyridinium-chloride, d-mannitol, glycine, Rochelle salt, N N'-diphenylbenzidine, glycolic acid, tetramethyl-ammonium hydroxide, reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline, one or more of fats, oils, long chained alcohols, or glycols, polyethylene glycols, polyethylene oxides such as Tritons, alkylphosphates, metal soaps, special silicone defoamers, commercial perfluoroalkyl-modified hydrocarbon defoamers and perfluoroalkyl-substituted silicones, fully fluorinated alkylphosphonates, perfluoroalkyl-substituted phosphoric acid esters, cationic-based agents, amphoteric-based agents, and nonionic-based agent; chelating agents such as citrates, acetates, gluconates, and ethylenediamine tetra-acetic acid (EDTA), or any combination thereof.

In embodiments where electroless plating is used, metal coatings can be produced on a substrate by autocatalytic chemical reduction of metal cations in a bath. In contrast to electrodeposition/electroplating, no external electric current is applied to the substrate in electroless plating. While not wishing to be bound by any particular configuration or example, electroless plating can provide more even layers of the material on the substrate compared to electroplating. Further, electroless plating may be used to add coatings onto non-conductive substrates.

In certain embodiments where electroless plating is used, the substrate itself may act as a catalyst to reduce an ionic metal and form a coating of the metal on the surface of the substrate. Where it is desirable to produce a metal alloy coating, the substrate may act to reduce two or more different ionic metals with the use of a complexing agent to form a metal alloy including the two different metals. In some examples, the substrate itself may not function as a catalyst but a catalytic material can be added to the substrate to promote formation of the metal coating on the substrate. Illustrative catalytic materials that can be added to a substrate include, but are not limited to, palladium, gold, silver, titanium, copper, tin, niobium, and any combination thereof.

While the exact material used in electroless plating methods may vary, illustrative materials include one or more of the following cations: magnesium, niobium, tantalum, zinc, nickel, molybdenum, copper, aluminum, cobalt, tungsten, gold, platinum, palladium, silver, or alloys or combinations thereof. For example, any one or more of these cations can be added as a suitable salt to an aqueous solution. Illustrative suitable salts include, but are not limited to, metal halides, metal fluorides, metal chlorides, metal carbonates, metal hydroxides, metal acetates, metal sulfates, metal nitrates, metal nitrites, metal chromates, metal dichromates, metal permanganates, metal platinates, metal cobalt nitrites, metal hexachloroplatinates, metal citrates, metal cyanides, metal oxides, metal phosphates, metal monobasic sodium phosphates, metal dibasic sodium phosphates, metal tribasic sodium phosphates and combinations thereof.

In certain embodiments, the substrates described herein may be subjected to pre-coating processing steps to prepare the substrate to receive a coating. These processing steps can include, for example, cleaning, electro-cleaning (anodic or cathodic), polishing, electro-polishing, pre-plating, thermal treatments, abrasive treatments and chemical treatments. For example, the substrates can be cleaned with an acid, a base, water, a salt solution, an organic solution, an organic solvent or other liquids or gases. The substrates can be polished using water, an acid or a base, e.g., sulfuric acid, phosphoric acid, etc. or other materials optionally in the presence of an electric current. The substrates may be exposed to one or more gases prior to application of the coating layers to facilitate removal of oxygen or other gases from a surface of the substrate. The substrate may be washed or exposed to an oil or hydrocarbon fluid prior to application of the coating to remove any aqueous solutions or materials from the surface. The substrate may be heated or dried in an oven to remove any liquids from the surface prior to application of the coating. Other steps for treating the substrate prior to application of a coating may also be used.

In some embodiments, the coatings layers described herein can be subjected to sealing. While the exact conditions and materials uses to seal the coatings can vary, sealing can reduce the porosity of the coatings and increase their hardness. In some embodiments, sealing may be performed by subjecting the coating to steam, organic additives, metals, metal salts, metal alloys, metal alloy salts, or other materials. The sealing may be performed at temperatures above room temperature, e.g., 30 degrees Celsius, 50 degrees Celsius, 90 degrees Celsius or higher, at room temperature or below room temperature, e.g., 20 degrees Celsius or less. In some examples, the substrate and coating layer may be heated to remove any hydrogen or other gases in the coating layer. For example, the substrate and coating can be baked to remove hydrogen from the article within 1-2 hours post-coating.

It will be recognized by the person of ordinary skill in the art that combinations of post-deposition processing methods can be used. For example, the coating layer may be sealed and then polished to reduce surface roughness.

In certain configurations, an electrodeposition process can include cleaning a substrate to receive a coating. The substrate can then be rinsed. The substrate can then be subjected to acid treatment. The acid treated substrate is then rinsed. The rinsed substrate is then added to a plating tank. The plated substrate can optionally be rinsed. The substrate with the coated surface can then be subjected to post-plating processes. Each of these steps are discussed in more detail below. An optional strike step to provide a nickel layer (or a layer of another material) on the surface of the substrate can be performed if desired.

In certain embodiments, the cleaning step can be performed in the presence or absence of an electric current. Cleaning is typically performed in the presence of one or more salts and/or a detergent or surfactant and may be performed at an acidic pH or a basic pH. Cleaning is generally performed to remove any oils, hydrocarbons or other materials from the surface of the substrate.

After the substrate is cleaned, the substrate is rinsed to remove any cleaning agents. The rinsing is typically performed in distilled water but may be performed using one or more buffers or at an acidic pH or a basic pH. Rinsing may be performed once or numerous times. The substrate is typically kept wet between the various steps to minimize oxide formation on the surface. A water break test can be performed to verify the surface is clean and/or free of any oils.

After rinsing, the substrate can be immersed in an acid bath to activate the surface for electrodeposition, e.g., to pickle the surface. The exact acid used is not critical. The pH of the acidic treatment may be 0-7 or even less than 0 if desired. The time the substrate remains in the acid bath may vary, for example, from 10 seconds to about 10 minutes. The acidic solution can be agitated or pumped over the substrate surface if desired, or the substrate may be moved within the acidic tank during the pickling process.

After the pickling process, the surface can be rinsed to remove any acid. The rinsing may be performed by immersing the pickled substrate into a rinse bath, by flowing rinse agent over the surface or both. Rinsing can be performed multiple times or a single time as desired.

After pickling, the substrate can optionally be subjected to a strike. Without wishing to be bound by any one configuration, a strike applies a thin layer of material to a substrate that is typically inert or less reactive with the material to be deposited. Examples of inert substrates include, but are not limited to, stainless steels, titanium, certain metal alloys and other materials. In the strike process, a thin layer of material, e.g., up to a few microns thick, is applied using electrodeposition.

The rinsed, pickled substrate, or a rinsed substrate with the strike layer, can then be subjected to an electrodeposition process as noted above to apply a layer of material to the substrate surface. As noted herein, electrodeposition can be performed using AC voltages or DC voltages and various waveforms. The exact current density used can vary to favor or disfavor a particular amount of the elements that end up in the resulting coating. For example, where an alloy layer includes two metals, the current density can be selected so one metal is present in a higher amount than the other metal in the resulting alloy layer. The pH of the electrodeposition bath may also vary depending on the particular species that are intended to be present in the surface coating. For example, an acidic bath (pH=3-5.5), a neutral pH bath, or a basic pH bath (pH 9-12) may be used depending on the materials present in the electrodeposition bath and in the anode. The exact temperature used during the electrodeposition process may vary from room temperature (about 25 deg. Celsius) up to about 85 degrees Celsius. The temperature is desirably less than 100 deg. Celsius so water in the electrodeposition bath does not evaporate to a substantial degree. The electrodeposition bath can include the materials to be deposited along with optional agents including brighteners, levelers, particles, etc. as noted herein.

In some embodiments, the electrodeposition bath can include a brightener. A variety of organic compounds are used as brighteners in to provide a bright, level, and ductile nickel deposit. Brighteners can generally be divided into two classes. Class I, or primary, brighteners include compounds such as aromatic or unsaturated aliphatic sulfonic acids, sulfonamides, sulfonimides, and sulfimides. Class I brighteners can be used in relatively high concentrations and produce a hazy or cloudy deposit on the metal substrate. Decomposition of Class I brighteners during the electroplating process can cause sulfur to be incorporated into the deposit, which reduces the tensile stress of the deposit. Class II, or secondary, brighteners are used in combination with Class I brighteners to produce a fully bright and leveled deposit. Class II brighteners are generally unsaturated organic compounds. A variety of organic compounds containing unsaturated functional groups such as alcohol, diol, triol, aldehydic, olefinic, acetylinic, nitrile, and pyridine groups can be used as Class II brighteners. Typically, Class II brighteners are derived from acetylinic or ethylenic alcohols, ethoxylated acetylenic alcohols, coumarins and pyridine based compounds. Mixtures of such unsaturated compounds with mixtures of Class I brighteners can be combined to obtain maximum brightness or ductility for a given rate of leveling. A variety of amine compounds can also be used as brightening or leveling agents. Acyclic amines can be used as Class II brighteners. Acetylenic amines can be used in combination with acetylenic compounds to improve leveling and low current density coverage.

In certain embodiments, the resulting amount of metals present in the alloy layer can vary. For example, in one electrodeposition process where two metals are present in the surface coating, one of the metals, e.g., molybdenum, may be present up to about 35 weight percent based on a weight of the surface coating. In other embodiments, one of the metals, e.g., molybdenum, may be present up to about 20 weight percent based on a weight of the surface coating. In some examples, one of the metals, e.g., molybdenum, may be present up to about 16 weight percent based on a weight of the surface coating. In some examples, one of the metals, e.g., molybdenum, may be present up to about 10 weight percent based on a weight of the surface coating. In some examples, one of the metals, e.g., molybdenum, may be present up to about 6 weight percent based on a weight of the surface coating.

In certain configurations, the substrate with the surface coating can then be rinsed or can be subjected to another deposition process to apply a second layer onto the formed first layer. The second deposition process can be, for example, vacuum deposition, physical vapor deposition (PVD), chemical vapor deposition (CVD), plasma deposition, brushing, spin-coating, spray coating, electrodeposition/electroplating, electroless deposition/plating, high velocity oxygen fuel (HVOF) coating, thermal spraying or other suitable methods. In some instances, a second electrodeposition step can be used to apply a second layer on top of the formed first layer. For example, the second layer can be an electrodeposited layer including one, two, three or more metal or other materials. If desired, additional layer can be formed on the second layer using electrodeposition or any of the other processes mentioned herein.

In other configurations, a layer of material can be deposited on a cleaned or pickled substrate prior to forming a layer using an electrodeposition process. For example, one or more layers can first be formed on a substrate using vacuum deposition, physical vapor deposition (PVD), chemical vapor deposition (CVD), plasma deposition, brushing, spin-coating, spray coating, electrodeposition/electroplating, electroless deposition/plating, high velocity oxygen fuel (HVOF) coating, thermal spraying or other suitable methods. A second layer can be formed on the first layer using an electrodeposition process as noted herein. If desired, the first formed layer can be activated by a pickling process prior to electrodeposition of the second layer on the first layer.

In instances where a single layer is formed on a substrate by electrodeposition, the substrate with the coated surface can then be subjected to one or more post-processing steps including, for example, rinsing, polishing, sanding, heating, annealing, consolidating, etching or other steps to either clean the coated surface or alter the physical or chemical properties of the coated surface. If desired, some portion of the coating can be removed using an acidic solution or a basic solution depending on the materials present in the coating.

In certain embodiments, a method of producing an alloy layer on a substrate comprises forming a coated surface on the substrate by electrodepositing an alloy layer on the surface of the substrate. The electrodeposited alloy layer comprises (i) molybdenum and (ii) at least one element selected from the group consisting of nickel, tungsten, cobalt, chromium, tin, phosphorous, iron, magnesium and boron or at least one compound comprising one or more of nickel, tungsten, cobalt, chromium, tin, phosphorous, iron, magnesium or boron. In some examples, the method comprises, prior to electrodepositing the alloy layer, cleaning the substrate, rinsing the cleaned substrate, activating a surface of the cleaned substrate to provide an activated substrate, rinsing the activated substrate, and electrodepositing the alloy layer on the activated substrate. In some embodiments, the method comprises subjecting the electrodeposited alloy layer to a post deposition treatment process. In additional embodiments, the post deposition treatment process is selected from the group consisting of rinsing, polishing, sanding, heating, annealing, and consolidating. In some examples, the method comprises providing an additional layer on the electrodeposited alloy layer. In other examples, the additional layer is provided using one of vacuum deposition, physical vapor deposition, chemical vapor deposition, plasma deposition, brushing, spin-coating, spray coating, electrodeposition/electroplating, electroless deposition/plating, high velocity oxygen fuel coating, or thermal spraying.

In some configurations, prior to electrodepositing the alloy layer, an intermediate layer of material can be provided between the substrate and the electrodeposited alloy layer. In some examples, the intermediate layer is provided using one of vacuum deposition, physical vapor deposition, chemical vapor deposition, plasma deposition, brushing, spin-coating, spray coating, electrodeposition/electroplating, electroless deposition/plating, high velocity oxygen fuel coating, or thermal spraying. In certain embodiments, the electrodepositing uses a soluble anode or uses an insoluble anode. In some instances, the soluble anode comprises nickel or another metal.

Figure 13:
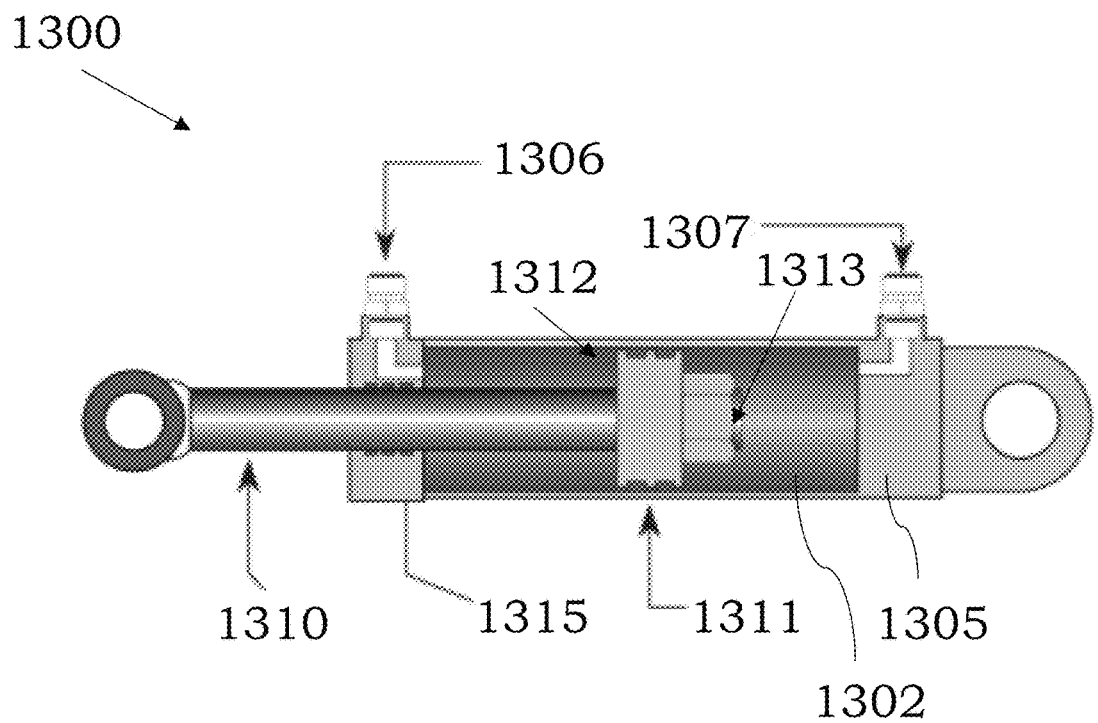
FIG. 13 is an illustration of a hydraulic cylinder.

In certain embodiments, the components described herein may be present as a component of a hydraulic cylinder. While the exact configuration of a hydraulic cylinder will vary, one illustration is shown in FIG. 13. The hydraulic cylinder 1300 includes a piston member or rod 1310 that moves into and out of a housing 1305. A seal 1315 is present on an end of the housing 1305 and acts to retain a hydraulic fluid 1302 within the housing 1305. A seal is present at an end 1311 of the piston rod 1310. The housing 1305 includes a retract port 1306 and an extend port 1307. Fluid pressure can be exerted on a surface 1313 of an end 1311 of the piston rod 1310 by introducing a hydraulic fluid into the extend port 1307. This acts to extend the piston rod 1310 and move it out of the housing 1305. To retract the piston rod 1305, a fluid pressure can be exerted on a surface 1313 to cause the rod 1310 to move inward. Depending on the particular pressures used, the piston rod 1310 can move into and out of the housing 1305 as desired to provide force on a component connected to the cylinder 1300. The ports 1306, 1307 are typically coupled to a hydraulic pump (not shown) and a hydraulic fluid reservoir to pump hydraulic fluid into and/or out of the housing 1305 of the cylinder 1300. In some instances, an exposed surface of the rod 1310 can include a surface coating as described in reference to FIGS. 1-12. In other examples, a surface of the piston rod 1310 that contacts the hydraulic fluid can include a surface coating as described in reference to FIGS. 1-12. Internal and/or external surfaces of the housing 1305 can also include a surface coating as described in reference to FIGS. 1-12.

Figure 14:
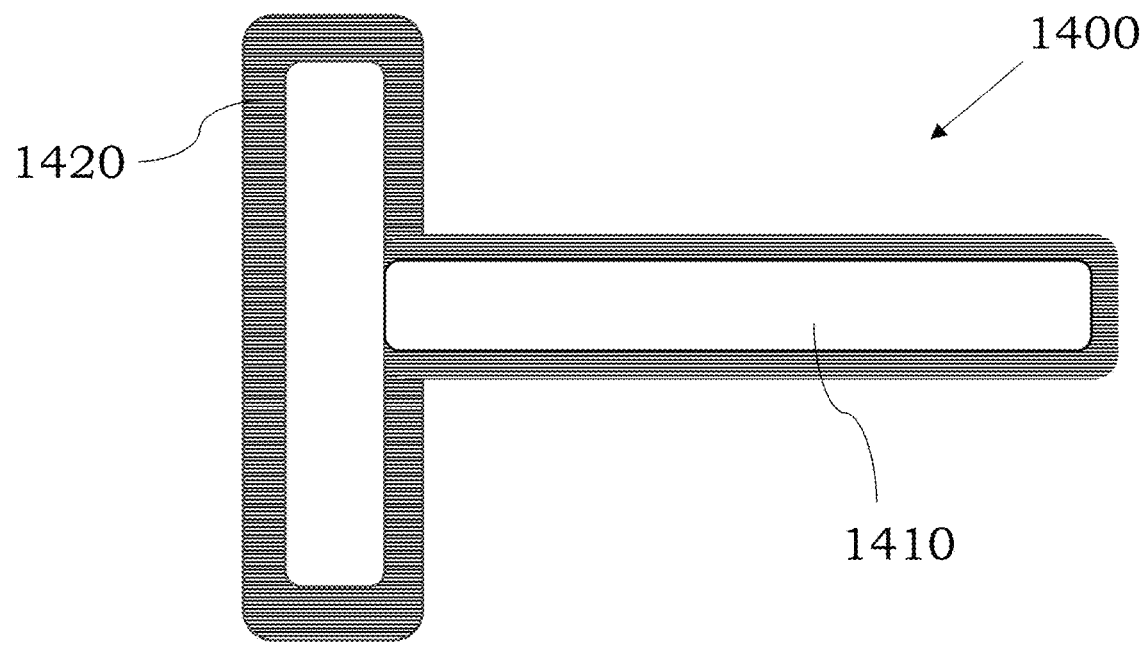
FIG. 14 is an illustration of a piston member.

In certain embodiments, the moveable components described herein can be configured as a piston with a metal alloy coating that can function separate from, or within, a stationary component. The piston may be present alone or used with a housing as noted in connection with FIG. 14. A piston 1400 is shown that comprises a body or piston member 1410 and a coating 1420 on an external surface of the piston member 1510. For example, the coating 1520 on the piston member 1410 may be any one or more of those coatings or layers described and shown in connection with FIGS. 1-12.

Figure 15:
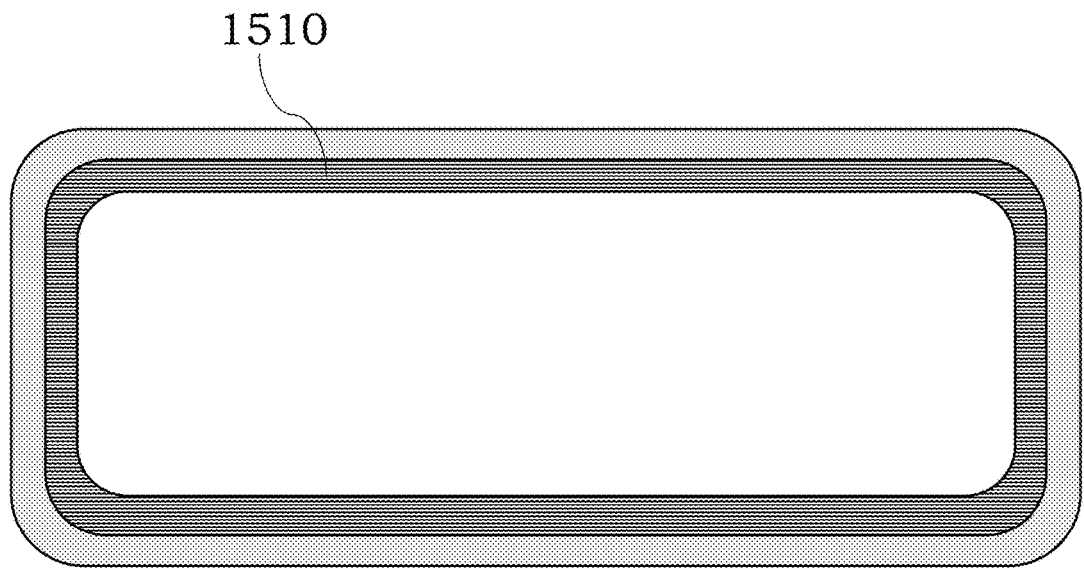
FIG. 15 is an illustration of a housing.

In certain configurations, a housing of a hydraulic device can include one or more coatings on a surface. For example and referring to FIG. 15, a housing 1500 is shown that comprises a coating 1510 on an inner surface of the housing 1500. For example, the coating 1510 on the housing 1500 may be any one or more of those coatings or layers described and shown in connection with FIGS. 1-12. The coating 1510 can be present on substantially all inner surfaces of the housing 1500 or may only be present on select inner surfaces of the housing 1500. Further, different coatings can be present on different inner surface areas of the housing 1500 if desired. Alternatively, the coating on different inner surfaces of the housing 1500 may be the same, e.g., have the same composition, but can be present at different thicknesses at different inner surface areas. In some examples, the coating 1510 could instead be present on external surfaces of the housing or both internal and external surfaces of the housing.

Figure 16:
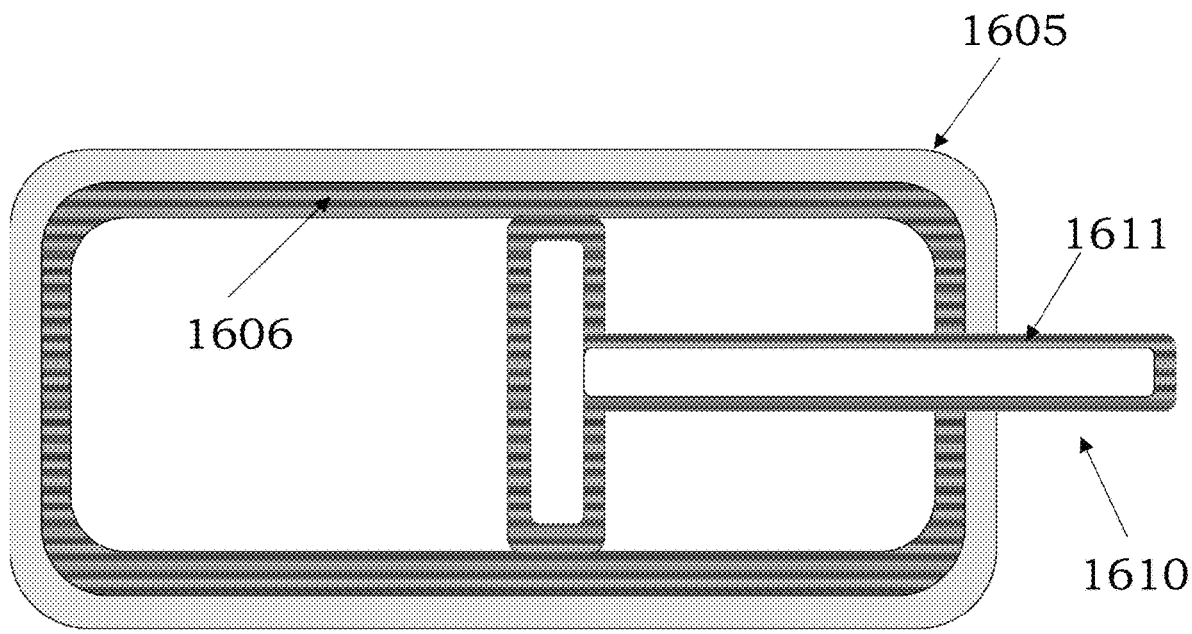
FIG. 16 is an illustration of a moveable component within a stationary component.

In certain configurations, the piston and housing of the hydraulic devices described herein can include a coating, which can be the same or can be different. Referring to FIG. 16, a hydraulic device 1600 is shown that includes a piston member 1610 and a housing 1605. The piston member 1610 includes a coating 1611, and the housing 1605 includes a coating 1606. The coatings 1606, 1611 can be the same or can be different. For example, the coatings 1606, 1611 may independently be any one or more of those coatings or layers described and shown in connection with FIGS. 1-12. Alternatively, the coatings 1606, 1611 may be the same, e.g., have the same composition, but can be present at different thicknesses or have different amounts of materials in each of the coatings.

Figure 17:
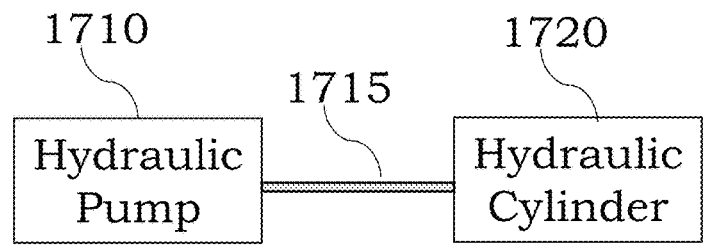
FIG. 17 is a block diagram showing a hydraulic pump fluidically coupled to a hydraulic cylinder.

In certain embodiments, the hydraulic devices described herein typically are used with a hydraulic pump and optionally one or more valves that is fluidically coupled to the hydraulic device. Referring to FIG. 17, a pump 1710 is shown as being fluidically coupled to a cylinder 1720 through a fluid line 1715. If desired, the pump 1710 and/or fluid line 1720 can also include a coating as described herein. For example, the coating on the pump 1710, the fluid line 1715 and the cylinder 1720 may independently be any one or more of those coatings or layers described and shown in connection with FIGS. 1-12. Where the cylinder 1720 is present in a hydraulic device, the pump 1710 pumps hydraulic fluid through the fluid line 1715 and into the cylinder 1720 (or other device) to cause movement of the cylinder 1720. This movement in turn exerts a force on a device coupled to the hydraulic cylinder to cause movement of the coupled device. The pump can release the pressure by stopping the pumping to permit movement of the hydraulic cylinder back to an initial position or can pump fluid out of the hydraulic cylinder through a different port to permit movement of the hydraulic cylinder back to an initial position. In some embodiments, the coating present in the pump 1710 and/or fluid line 1715 may include an alloy layer as described in reference to FIGS. 1-12.

Figure 18:
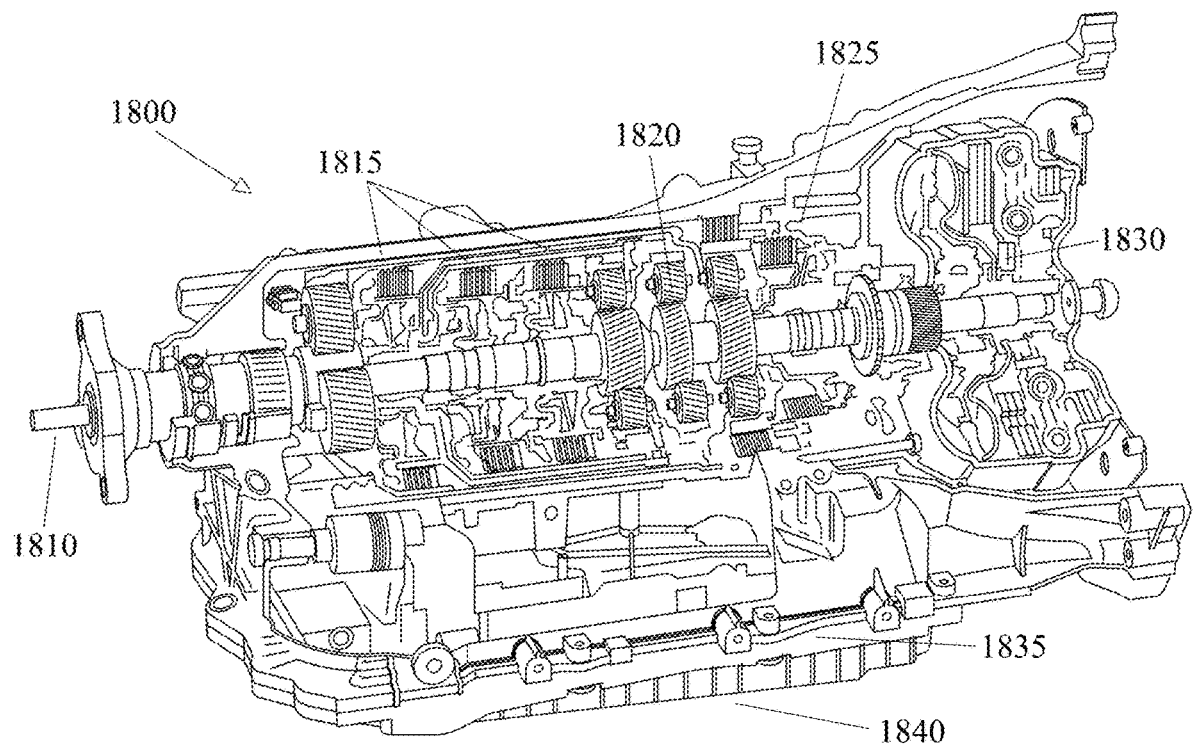
FIG. 18 is an illustration showing a transmission.

In certain embodiments, a vehicle transmission can include a coating on surfaces of one or more transmission components. Illustrative transmission components include, but are not limited to, a clutch pack, a gear, a valve body, a transmission fluid pan, an output shaft, a pump, a torque converter or other components of the transmission. An illustration is shown in FIG. 18, where a transmission 1800 includes an output shaft 1810, clutch packs 1805, a planetary gear set 1820, a brake band 1825, a torque converter 1830, a transmission fluid pump 1835, a valve body 1840 and a transmission fluid pan 1845. The coating on any one or more of the components of the transmission may include a metal or metal alloy such as those layers described in reference to FIGS. 1-12. For example, one or more surfaces of a transmission component that contacts the transmission fluid may include a metal alloy coating. An external surface of the transmission 1800 can also include a surface coating if desired. In some embodiments, the coating present on a surface of a component of the transmission 1800 may include any of those materials described in reference to FIGS. 1-12.

Figure 19:
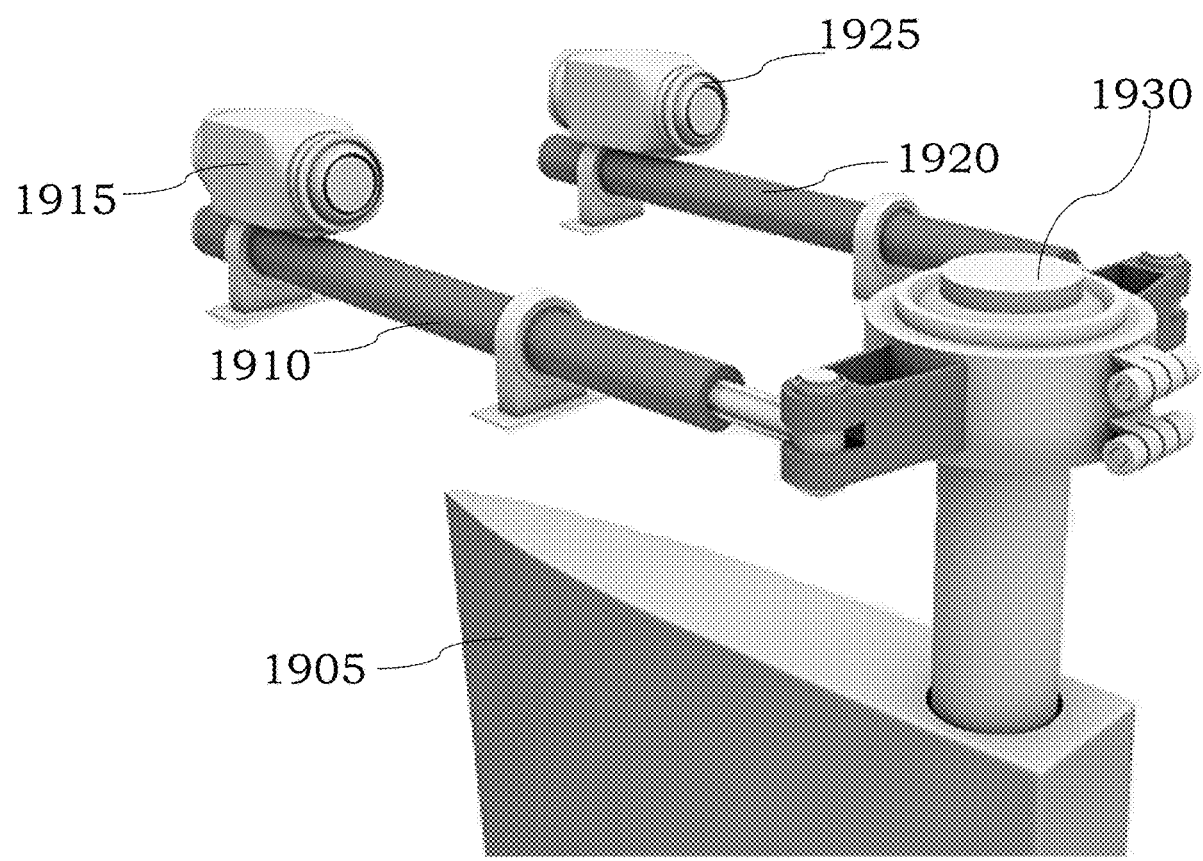
FIG. 19 is an illustration showing certain steering linkages.

In certain embodiments, the hydraulic cylinders described herein can be used in steering gear to move components of a vehicle. For example, the steering gear can include a coating that may be any one or more of those coatings or layers described and shown in connection with FIGS. 1-12. Without wishing to be bound by any one configuration, the hydraulic devices can be used to move components of a vehicle to cause steering or movement of the vehicle components. Illustrative vehicles include, but are not limited to, cranes, trucks, cars, tanks, ships, submarines, airplanes, spacecraft or other vehicles that include an engine, motor or some means of propulsion or power. For example, hydraulic devices are often used in airplanes and jet planes to adjust wings, retract and extend landing gear, open/close doors, brakes, steering, etc. The operating pressure can vary, e.g., from 200 psi to 5,000 psi, depending on the hydraulic system. Hydraulics have many advantages like the cost-effective, easy to maintain, efficient working under all condition. An illustration is shown in FIG. 19, where hydraulic devices 1910, 1920 are shown as being coupled to a ship rudder 1000 used to steer the ship. The hydraulic device 1910 is also fluidically coupled to a hydraulic pump 1915, and the hydraulic device 1920 is fluidically coupled to a hydraulic pump 1925. To turn the ship in one direction, the hydraulic device 1910 can pull on the rudder 1905 and the hydraulic device 1920 can push on the rudder 1905 through the linkage 1930. To turn the ship in the other direction, the hydraulic device 1910 can push on the rudder 1905 and the hydraulic device 1920 can pull on the rudder 1905 through the linkage 1930. In some embodiments, the coating present on one or components used in steering gear may include an alloy layer as described in reference to FIGS. 1-12.

Figure 20A:
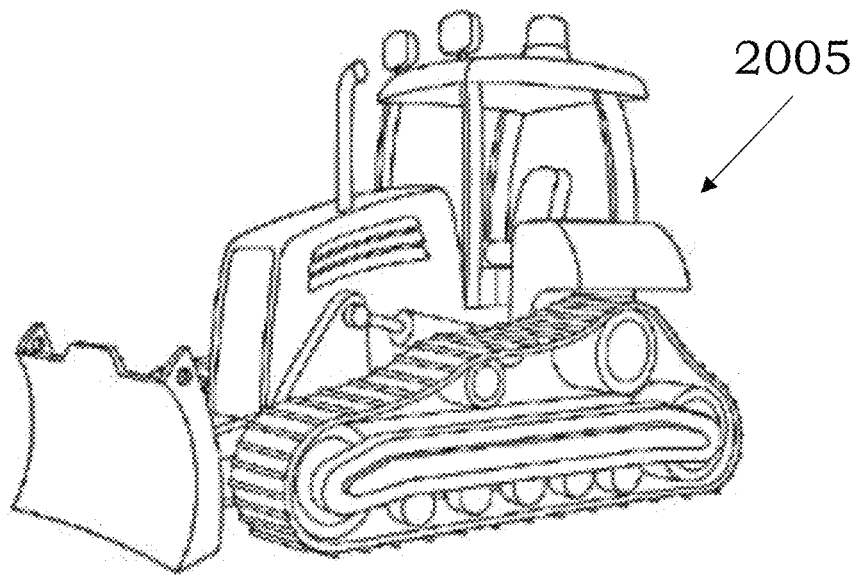
FIG. 20A, FIG. 20B, FIG. 20C, FIG. 20D, FIG. 20E, FIG. 20F, FIG. 20G, FIG. 20H, and FIG. 20I are illustrations showing devices that include a hydraulic device.
Figure 20B:
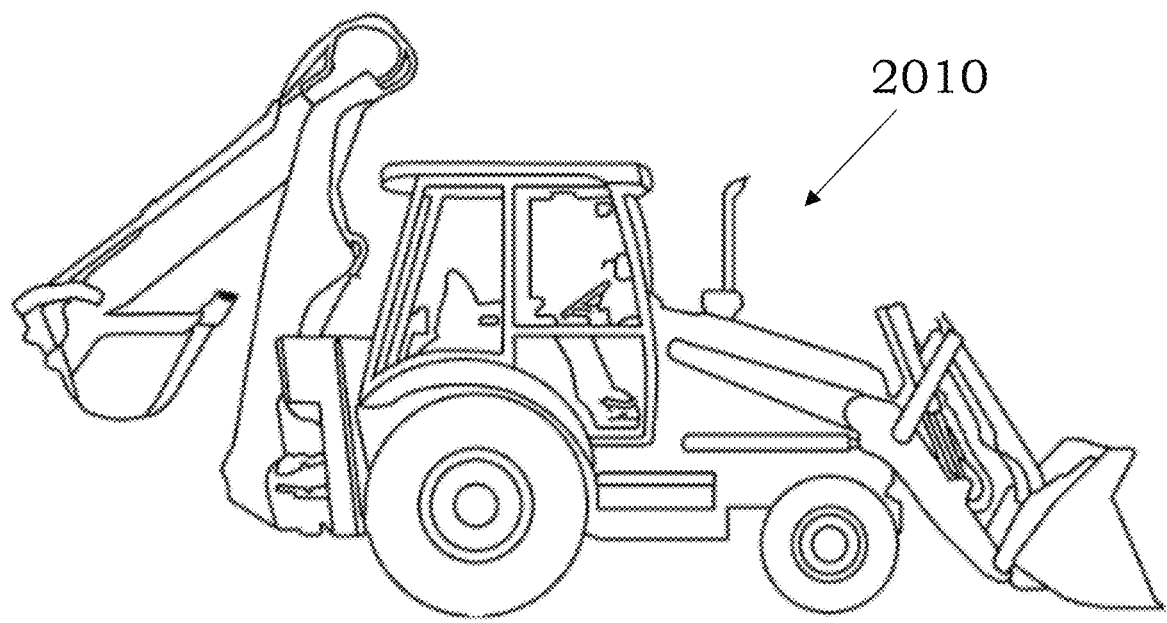
Figure 20C:
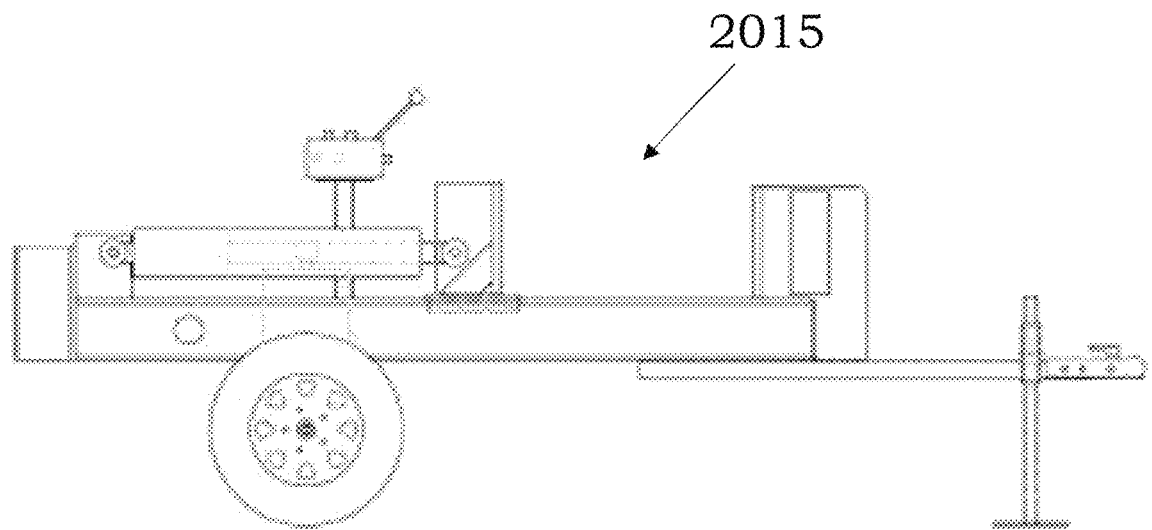
Figure 20D:
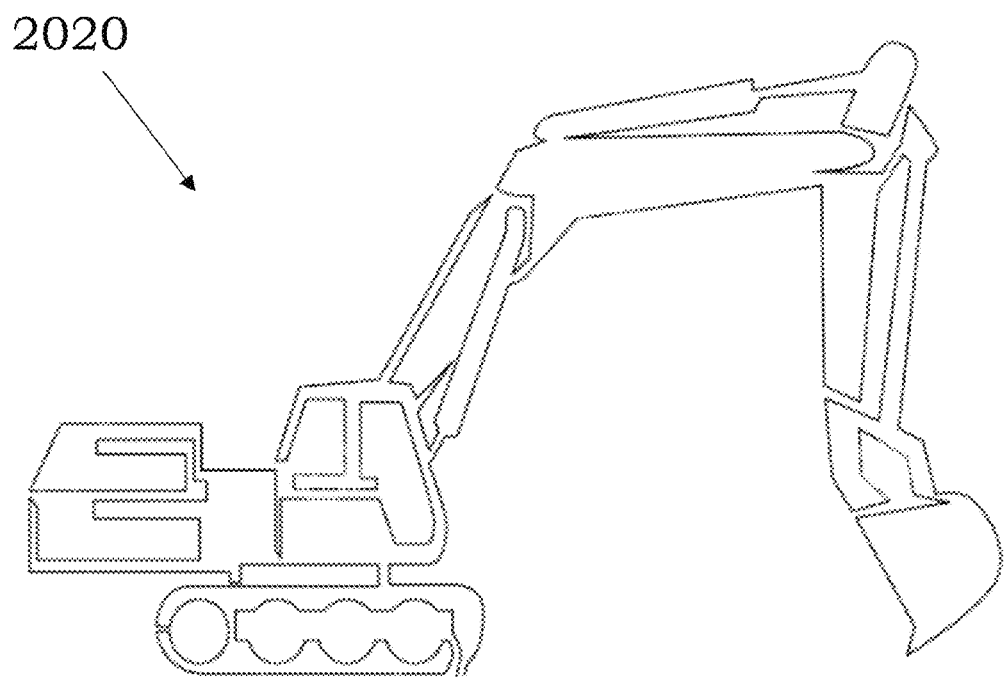
Figure 20E:
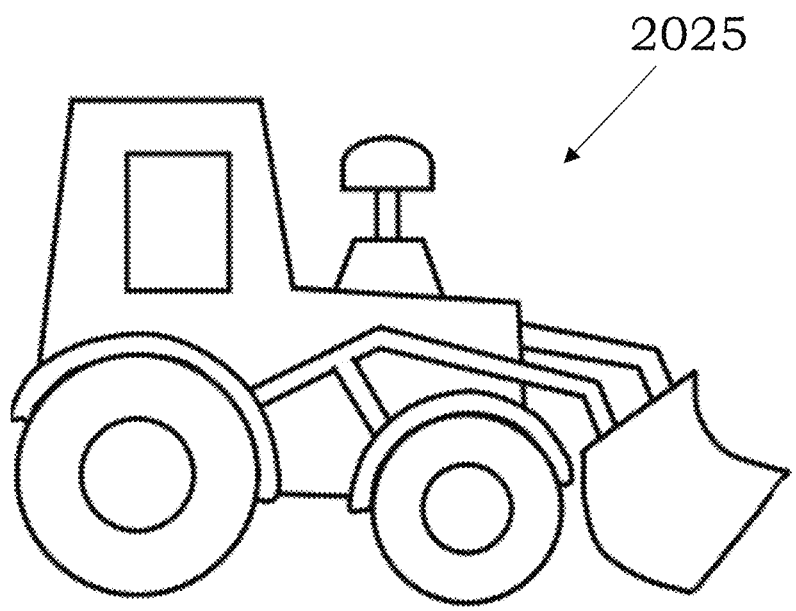
Figure 20F:
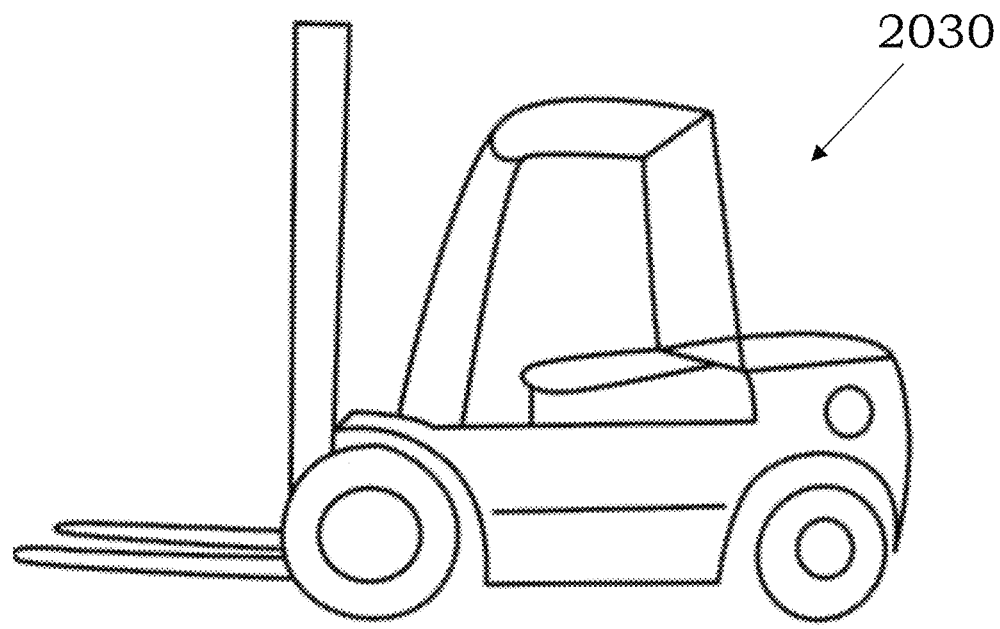
Figure 20G:
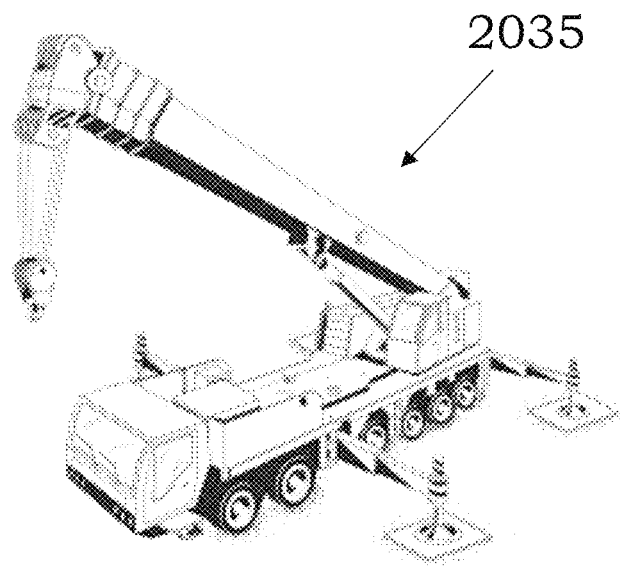
Figure 20H:
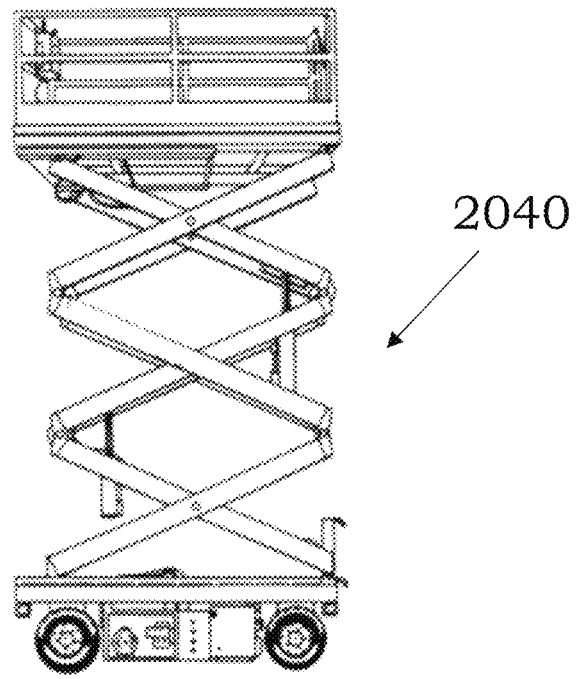
Figure 20I:
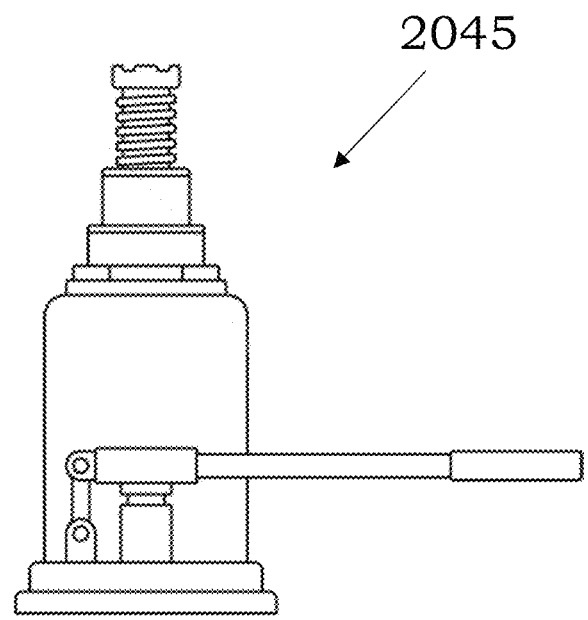
Figure 21:
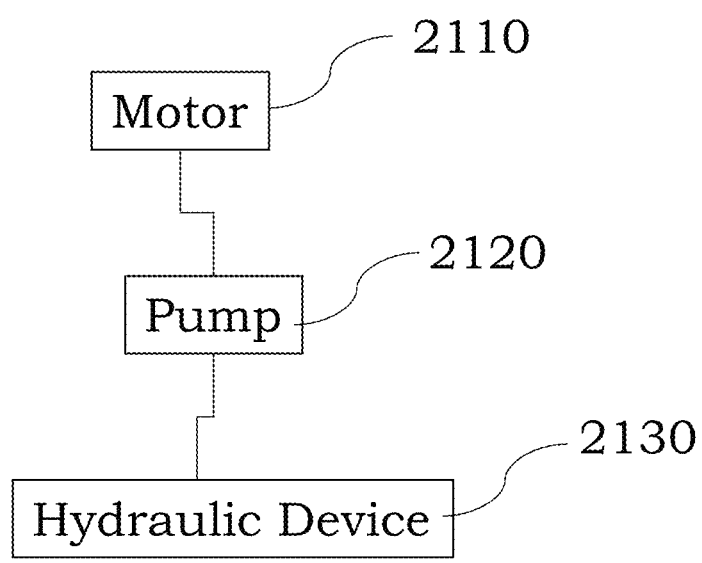
FIG. 21 is an illustration showing a hydraulic device coupled to a pump and a motor.

In some examples, the coatings described herein can be present on various components of a machine or machinery that use or contact a hydraulic fluid. For example, some component of the machinery that contacts a hydraulic fluid can include a coatings or layers as described and shown in connection with FIGS. 1-12. As noted herein, a hydraulic fluid is typically pumped to various components of the machinery to use liquid power to perform work. The exact type of hydraulic machinery may vary and illustrative hydraulic machines include, but are not limited to, a bulldozer 2005 (FIG. 20A), a backhoe 2010 (FIG. 20B), a log splitter 2015 (FIG. 20C), a shovel/excavator 2020 (FIG. 20D), a loader 2025 (FIG. 20E), a forklift 2030 (FIG. 20F), a crane 2035 (FIG. 20G), a scissor lift 2040 (FIG. 20H), and a jack 2045 (FIG. 20I). In certain embodiments, the machine or machinery can include a motor or an engine. For example and referring to FIG. 21, a system is shown where a machine comprises a motor or engine 2110 that is coupled to a pump 2120, which itself can be coupled to a hydraulic device 2130. The motor or engine 2110 can power the pump 2120. Alternatively, the motor or engine 2110 could be directly coupled to the hydraulic device 2130 and the pump 2120 can be omitted.

The various hydraulic devices described herein can include an alloy layer as noted above. For example, a piston member positioned within the housing and operative to be driven by pressurized fluid between a first position to a second position can include a coated surface. The coated surface comprises a surface coating comprising an alloy layer. The alloy layer comprises (i) molybdenum and (ii) at least one element selected from the group consisting of nickel, tungsten, cobalt, chromium, tin, phosphorous, iron and boron or at least one compound comprising one or more of nickel, tungsten, cobalt, chromium, tin, phosphorous, iron or boron.

In certain embodiments, the alloy layer comprises molybdenum and at least one element selected from the group consisting of nickel, tungsten, cobalt, chromium, tin, phosphorous, iron, magnesium and boron or at least one compound comprising one or more of nickel, tungsten, cobalt, chromium, tin, phosphorous, iron, magnesium or boron.

In other embodiments, the molybdenum is present in the surface coating at 35% or less by weight based on a weight of the surface coating, or at 25% or less by weight based on a weight of the surface coating, or at 15% or less by weight based on a weight of the surface coating, or is present in the alloy layer at 35% or less by weight based on a weight of the alloy layer, or at 25% or less by weight based on a weight of the alloy layer, or at 15% or less by weight based on a weight of the alloy layer, or is present in the surface coating at 65% or more by weight based on a weight of the surface coating, or at 75% or more by weight based on a weight of the surface coating, or at 85% or more by weight based on a weight of the surface coating, or is present in the alloy layer at 65% or less by weight based on a weight of the alloy layer, or at 75% or less by weight based on a weight of the alloy layer, or at 85% or less by weight based on a weight of the alloy layer.

In certain examples, the alloy layer consists essentially of nickel and molybdenum or consists essentially of nickel, molybdenum and one of tin, phosphorous, iron, magnesium or boron. In some embodiments, the coated surface comprises a surface roughness Ra of less than 1 micron, and the molybdenum is present in the alloy layer at 20% or less by weight based on a weight of the surface coating, and the surface coating excludes precious metals. In certain embodiments, the alloy layer is an electrodeposited alloy layer or is an exposed outer layer of the surface coating. In some examples, the exposed outer layer (i) consists essentially of molybdenum and only one of nickel, tungsten, cobalt, tin, phosphorous, iron, chromium, magnesium or boron, or (ii) consists essentially of molybdenum and only two of nickel, tungsten, cobalt, tin, phosphorous, iron, chromium, magnesium or boron, or (iii) consists essentially of both molybdenum and phosphorous and at least one of nickel, cobalt, tin, chromium, tungsten, iron, magnesium or boron.

In other embodiments, the alloy layer is an electrodeposited alloy layer, and further comprises an intermediate layer between the surface of the substrate and the alloy layer, wherein the intermediate layer comprises one or more of nickel, nickel alloys, copper, copper alloys, nickel-tungsten alloys, cobalt alloys, nickel-phosphorous alloys, alloys of molybdenum or tungsten or both and at least one of nickel, cobalt, chromium, tin, phosphorous, iron or boron.

In additional embodiments, the surface coating comprises an additional layer formed on the alloy layer, wherein the additional layer comprises one or more of nickel, nickel alloys, nickel-tungsten alloys, cobalt alloys, cobalt-phosphorous alloys, nickel-phosphorous alloys, alloys of molybdenum and at least one of nickel, cobalt, chromium, tin, phosphorous, iron or boron, ceramics, ceramic comprises compounds of tungsten, chromium, aluminum, zirconium, titanium, nickel, cobalt, molybdenum, silicon, boron, metal nitride, a nitride, a metal carbide, a carbide, a boron, tungsten, tungsten carbide, chromium carbide, chromium oxide, aluminum oxide, zirconia, zirconium oxide, titania, nickel carbide, nickel oxide, nanocomposite, an oxide composite, or combinations thereof.

In some embodiments, the alloy layer further comprises one or more particles selected from the group consisting of solid nanoparticles, polymeric particles, hard particles, silicon dioxide particles, silicon carbide particles, titanium dioxide particles, polytetrafluoroethylene particles, hydrophobic particles, diamond particles, particles functionalized with hydrophobic groups, solid particles and combinations thereof.

In some embodiments, the alloy layer is present as an exposed outer layer of the surface coating, wherein the exposed outer layer is an electrodeposited alloy layer, and wherein the electrodeposited alloy layer excludes precious metals.

In other configurations, a piston member positioned within the housing is operative to be driven by pressurized fluid between a first position to a second position, the piston member comprising a coated surface. The coated surface comprises a surface coating comprising an alloy layer comprising (i) tungsten and (ii) at least one element selected from the group consisting of nickel, molybdenum, cobalt, chromium, tin, phosphorous, iron and boron or at least one compound comprising one or more of nickel, molybdenum, cobalt, chromium, tin, phosphorous, iron or boron.

In certain embodiments, the alloy layer comprises tungsten and at least one element selected from the group consisting of nickel, molybdenum, cobalt, chromium, tin, phosphorous, iron, magnesium and boron or at least one compound comprising one or more of nickel, molybdenum, cobalt, chromium, tin, phosphorous, iron, magnesium or boron.

In other examples, the tungsten is present in the surface coating at 35% or less by weight based on a weight of the surface coating, or at 25% or less by weight based on a weight of the surface coating, or at 15% or less by weight based on a weight of the surface coating, or is present in the alloy layer at 35% or less by weight based on a weight of the alloy layer, or at 25% or less by weight based on a weight of the alloy layer, or at 15% or less by weight based on a weight of the alloy layer, or is present in the surface coating at 65% or more by weight based on a weight of the surface coating, or at 75% or more by weight based on a weight of the surface coating, or at 85% or more by weight based on a weight of the surface coating, or is present in the alloy layer at 65% or less by weight based on a weight of the alloy layer, or at 75% or less by weight based on a weight of the alloy layer, or at 85% or less by weight based on a weight of the alloy layer/

In some embodiments, the alloy layer consists essentially of nickel and tungsten or consists essentially of nickel, tungsten and one of tin, phosphorous, iron, magnesium or boron.

In some examples, the coated surface comprises a surface roughness Ra of less than 1 micron, and the tungsten is present in the alloy layer at 20% or less by weight based on a weight of the surface coating, and the surface coating excludes precious metals.

In certain instances, the alloy layer is an electrodeposited alloy layer or is an exposed outer layer of the surface coating. In other embodiments, the exposed outer layer (i) consists essentially of tungsten and only one of nickel, molybdenum, cobalt, tin, phosphorous, iron, chromium, magnesium or boron, or (ii) consists essentially of tungsten and only two of nickel, molybdenum, cobalt, tin, phosphorous, iron, chromium, magnesium or boron, or (iii) consists essentially of both tungsten and phosphorous and at least one of nickel, cobalt, tin, chromium, molybdenum, iron, magnesium or boron.

In some examples, the alloy layer is present on all exterior surfaces of the piston member. In other examples, the alloy layer is present on a portion of the piston member that is external the housing. In certain examples, the housing is fluidically coupled to a pump to introduce hydraulic fluid into the housing to drive the piston member from the first position to the second position. In some embodiments, the hydraulic device is a hydraulic cylinder. In other embodiments, the hydraulic cylinder is present in a hydraulic machine.

Certain specific examples are described to facilitate a better understanding of the technology described herein.

Example 1

Several tests were performed on a coating including a molybdenum-nickel alloy (referred to below as MaxShield) on a surface of a test substrate (steel substrate). To better understand the effect of thickness and heat on MaxShield's performance, three different versions of MaxShield coating were tested. MaxShield-V1 has a thickness between 20 to 30 μm. In addition, MaxShield-V1 was also tested as plated, after bake-relief at 190° C. for 23 hours (V1-BR), and after heat treatment at 400 C for 2 hours (V1-HT). MaxShield-V2 has a thickness between 70 to 90 μm. Manufacturing MaxShield-V2 uses a heat-treatment process to improve hardness and wear performance. MaxShield-V3 is similar to MaxShield-V2 but it is not heat-treated.

The key process factors of MaxShield were also compared with EHC (hard chrome electroplating). EHC processes is not efficient since with the current density of 500 ASF, the deposition rate is around 0.7 mil/hr. While for MaxShield the deposition rate is twice with around 14 times less current, higher deposition rate makes MaxShield process more efficient in comparison with EHC process.

Example 2

Figure 22:
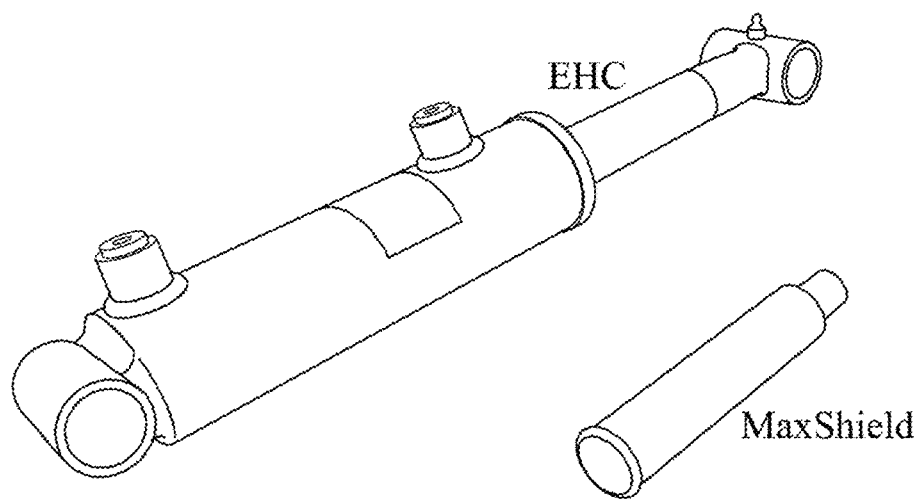
FIG. 22 is a photograph showing two coatings on different articles.

The original appearance of the coating is close to that of a typical Nickel coating. FIG. 22 demonstrates a hydraulic bar coated in MaxShield and compares that with that coated in EHC. Both MaxShield and EHC were grinded and polished after plating. Through some preliminary tests, we could enable black version of the coating. The coating can be further polished and machined to change the appearance. It is conformal and can be applied on rough surfaces.

Example 3

The most common thickness of MaxShield ranges from one micron to 75 microns. Coatings thicker than 0.5 mm can also be created. The coating thickness can be less than one micrometer and possibly higher than 1.5 mm if needed. The coating thickness is mainly controlled by deposition time.

Example 4

A testing lab (NADCAP-certified testing facility, Assured Testing Services) was used to measure corrosion. The test was a standard corrosion test, also known as salt fog test. During this test, the coated sample is exposed to 5% sodium chloride mist which simulates marine environment corrosion. The test was done according to ASTM B117-19 by the testing lab. In this test, the corrosion performance of EHC coating and electroless nickel coating is compared with that of our coating up to 5000 hours of exposure to the salt fog. Assured Testing Services determined the corrosion ratings of different samples according to the ASTM D610 Rust Grade. This standard implies a rating range between 0 to 10 with 10 corresponding to the best corrosion resistance and 0 corresponding to the worse corrosion resistance. The testing lab also performed the salt spray test on three samples of MaxShield-V1 coating. The test has also been performed on two samples of MaxShield-V2 and MaxShield-V3 coatings. We also provided EHC and electroless nickel coatings to the testing lab as control samples. Assured Testing Services scribed one MaxShield-V1 coating and tested that in the salt spray chamber as well.

Figures 23A, 23B:
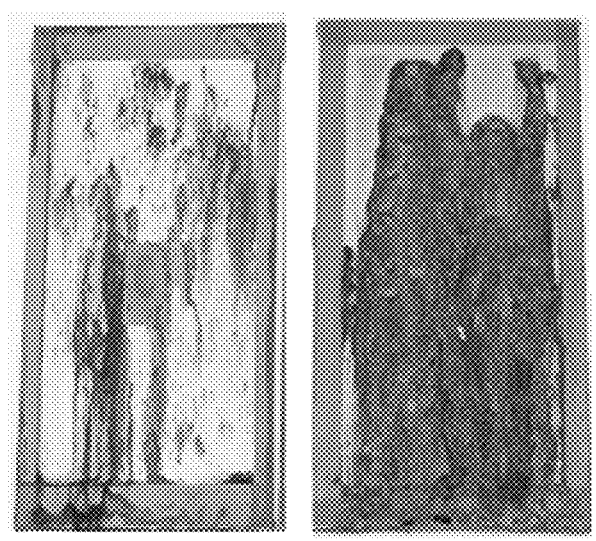
FIG. 23A and FIG. 23B are photograph showing a hard chrome coating and an electroless nickel coating.
Figure 26A:
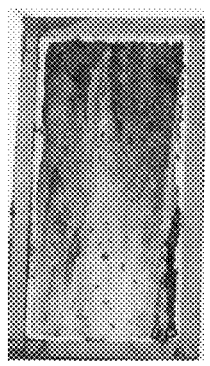
FIG. 26A, FIG. 26B, FIG. 26C, FIG. 26D and FIG. 26E are photographs showing salt spray tests and coating appearance after 5000 hours.
Figure 26B:
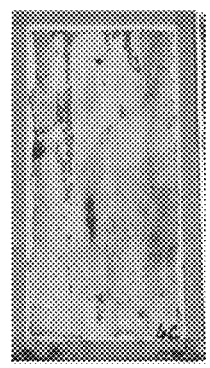
Figure 26C:
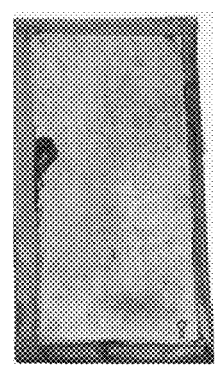
Figure 26D:
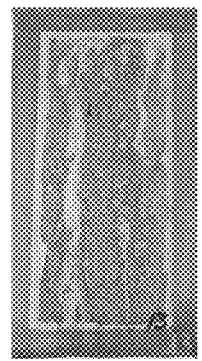
Figure 26E:
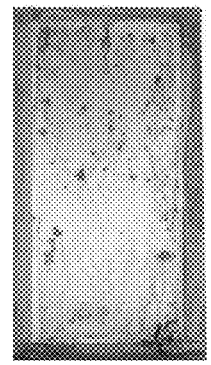

Results of the first 1000 hours. FIGS. 23A and 23B show the carbon steel samples coated with EHC and electroless nickel coating with respective corrosion rating of 4 and 0 after 1000 hours exposure to the salt fog. Both these two samples were produced by independent plating shops. According to the ASTM D610, a corrosion rate of 0 for electroless nickel after 1000 hours indicates rust formation over 50% of the surface area. In addition, a corrosion rate of 4 for EHC coating indicates that 3 to 10% of the surface area is corroded after 1000 hours. The images of all five MaxShield coatings after 1000 hours exposure to the salt spray are shown in FIGS. 24A-24E. Four of these samples exhibit the rating of 9, while the corrosion rating for one of the Maxshield-V1 samples after 1000 hours is 10. Corrosion rate of 9 indicates rust formation in less than 0.03% of the surface area according to the ASTM D610 standard. Maxshield-V1 sample with rating 10 did not rust at all in the first 1000 hours.

FIG. 25 compares the results of the salt spray test for our coatings with that of EHC coating. As this figure shows, corrosion rating of EHC coating reduces sharply to 4 after 400 hours exposure to the salt spray while the corrosion rate of our coating remains above 9 up to 1000 hours exposure.

For the scribed MaxShield-V1 coating, the corrosion rate of 9 was obtained on the areas far from the scribed region. Creep measurement rating of 8 was obtained for the scribed region on this sample based on ASTM D1654. The preliminary tests on the scribed surface shows that MaxShield is not expected to raise a significant risk of accelerated corrosion if it gets scratched and the underneath steel surface gets exposed at the location of the scratch.

Corrosion test results after 1000 hours: Salt spray corrosion test was continued on MaxShield samples after 1000 hours. Rating of the samples at different times of the salt spray test and their appearance after 5000 hours are shown in FIGS. 26A-26E. As shown in Table 1, ratings of Maxshield-V2 and MaxShield-V3 remain at 9 up to 4000 hours of the salt spray.

TABLE 1

Ratings of different MaxShield coatings up to 4000 hours and photos of the samples after 4000 hours of the salt spray test

| Hour | MaxShield-V1-sample 1 (FIG. 26A) | MaxShield-V1-sample 2 (FIG. 26B) | MaxShield-V1-sample 3 (FIG. 26C) | Max-Shield-V3 (FIG. 26D) | Max-Shield-V2 (FIG. 26E) |
|---|---|---|---|---|---|
| 200 | 10 | 10 | 10 | 10 | 10 |
| 400 | 10 | 10 | 10 | 10 | 10 |
| 600 | 10 | 10 | 9 | 9 | 10 |
| 800 | 9 | 10 | 9 | 9 | 9 |
| 1000 | 9 | 10 | 9 | 9 | 9 |
| 3000 | 7 | 9 | 8 | 9 | 9 |
| 4000 | 7 | 9 | 8 | 9 | 9 |
| 5000 | 7 | 9 | 8 | 9 | 9 |

The three samples of MaxShield-V1 exhibit a corrosion rating of 7, 9, and 8, respectively. MaxShield-V1 has lower thickness compared to Maxshield-V2 and MaxShield-V3. For thinner coatings, there is more chance for the corrosive media to get to the base steel substrate from the pinholes and defects on the coating and result in corrosion. This may be the reason that Maxshield-V2 and MaxShield-V3 perform better than MaxShield-V1 at this elongated exposure to the corrosive media. As shown in the images in FIGS. 26A-26E, MaxShield creates greenish tarnish that can easily be distinguished from rust.

Example 5

Figure 27:
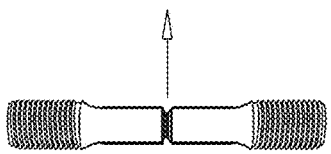
FIG. 27 is a photograph showing images of notched bars before and after applying a coating.
Figure 27:
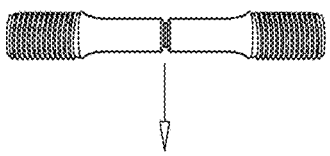

Testing lab: NADCAP-certified testing facility, Assured Testing Services. Procedure: The test was performed on three sets of samples. Each set includes four notched bars covered with a version of the MaxShield coating. The images of one of these notched bars before and after applying the coating are shown in FIG. 27. The bars were tested per ASTM F519-18 for 200 hours of sustained loads in the amount of 75% of their fracture strength by the testing lab. Results: All four notched bars of both MaxShield-V1 and MaxShield-V2 passed the test and did not exhibit any fracture. These results demonstrate that MaxShield-V1 and MaxShield-V2 coatings do not cause hydrogen-induced cracking and can resist against hydrogen embrittlement. It is worth mentioning that MaxShield-V3 is a thicker version of MaxShield-V1 that provides more protection against hydrogen embrittlement. Therefore, since MaxShield-V1 has passed the test, MaxShield-V3 would also be expected to pass the test.

Example 6

Testing lab: A2LA certified testing lab, Anamet, inc. Procedure: Ductility of MaxShield-V1 and MaxShield-V2 coatings was determined by the testing lab according to ASTM E8-21 (Tension Testing of Metallic Materials). In this test, coated T-bone specimens are tensile tested uniaxially until the coating flakes off and the underneath surface can be seen in 50× microscopic images.

Results: The test showed that both MaxShield-V1 and MaxShield-V2 coatings can be elongated to above 6% without flaking or fracturing. The ductility value of greater than 6% is significantly higher than the ductility of EHC coatings, which is less than 0.1% (1). It is also higher than the ductility of electroless nickel coating, which is between 1% to 1.5% (2). Based on these results, it can be concluded that MaxShield coating is much more formable compared to EHC and electroless nickel coating. FIGS. 28A and 28B shows the images of MaxShield-V1 (FIG. 28B) and MaxShield-V2 (FIG. 28A) coatings after 6 percent elongation. The microscopic image of MaxShield-V1 coating is demonstrated in FIG. 29. As FIGS. 28A-29 show, the coating exhibits at least 6% ductility without any fracture or blistering.

Example 7

Testing lab: EP Laboratories is listed in Qmed as an independent testing laboratory specialized in mechanical testing at the nano and micro levels. Procedure: Friction coefficient of MaxShield-V2 and MaxShield-V3 coatings were measured per ASTM G99-17 specification by EP Laboratories. As shown in FIG. 30, the test was involved in applying 20 N force through a hard ball made of 440C stainless steel onto the lubricated coating surface that rotates 200 revolution per minute. One of the main characteristics of EHC is its low friction coefficient or its slippery nature in lubricated environments. In this test, friction coefficient of EHC was also measured and compared with MaxShield coatings.

Results: Friction coefficients measured for EHC coating, Maxshield-V2, and MaxShield-V3 coatings are shown in Table 2. As shown in this table, friction coefficients of both versions of MaxShield are slightly lower than EHC coating. Based on these results, we expect almost similar performance of MaxShield coating in the lubricated wear conditions. It is worth mentioning that MaxShield-V1 can have a lower performance in aggressive wear environments, and this is the reason that it has not been tested here.

TABLE 2

Results of the pin-on-disk test

| Coated surface | Coefficient of friction |
| --- | --- |
| EHC | 0.106 ± 0.003 |
| MaxShield-V2 | 0.103 ± 0.001 |
| MaxShield-V3 | 0.091 ± 0.002 |

Example 8

Figure 31:
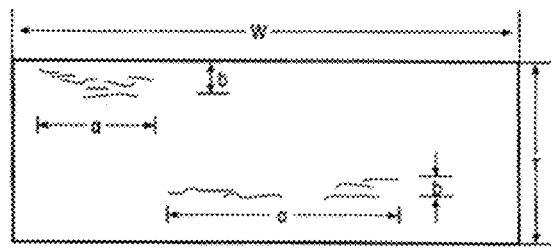
FIG. 31 is an illustration showing cracks.

Testing Lab: Iso-certified independent laboratory, EPI Materials Testing Group. Procedure: Hydrogen sulfide cracking test was performed according to NACE TM-0284 on coated surfaces. The coated surfaces of carbon steel were introduced to an acidic environment for 96 hours during which $H_2S$ gas and nitrogen purge gas are introduced. The coated surfaces were polished metallographically to highlight cracks caused by the $H_2S$ gas. Shown in FIG. 31, the cracks are measured and reported as stated by the standard. Two samples of MaxShield-V1 were tested.

Figures 32A, 32B:
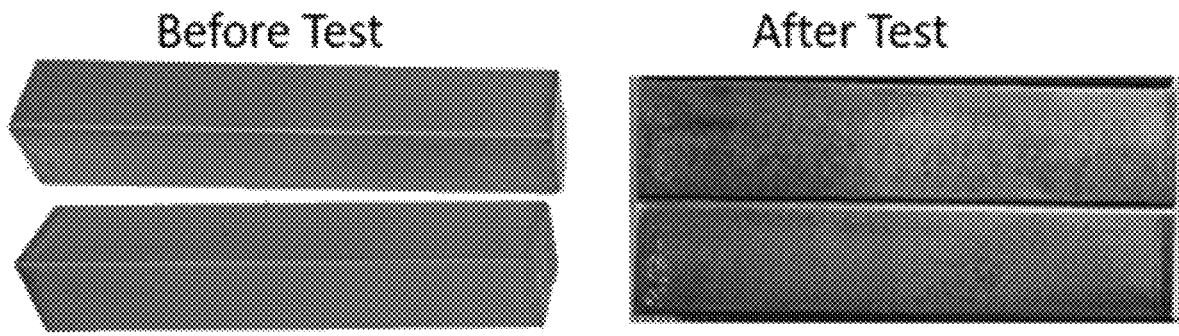
FIG. 32A and FIG. 32B are images of two carbon steel bars coated with MaxShield-V1 after (FIG. 32B) and before (FIG. 32A) a test.
Figure 33:
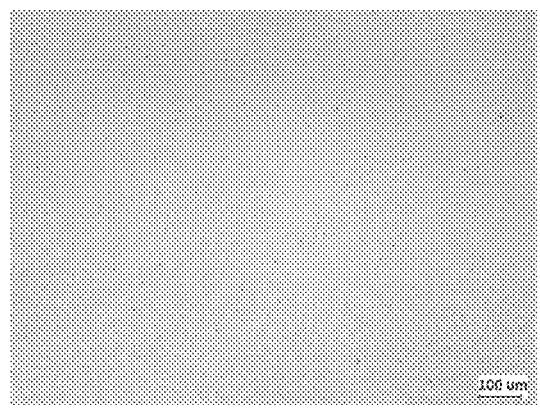
FIG. 33 is a microscope image of the steel bar of FIG. 32B.

Results: According to the report by the third-party test center, visual and stereoscopic examination and subsequent inverted microscope examination revealed no cracking in our coating. FIGS. 32A and 32B shows the images of the two carbon steel bars coated with MaxShield-V1 after (FIG. 32B) and before (FIG. 32A) the test. As shown in the microscopic image of FIG. 33, the surfaces covered with MaxShield-V1 coating were free of hydrogen induced blisters or cracking. It is worth mentioning that MaxShield-V2 and MaxShield-V3 are less susceptible to hydrogen sulfide cracking compared to MaxShield-V1 because of their larger thickness. This is the reason that this test was just performed on MaxShield-V1.

Microhardness Test

Testing lab: Previous microhardness tests were performed by an A2LA certified testing lab, Anamet, inc. and additional tests performed by Maxterial Inc. Procedure: The test was done according to the ASTM E384-17 standards. Previous results obtained by Anamet: The test has been performed on four coated carbon steel samples. The explanation of the samples and their test results are as follows: Sample 1 is coated with MaxShield-V3. Vickers hardness of 660 was obtained for this sample. Sample 2 is coated with MaxShield-V3. Vickers hardness of 605 was obtained for this sample. Sample 3 is coated with MaxShield-V2. Average Vickers hardness of 750 was obtained for this sample. Sample 4 is also coated with MaxShield-V2. Average Vickers hardness of 822 was obtained for this sample.

These results show the effect of heat treatment on improving hardness of MaxShield-V2 coating. Many internal hardness tests have been performed on 50 μm MaxShield coatings. Those results confirm that the Vickers hardness of as-plated MaxShield is in the range of 630 to 670. The microhardness values obtained in this test are compared in Table 3 with those of several other hard coatings obtained from the literature. As Table 3 shows the microhardness of all of our coatings is better than that of the plated electroless nickel coating. Moreover, MaxShield-V2 coating exhibits slightly better Vickers hardness than heat-treated electroless nickel coating. It is worth mentioning that electroless nickel is a wear-resistant coating that is known as one of the replacements for EHC coating. The hardness of MaxShield-V2 coating is also comparable with that of the EHC coating. Moreover, hardness of MaxShield is much higher than hardness of 241 for Hastelloy-B2 (3).

Elevated temperature performance and comparison with EHC: An important point that has also been highlighted in Table 3 is that hardness of EHC coating reduces at high temperatures (4). At the normal bake-relief process at 1900 C for 23 hours hardness of EHC reduces from 800-1000 to a value between 700-750. Furthermore, as exhibited by the cross-sectional images discussed in Example 11, heat ruins the integrity of the EHC coating by creating large macro-cracks in its structure. Therefore, it is expected that the coating loses its corrosion protection at higher temperatures. As a result, regardless of environmental regulations and mandates on eliminating EHC coating, this coating does not perform at high operating temperatures.

In contrast, the hardness of MaxShield-V2 coating is expected to increase at high temperatures. During the real-world applications and under several circumstances, the coatings will be exposed to heat. As an example, if the samples are grinded, or if they are used at high friction or high temperature environments, unlike chrome, MaxShield is expected to improve in its hardness in these environments.

TABLE 3

Vickers hardness of different wear-resistant costing

| Material | Microhardness (Vickers Hardness) |
| --- | --- |
| MaxShield-V3 (as plated MaxShield) | 630-670 |
| MaxShield-V2 (heat-treated MaxShield) | 750-822 |
| Electroless Ni—as plated (2) | 480-500 |
| Electroless Ni—Heat treated (400 C.-1 hr) (2) | 700-800 |
| EHC—as plated (2) | 800-1000 |

TABLE 3-continued

Vickers hardness of different wear-resistant costing

| Material | Microhardness (Vickers Hardness) |
|---|---|
| EHC—Bake-relief (190 C.-23 hrs) (4) | 700-750 |
| EHC—Heat treated (400 C.-2 hrs), Our internal results | 700-775 |

Example 9. Taber Abrasion Test

Figure 34:
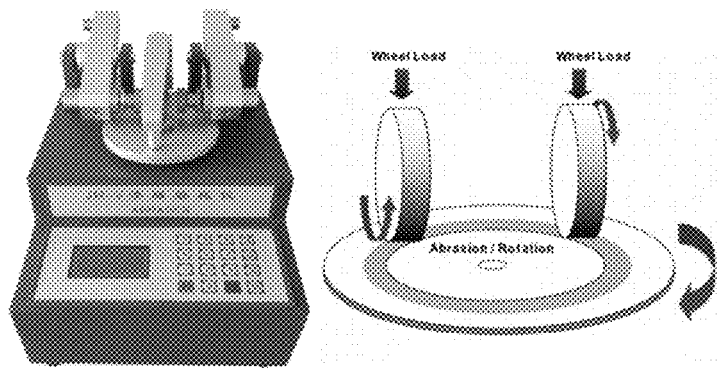
FIG. 34 is an illustration of an apparatus used to abrade the surface of the coating by applying a one (1) kg load on each abrasive wheel.

Testing Facility: Maxterial Inc. Procedure: The Standard Taber abrasion test was performed by our company according to the ASTM D4060-19 standard. In this test, the abrader machine shown in FIG. 34 is used to abrade the surface of the coating by applying 1 kg load on each abrasive wheel.

Figure 35:
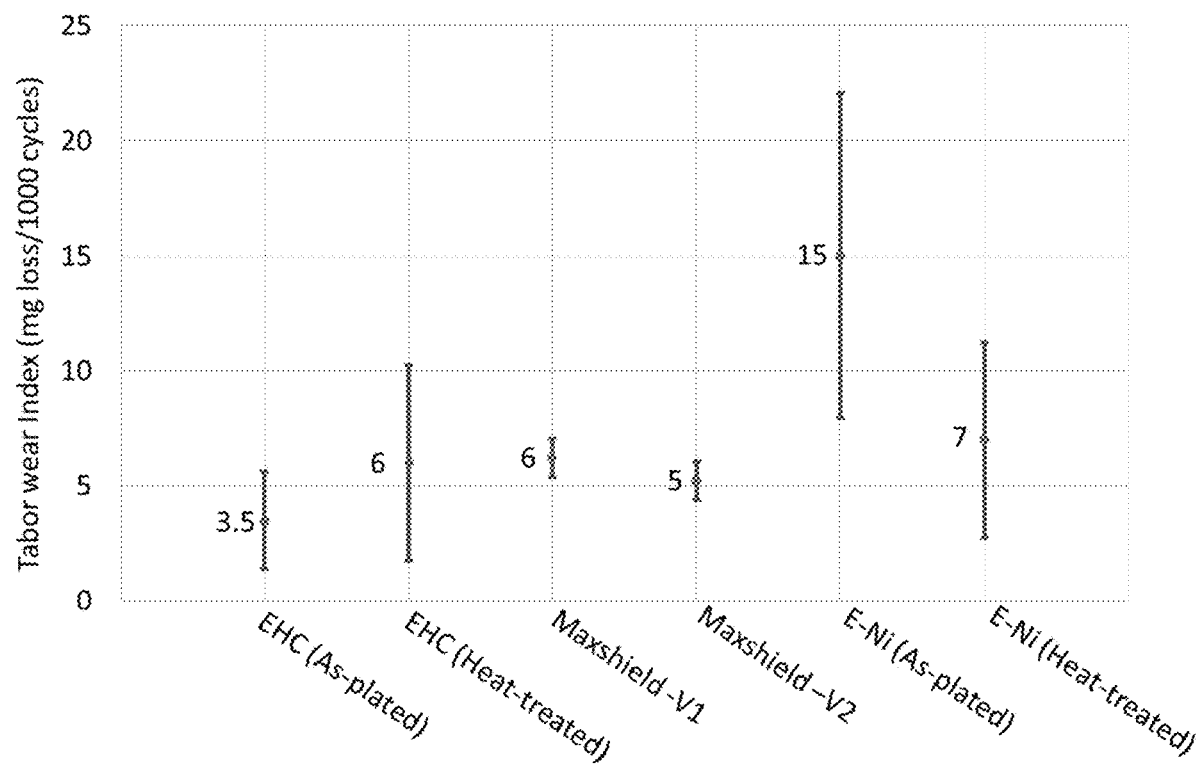
FIG. 35 is a graph comparing the wear index of different coatings.

Results: Taber wear index is the milligram weight loss per 1000 cycles. We have recently tested the modified version of MaxShield. The samples were prepared and tested as plated (MaxShield-V1) and after heat treatment at 400 C for 2 hours (MaxShield-V2). The TWI results for MaxShield samples are shown in FIG. 35. This Figure also shows the TWI values for as-plated, heat-treated EHC, and electroless Nickel coatings. The test has been done on at least three different samples for each coating and the results for the electroless nickel and EHC coatings match with those in the literature (2). These results exhibit the average TWI of 6 and 5 for as-plated and heat-treated MaxShield, respectively, that are very close to those obtained for EHC. TWI of heat-treated MaxShield is even slightly better that TWI of 6 for heat-treated EHC.

It is worth mentioning that considering the huge challenge of EHC coating with environmental regulations, electroless Nickel coating is accepted as one of its viable replacements in the industry. As the figure shows, as-plated version of our coating (MaxShield-V3) with average TWI of 6 is expected to exhibit better wear performance compared to as-plated electroless nickel with average TWI of 15. A heat-treated version of our coating (MaxShield-V2) with average TWI of 5 also exhibits better wear performance compared to heat-treated electroless nickel with average TWI of 7. As explained before wear performance of EHC coating reduces after exposure to heat. An average TWI of heat-treated EHC is 6 and is more than the average TWI of 5 for MaxShield-V2 coating.

Example 10. Block on the Ring Test

Testing Facility: Falex Corporation Procedure: The test was performed based on the ASTM G-77-17 by Falex corporation who is one of the industry pioneers in performing this test. In this test, a test block was loaded with 30 pounds against a test ring that rotates at a 197 rpm for 500,000 revolutions. Block scar volume was calculated from the block scar width, and ring scar volume was calculated from ring weight loss. Moreover, coefficient of friction (CoF) values were continuously measured during the test. The test was performed on a ring sample coated with MaxShield with minimum thickness of 0.006". The ring was made of 4620 steel. It was grounded and polished to a coating thickness of 0.003" to 0.005" and to a surface finish of 4 to 8 microinches. In this test, the block was an uncoated PH13-8Mo steel. The test on chrome coated ring is ongoing and the results will be provided soon.

Figure 36:
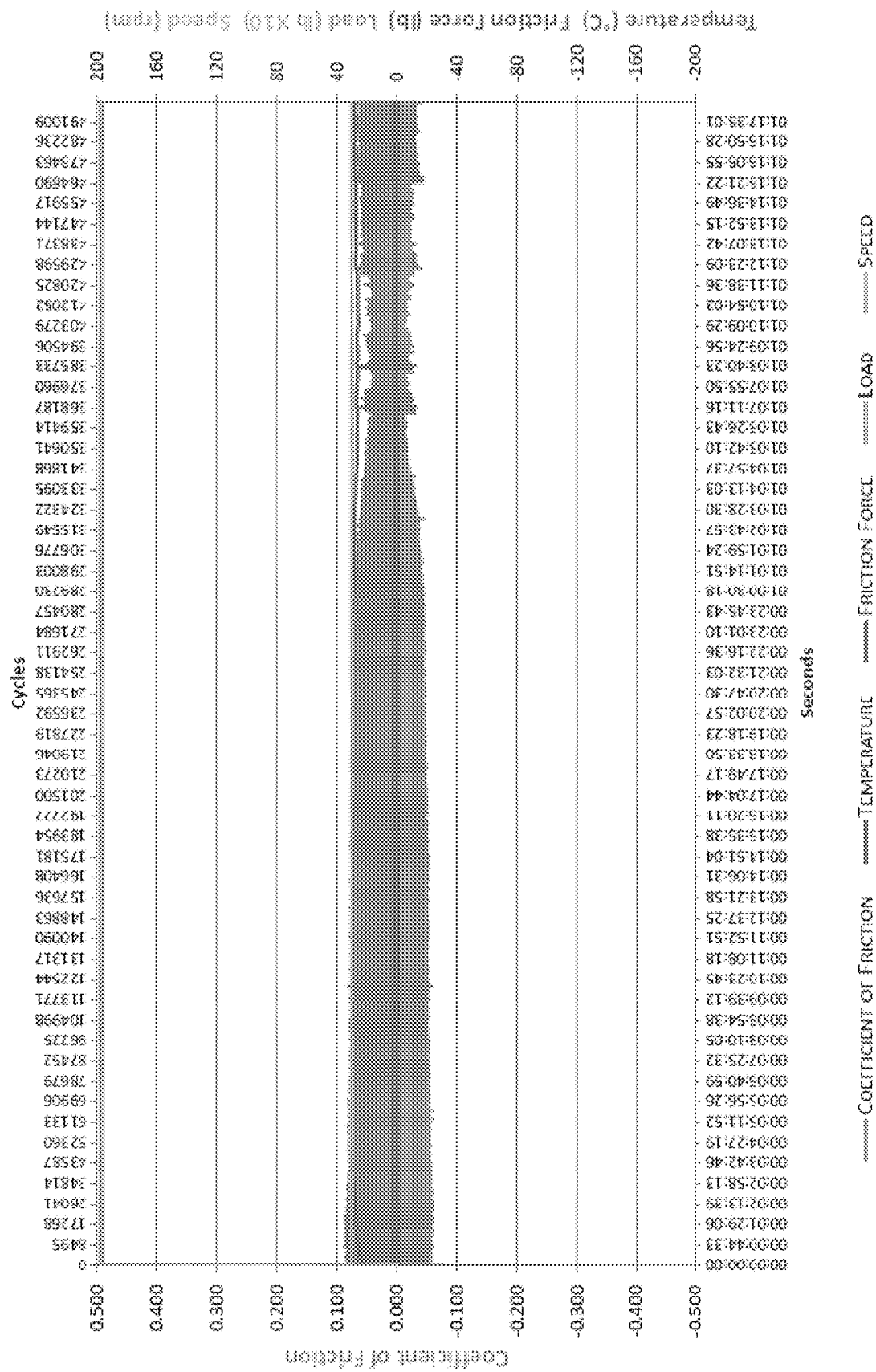
FIG. 36 is a graph showing coefficient of friction versus cycle.

Results: Test results are summarized in Table 4. As shown in this table, the CoF of 0.045 was obtained for MaxShield in this test. Compared to the CoF of 0.146 that was reported in the literature (5) for chrome in this test, MaxShield's CoF is more than three times lower. FIG. 36 shows the graph of CoF versus cycle. As shown in this figure, CoF remains almost constant during the test. This result implies that MaxShield coating does not create any gouging issue.

TABLE 4

Results of the Block-on-Ring test

| | Block Material | |
|---|---|---|
| | PH13-8Mo steel | PH13-8Mo steel |
| | Ring Material | |
| | 4620 steel coated with chrome | 4620 steel coated with MaxShield |
| Avg. CoF | 0.146 (5) | 0.045 |
| Avg. Wear Rate of Block (μg/1000 cycles) | Will be provided upon completion of the test | 1.4 |
| Avg. Wear Rate of Ring (μg/1000 cycles) | Will be provided upon completion of the test | 44 |

Example 11. Corrosion Test in Aggressive Acidic Environment

Testing Facility: Maxterial Inc. Procedure: This is an internal test performed by our company. In this test, coated carbon steel samples were immersed in an aqueous solution of concentrated hydrochloric acid (32% HCl) for 24 hours. The weight loss of the coatings after 24-hours exposure to the concentrated HCl solution was used to calculate the corrosion rate. It is worth mentioning that 32% HCl is a very strong acid with a negative pH.

Figure 37:
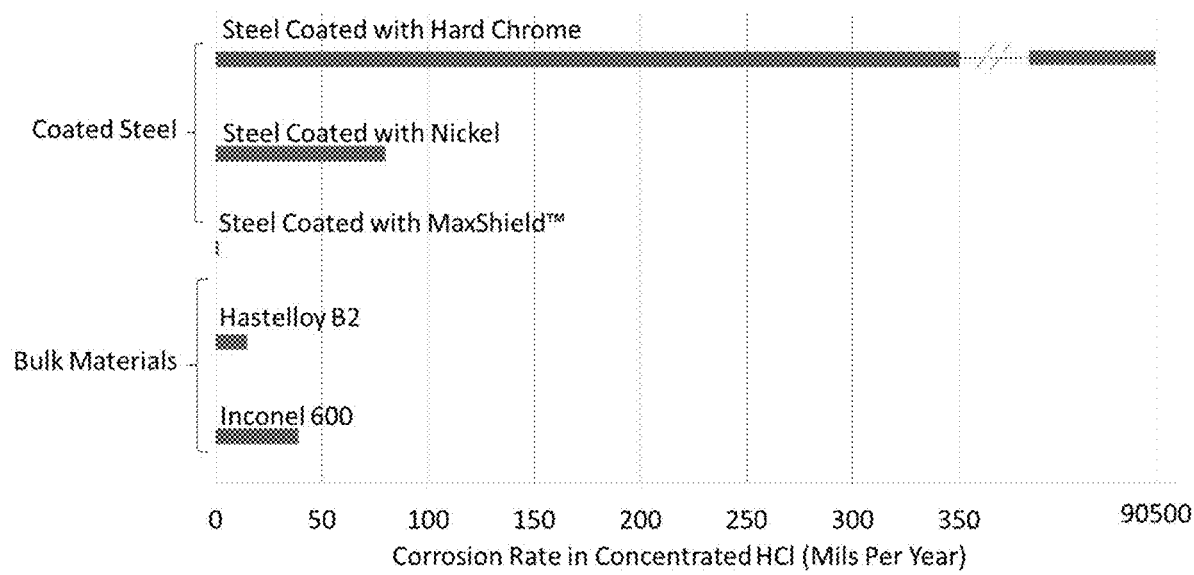
FIG. 37 is a graph showing corrosion rate for different coatings.

Results: FIG. 37 compares the corrosion rate of modified MaxShield-V1 coating with existing nickel coating, Monel, Inconel and Hastelloy. The rate reported for these coatings in FIG. 37 is the average of the corrosion test obtained for at least three different samples. As this figure shows, the corrosion rate of MaxShield-V1 coating (less than 13 milli-inch per year, sometimes as low as 1.5 milli-inch per year) is much lower than that of the existing nickel coating (80 milli-inch per year) (6). FIG. 37 also shows the corrosion rate of corrosion-resistant bulk materials, Hastelloy® B2 and Inconel®, against the concentrated HCl solution, based on the values published in the literature (7) (8). Interestingly, our coating shows lower corrosion rate compared to Hastelloy® (15 milli-inch per year) and Inconel® (39 milli-inch per year). Hastelloy® and Inconel® are superalloys known for their extreme corrosion resistance in HCl environment. EHC coating dissolves in concentrated HCl in less than 10 minutes and its corrosion rate is not on the scale of this figure.

Example 12. Morphology

Figures 38A, 38B:
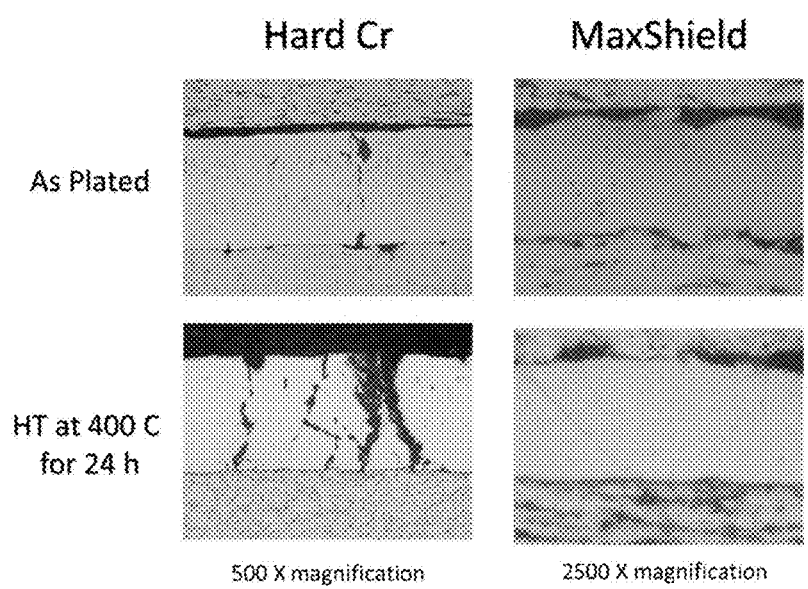
FIG. 38A and FIG. 38B are images showing magnified as plated and heat treated coatings.

Testing Facility: Maxterial Inc. Procedure: This test was done in Maxterial to study the cross-section of MaxShield, measure the thickness and evaluate the effect of the heat treatment on coating structure. All the metallographic works have been done by Maxterial using our in-house facility. EHC samples with the thickness of around 100 μm were provided to us by a chrome plating shop. The cross-section of the as-plated and heat-treated EHC and MaxShield-V1 samples are shown in FIGS. 38A and 38B, respectively. The heat treatment has been done at 400 C for 2 hours. This cross-sectional analysis was performed on the modified MaxShield-V1 in 2021. As exhibited in this figure, as-plated EHC has micro-cracks all over the cross-section, while as-plated MaxShield has much smaller and less cracks. After heat treatment EHC cracks were developed. As it is shown in FIGS. 38A, some of the cracks grew all the way from the substrate to the surface. The presence of this kind of macro-cracks in the coating structure can significantly reduce the corrosion protection of the coating. At the other side, MaxShield's cross-section remained the same after the heat exposure, and no sign of crack development was observed in MaxShield. Reducing mechanical properties of EHC at high temperature may be related to this crack development and growth mechanism that occurs in EHC in the heat exposure. This reduction has previously shown in this report by the results of the Tabor wear and Vickers hardness tests.

Example 13. Effect of Heat and Adhesion Bend Test

Testing Facility: Maxterial Inc. Procedure: We conducted an adhesion bend test on heat-treated MaxShield samples. It is worth mentioning that adhesion bend test according to ASTM B571-18 is always an important part of our evaluations. The reason is that if the coating does not provide a strong adhesion, it cannot provide wear and corrosion protections, as well.

In this test, a strip of 1008 Carbon Steel (CS) with exposed area of 3 cm×5 cm was coated on one side with MaxShield. The coated sample was then placed in a furnace for 1 hour at 700 C in air. Adhesion bend test was performed on the sample according to ASTM B571-18. The steps and result of the test are illustrated in FIGS. 39A-39D. In this test, a piece of tape was attached to the coating surface. The air bubbles were removed from the area under the tape, so we made sure that there was a strong adhesion between the coating and the tape. The taped sample then was bent to 180 degree, and the tape was removed from the coating surface. The test fails if the coating delaminates from the surface and transfers to the tape.

Results: The tape was clear. Delamination of the coating was not observed. The coating passed the adhesion bend test. The uncoated areas of CS were covered with iron rust scale after heating. We covered these uncoated areas with tape before the bend test to avoid the transfer of the loose rust particles to the coating surface.

Example 14. Formability

Procedure: We have conducted 180 degree bent test many times on our MaxShield V1 and always received promising results. Flat sheets of carbon steel were coated in 6 μm thick MaxShield. The coated sheets were subjected to forming processes to manufacture a part. During these processes the coating has to be bent and formed.

Results: The coating remained intact after the forming, and no flaking off or defects was observed. It is worth mentioning that EHC and thermal spray coating are highly likely to flake off under these circumstances.

Example 15. Machining

We conducting various machining operations on our samples. For example, we sometimes drill holes in coated parts to prepare test specimens, sometimes we polish the coating to make it shiny, or we grind them to adjust the thickness. We never experience any issue in these machining processes. Our data indicate that MaxShield can be machined without any adhesion failure. On the other side, machining chrome is known to be problematic because of chipping, and flaking issue. We believe the reason is that Maxshield has much better ductility than EHC. Furthermore, MaxShield adheres well to most substrates.

Example 16. Overview of the Process Factors

MaxShield is typically produced sing a typical electroplating process. The processes include proper cleaning and activation of the substrate following by the electrodeposition. Some of the process factors of MaxShield are: Power source: MaxShield uses a DC-current power source; Deposition rate: MaxShield's typical deposition rate (1.5 mil/hr) is twice faster that the deposition rate of EHC (0.7 mil/hour). MaxShield's deposition rate can change depending on multiple factors such as current density; Plating efficiency: Plating efficiency of MaxShield (80-90%) is much higher than that of EHC (10-35%). It is worth mentioning that, in most cases, plating efficiency of EHC is below 20%; Electroplating processes temperatures: MaxShield's plating temperature is in the normal range of the industry (140-170 F)

Example 17. Safety and environmental compliance

Testing facility: TÜV SÜD, 2021 The tests were done per both REACH and RoHS

Results: MaxShield successfully passed both tests. MaxShield coating and the chemicals used in manufacturing MaxShield, referred to as LeanX, are free from substances of very high concerns (SVHC). In particular, both MaxShield and LeanX are free from chromium, cadmium, cyanide, lead and fluoro Compounds such as PFOS and PFAS.

BIBLIOGRAPHY

1. *Physical Properties of Electrodeposited Chromium.* U. S. Department of Commerce, National Bureau of Standards. s.l.: Journal of Research of the National Bureau of Standards, 1948.
2. Tech Metals. *THE ENGINEERING PROPERTIES OF ELECTROLESS NICKEL COATINGS.* Dayton: Tech Metals, 1983.
3. AZO Materials. Super Alloy HASTELLOY(r) B-2 Alloy (UNS N10665). [Online] https://www.azom.com/article.aspx?ArticleID=7680.
4. Prado, R. *Electrodeposition of Nanocrystalline Cobalt Phosphorous Coatings as a Hard Chrome Alternative.* Jacksonville. s.l.: NavAir, 2014.
5. Prado, R. A., et al. *Electrodeposited Nanocrystalline Co—P Alloy Coatings as a Hard Chrome Alternative.* s.l.: ESTCP Project WP-200936, 2015.
6. Nickel Development Institute. *Resistance of Nickel and High Nickel Alloys to Corrosion by Hydrochloric Acid, Hydrogen Chloride, and Chlorine.*
7. Osborne, P. E., Icenhour, A. S. and Cul, G. D. Del. *Corrosion Test Results for Inconel* 600 *vs Inconel-Stainless UG Bellows.* Oak Ridge, Tennessee: OAK RIDGE NATIONAL LABORATORY, 2002.
8. Corrosion Materials. Hastelloy B2 Datasheet. [Online] https://www.corrosionmaterials.com/documents/dataSheet/alloyB2DataSheet.pdf.

9. *Residual Stresses and Strength of Hard Chromium Coatings.* Pfeiffer, W., et al. s.l.: Materials Science Forum, 2011, Vol. 681.
10. Toll Bridge Program Oversight Committee, California Transportation Commission. *Report on the A354 Grade BD High-Strength Steel Rods on the New East Span of the San Francisco-Oakland Bay Bridge With Findings and Decisions.* 2013.
11. Nickel Development Institute. Resistance of Nickel and High Nickel Alloys to Corrosion by Hydrochloric Acid, Hydrogen Chloride and Chlorine. [Online] https://www.nickelinstitute.org/~/media/Files/TechnicalLiterature/ResistanceofNickelandHigh_NickelAlloystoCorrosionbyHydrochloricAcid_HydrogenChlorideand-Chlorine_279_.ashx.
12. Corrosion Materials. Alloy B2 Data Sheet. [Online] http://www.corrosionmaterials.com/documents/dataSheet/alloyB2DataSheet.pdf.

What is claimed is:

1. A hydraulic device comprising:
a piston member operative to be driven by pressurized fluid between a first position to a second position, the piston member comprising a coated surface, wherein the coated surface comprises a surface coating, and wherein the surface coating comprises an alloy layer comprising (i) molybdenum and (ii) phosphorous, boron, nitrogen or carbon and (iii) at least one element selected from the group consisting of nickel, tungsten, and tin, wherein the at least one element selected from the group consisting of nickel, tungsten, and tin is present in the alloy layer at 65% by weight or more based on the weight of the alloy layer, wherein the coated surface comprises a surface roughness $R_a$ of less than or equal to 1 micron, and wherein the alloy layer comprises uniform and non-uniform grain sizes with an average grain size less than 2 microns; and
a housing configured to retain the pressurized fluid and to receive the piston member and permit movement of the piston member from the first position to the second position along an axis of the housing.

2. The hydraulic device of claim 1, wherein the alloy layer is an electrodeposited alloy layer exposed to the pressurized fluid during use of the hydraulic device.

3. The hydraulic device of claim 2, wherein the electrodeposited alloy layer further comprises chromium or cobalt.

4. The hydraulic device of claim 1, wherein the alloy layer is an outer electrodeposited alloy layer.

5. The hydraulic device of claim 1, wherein the molybdenum is present in the surface coating at 33% or less by weight based on a weight of the surface coating.

6. The hydraulic device of claim 5, wherein the hydraulic device is present in landing gear.

7. The hydraulic device of claim 5, wherein the hydraulic device is present in a ship, a vehicle, a bulldozer, a backhoe, a log splitter, a shovel/excavator, a loader, a forklift, a crane, a scissor lift or a jack.

8. The hydraulic device of claim 1, wherein the molybdenum is present in the alloy layer at 33% or less by weight based on a weight of the alloy layer.

9. The hydraulic device of claim 1, wherein the alloy layer is present on all exterior surfaces of the piston member and comprises a uniform thickness.

10. The hydraulic device of claim 1, wherein the surface coating further comprises a hardness of greater than 600 Vickers hardness.

11. The hydraulic device of claim 1, further comprising an additional layer formed on the alloy layer, wherein the additional layer comprises one or more of nickel, nickel alloys, nickel-tungsten alloys, cobalt alloys, cobalt-phosphorous alloys, nickel-phosphorous alloys, alloys of molybdenum and at least one of nickel, cobalt, chromium, tin, phosphorous, iron or boron, ceramics, ceramic comprises compounds of tungsten, chromium, aluminum, zirconium, titanium, nickel, cobalt, molybdenum, silicon, boron, metal nitride, a nitride, a metal carbide, a carbide, a boron, tungsten, tungsten carbide, chromium carbide, chromium oxide, aluminum oxide, zirconia, zirconium oxide, titania, nickel carbide, nickel oxide, nanocomposite, an oxide composite, or combinations thereof.

12. The hydraulic device of claim 1, wherein the surface coating is free of precious metals.

13. The hydraulic device of claim 1, wherein the alloy layer is free from chromium, cadmium, cyanide, lead and fluoro compounds.

14. The hydraulic device of claim 13, wherein the alloy layer comprises (i) molybdenum and (ii) one of phosphorous, boron, nitrogen, or carbon and (iii) nickel without any tungsten or cobalt in the alloy layer.

15. The hydraulic device of claim 14, wherein the surface coating is free of precious metals.

16. The hydraulic device of claim 1, wherein the alloy layer is deposited as an outer layer of the surface coating.

17. The hydraulic device of claim 16, wherein the alloy layer comprises molybdenum, nickel and one of phosphorous, boron, nitrogen, or carbon, and wherein the molybdenum is present in the alloy layer at 33% or less by weight based on a weight of the alloy layer.

18. The hydraulic device of claim 1, wherein the alloy layer only includes nickel, molybdenum, one of phosphorous, boron, nitrogen, or carbon and minor impurities.

19. The hydraulic device of claim 1, further comprising a surface coating on an external surface of the housing, wherein the surface coating on the external surface of the housing comprises an alloy layer comprising (i) molybdenum and (ii) phosphorous, boron, nitrogen, or carbon and (iii) at least one element selected from the group consisting of nickel, tungsten, or tin, wherein the surface coating on the external surface of the housing comprises a surface roughness Ra of less than or equal to 1 micron, wherein the alloy layer of the surface coating on the external surface of the housing comprises uniform and non-uniform grain sizes with an average grain size less than 2 microns.

20. The hydraulic device of claim 19, wherein the alloy layer of the surface coating on the external surface of the housing and the alloy layer of the surface coating of the coated surface of the piston member are the same.

21. The hydraulic device of claim 1, wherein the alloy layer is an outer electrodeposited alloy layer and comprises nickel, molybdenum and at least one of phosphorous, boron, nitrogen, or carbon, and wherein the molybdenum is present in the outer electrodeposited alloy layer at 20% or less by weight based on a weight of the outer electrodeposited alloy layer.

22. The hydraulic device of claim 1, wherein the alloy layer is an outer electrodeposited alloy layer and comprises nickel, molybdenum and one of phosphorous, boron, nitrogen, or carbon, and wherein the molybdenum is present in the outer electrodeposited alloy layer at 20% or less by weight based on a weight of the outer electrodeposited alloy layer.

23. The hydraulic device of claim 1, wherein the alloy layer is an outer electrodeposited alloy layer and comprises nickel, molybdenum and at least one of phosphorous, boron, nitrogen, or carbon, wherein the molybdenum is present in the outer electrodeposited alloy layer at 33% or less by weight based on a weight of the outer electrodeposited alloy layer.

24. The hydraulic device of claim 1, wherein the surface roughness Ra is less than 0.2 microns.

25. The hydraulic device of claim 1, further comprising a pump fluidically coupled to the housing through a fluid line, wherein the pump is configured to pump the pressurized fluid into the housing to cause movement of the piston member out of the housing.

26. A hydraulic device comprising:
  a piston member operative to be driven by pressurized fluid between a first position to a second position, the piston member comprising a coated surface, wherein the coated surface comprises a surface coating, and wherein the surface coating comprises an alloy layer, wherein the alloy layer is an outer electrodeposited alloy layer and comprises nickel, molybdenum and one of phosphorous, boron, nitrogen, or carbon, and wherein the nickel is present in the outer electrodeposited alloy layer at 65% by weight or more based on the weight of the outer electrodeposited alloy layer, wherein the coated surface comprises a surface roughness Ra of less than or equal to 1 micron, and wherein the alloy layer comprises uniform and non-uniform grain sizes with an average grain size less than 2 microns; and
  a housing configured to retain the pressurized fluid and to receive the piston member and permit movement of the piston member from the first position to the second position along an axis of the housing.

27. A hydraulic device comprising:
  a piston member operative to be driven by pressurized fluid between a first position to a second position, the piston member comprising a coated surface, wherein the coated surface comprises a surface coating, and wherein the surface coating comprises an alloy layer, wherein the alloy layer is an outer electrodeposited alloy layer and comprises nickel, molybdenum and at least one of phosphorous, boron, nitrogen, or carbon, and wherein the molybdenum is present in the outer electrodeposited alloy layer at 15% or less by weight based on a weight of the outer electrodeposited alloy layer and the nickel is present in the outer electrodeposited alloy layer at 65% by weight or more based on the weight of the outer electrodeposited alloy layer, wherein the coated surface comprises a surface roughness Ra of less than or equal to 1 micron, and wherein the alloy layer comprises uniform and non-uniform grain sizes with an average grain size less than 2 microns; and
  a housing configured to retain the pressurized fluid and to receive the piston member and permit movement of the piston member from the first position to the second position along an axis of the housing.

28. The hydraulic device of claim 27, wherein the surface coating comprises an additional layer under the outer electrodeposited alloy layer.

29. The hydraulic device of claim 28, wherein the surface coating excludes precious metals.

30. A hydraulic device comprising:
  a piston member operative to be driven by pressurized fluid between a first position to a second position, the piston member comprising a coated surface, wherein the coated surface comprises a surface coating, and wherein the surface coating comprises an alloy layer, wherein the alloy layer is an outer electrodeposited alloy layer and comprises nickel, molybdenum and at least one of phosphorous, boron, nitrogen, or carbon, and wherein the nickel is present in the outer electrodeposited alloy layer at 90% by weight or more based on the weight of the outer electrodeposited alloy layer, wherein the coated surface comprises a surface roughness Ra of less than or equal to 1 micron, and wherein the alloy layer comprises uniform and non-uniform grain sizes with an average grain size less than 2 microns; and
  a housing configured to retain the pressurized fluid and to receive the piston member and permit movement of the piston member from the first position to the second position along an axis of the housing.

\* \* \* \* \*